United States Patent
Ahn et al.

(10) Patent No.: US 11,233,107 B2
(45) Date of Patent: Jan. 25, 2022

(54) ACTIVE MATRIX ORGANIC LIGHT-EMITTING DIODE DISPLAY DEVICE AND METHOD OF MANUFACTURING THE SAME

(71) Applicant: INDUSTRY-ACADEMIC COOPERATION FOUNDATION, YONSEI UNIVERSITY, Seoul (KR)

(72) Inventors: Jong Hyun Ahn, Seoul (KR); Soo Young Kim, Seoul (KR); Min Woo Choi, Seoul (KR); Yong Ju Park, Seoul (KR); Bhupendra Kumar Sharma, Seoul (KR); Sa Rang Bae, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 57 days.

(21) Appl. No.: 16/641,965

(22) PCT Filed: Apr. 22, 2019

(86) PCT No.: PCT/KR2019/004822
§ 371 (c)(1),
(2) Date: Feb. 25, 2020

(87) PCT Pub. No.: WO2020/071605
PCT Pub. Date: Apr. 9, 2020

(65) Prior Publication Data
US 2021/0151537 A1 May 20, 2021

(30) Foreign Application Priority Data
Oct. 2, 2018 (KR) .................. 10-2018-0117746

(51) Int. Cl.
*H01L 27/32* (2006.01)
*H01L 51/00* (2006.01)
(Continued)

(52) U.S. Cl.
CPC ...... *H01L 27/3262* (2013.01); *H01L 27/3248* (2013.01); *H01L 29/78681* (2013.01);
(Continued)

(58) Field of Classification Search
CPC .......... H01L 27/3262; H01L 29/78681; H01L 2251/5338
See application file for complete search history.

(56) References Cited

U.S. PATENT DOCUMENTS 11,069,609 B2* 7/2021 Manipatruni .......... H01L 43/02
11,171,159 B2* 11/2021 Niu ................... H01L 21/02565
(Continued)

FOREIGN PATENT DOCUMENTS

JP  H04138690 A  5/1992
KR  20130005489 A  1/2013
(Continued)

OTHER PUBLICATIONS

S. Balendhran et al., Two-Dimensional Molybdenum Trioxide and Dichalcogenides, 2013, Materials Views, Advanced Functional Materials, vol. 23, pp. 3952-3970. (Year: 2013).*
(Continued)

*Primary Examiner* — Victoria K. Hall

(57) ABSTRACT

The present disclosure discloses an active matrix organic light-emitting diode display device and a manufacturing method thereof. The method includes forming a sacrificial layer on a carrier layer; forming a flexible substrate on the sacrificial layer; forming a first insulating layer on the flexible substrate; forming at least one transition metal chalcogenide based backplane on the first insulating layer;
(Continued)

and forming an opening unit after forming a capping layer on the at least one transition metal chalcogenide based backplane; and forming at least one active matrix organic light-emitting diode unit which is electrically connected to the at least one transition metal chalcogenide based backplane in the opening unit.

8 Claims, 57 Drawing Sheets

(51) Int. Cl.
*H01L 51/56* (2006.01)
*H01L 29/786* (2006.01)
*H01L 27/12* (2006.01)

(52) U.S. Cl.
CPC .......... *H01L 51/0097* (2013.01); *H01L 51/56* (2013.01); *H01L 27/1225* (2013.01); *H01L 2227/323* (2013.01); *H01L 2227/326* (2013.01); *H01L 2251/5338* (2013.01); *Y02P 70/50* (2015.11)

(56) References Cited

U.S. PATENT DOCUMENTS

| | | | | |
|---|---|---|---|---|
| 2014/0145587 | A1* | 5/2014 | Yoon | H01L 21/6835 313/512 |
| 2017/0073809 | A1* | 3/2017 | Choi | C23C 16/305 |
| 2017/0345944 | A1* | 11/2017 | Lin | H01L 29/1606 |
| 2018/0159056 | A1* | 6/2018 | Zhao | H01L 29/7869 |
| 2018/0159057 | A1* | 6/2018 | Zhao | H01L 51/0048 |
| 2019/0006450 | A1* | 1/2019 | Lee | H01L 27/3262 |
| 2019/0123149 | A1* | 4/2019 | Lee | H01L 29/7786 |
| 2019/0165107 | A1* | 5/2019 | Park | H01L 21/02381 |
| 2020/0062906 | A1* | 2/2020 | Jeong | C08G 73/1039 |
| 2020/0155047 | A1* | 5/2020 | Rogers | A61B 5/01 |
| 2020/0161569 | A1* | 5/2020 | Yu | H01L 51/56 |
| 2020/0235185 | A1* | 7/2020 | Nie | G09G 3/3233 |
| 2020/0286926 | A1* | 9/2020 | Niu | H01L 29/66969 |
| 2020/0303417 | A1* | 9/2020 | Teo | G11C 11/2275 |
| 2020/0395473 | A1* | 12/2020 | Hersam | H01L 29/4908 |
| 2021/0005714 | A1* | 1/2021 | Tomida | H01L 29/1033 |
| 2021/0343817 | A1* | 11/2021 | Lim | H01L 51/56 |

FOREIGN PATENT DOCUMENTS

| | | | |
|---|---|---|---|
| KR | 101900045 B1 * | 9/2018 | ............ H01L 29/66 |
| KR | 101900045 B1 | 9/2018 | |

OTHER PUBLICATIONS

International Searching Authority, Written Opinion of International Searching Authority, Jul. 29, 2019, International Application No. PCT/KR2019/004822, all pages. (Year: 2019).*
Machine translation, Lee, Korean Pat. Pub. No. KR 20130005489, translation date: Jun. 13, 2021, Espacenet, all pages. (Year: 2021).*
Machine translation, Itabashi, Japanese Pat. Pub. No. JP H4-138690, translation date: Jun. 13, 2021, Espacenet, all pages. (Year: 2021).*
Machine translation, Ahn, Korean Pat. Pub. No. KR 101900045, translation date: Jun. 13, 2021, Espacenet, all pages. (Year: 2021).*
V. Pham & G. Yeom, Recent Advances in Doping of Molybdenum Disulfide: Industrial Applications and Future Prospects, 2016, Materials Views, Advanced Materials, vol. 28, pp. 9024-9059. (Year: 2016).*
J. Kim et al., Dual Gate Black Phosphorus Field Effect Transistors on Glass for NOR Logic and Organic Light Emitting Diode Switching, Aug. 14, 2015, Nano Letters, vol. 15, pp. 5778-5783. (Year: 2015).*
S. Yu et al., Transition Metal Dichalcogenide-Based Transistor Circuits for Gray Scale Organic Light-Emitting Displays, 2017, Advanced Science News, Advanced Functional Materials, vol. 27, No. 1603682, all pages. (Year: 2017).*
S. Kim et al., High-mobility and low-power thin-film transistors based on multilayer MoS2 crystals, Aug. 21, 2012, Nature Communications, No. 3:1011, pp. 1-7. (Year: 2012).*
Z. Huang, Improved Electrical Performance for Multilayer MoS2 Transistors by Using a Fully Encapsulated Al2O3 Dielectric Layer, Sep. 2018, Advances in Engineering Research, vol. 170, Atlantis Press, 7th International Conference on Energy and Environmental Protection (ICEEP 2018), pp. 298-304. (Year: 2018).*
English translation, Ahn, Korean Pat. Pub. No. KR 10-1900045, Jul. 2021, Schreiber Translations, Inc., all pages. (Year: 2021).*
M. Choi et al., Flexible active-matrix organic light-emitting diode display enabled by MoS2 thin-film transistor, Apr. 20, 2018, Science Advances, vol. 4, pp. 1-7. (Year: 2018).*

\* cited by examiner

ACTIVE MATRIX ORGANIC LIGHT-EMITTING DIODE DISPLAY DEVICE AND METHOD OF MANUFACTURING THE SAME

CROSS-REFERENCE TO RELATED APPLICATIONS

This application is a U.S. National Stage of PCT/KR2019/004822, filed on Apr. 22, 2019, which claims priority to and the benefit of Korean Patent Application No. 10-2018-0117746 filed in the Korean Intellectual Property Office on Oct. 2, 2018, the entire contents of which are incorporated herein by reference.

TECHNICAL FIELD

The present disclosure relates to an active matrix organic light-emitting diode display device and a method of manufacturing the same, and more particularly, to an active matrix organic light-emitting diode display device which includes a transition metal chalcogenide based backplane including a channel layer interposed between dielectric layers having a high permittivity to improve electron mobility and reduce both a channel resistance and a contact resistance and a method of manufacturing the same. This research relates to the center for strain engineered electronic devices in the leader researcher support project (No. 2017-11-1578).

BACKGROUND ART

Transition metal chalcogenides (TMDs) which are classified as two-dimensional materials show excellent physical properties required for devices according to a next generation of electronic or optoelectronics. The transition metal chalcogenides have a multilayered structure and are bonded by the interlayer van der Waals force, so that it is easy to mechanically peel off the transition metal chalcogenides through an adhesive or the like.

The transition metal chalcogenides have been reported to be superior to the existing material because of electrical and mechanical characteristics and are utilized for a large capacity of flexible switching based application based on the material characteristics.

Specifically, since the transition metal chalcogenides provide advantages to switch an organic light-emitting diode on a flexible substrate, such as a high carrier mobility, a high light transmittance, and a low bending stiffness, as compared with an inorganic semiconductor of the related art, a backplane for a flexible organic light-emitting diode (flexible OLED) display is known as one of the most promising applications of the transition metal chalcogenides.

When the transition metal chalcogenides are manufactured by a mechanical peeling method, only pieces having a very small area can be formed so that there is a limit to implement large-area electronic devices. Therefore, studies for high quality and large area synthesis are actively being performed to overcome the above-mentioned disadvantages.

Therefore, a method of synthesizing the transition metal chalcogenides to have a large size corresponding to a wafer size using chemical vapor deposition has been used among synthesizing methods of transition metal chalcogenides.

However, the transition metal chalcogenides grown using the chemical vapor deposition have a difficulty to be applied to a backplane for a flexible system or a large area organic light-emitting diode display due to a low mobility and an inferior semiconductor characteristic caused by a small crystal grain boundary.

SUMMARY OF THE INVENTION

An object of the present disclosure is to provide an active matrix organic light-emitting diode display device which includes a transition metal chalcogenide based backplane with an increased electron mobility of a backplane by interposing a transition metal chalcogenide based channel layer between insulating layers having a high permittivity and a method of manufacturing the same.

Another object of the present disclosure is to provide an active matrix organic light-emitting diode display device including a transition metal chalcogenide based backplane which forms an insulating layer having a high dielectric constant above a transition metal chalcogenide based channel layer to be doped with a channel layer of the back plane to simultaneously lower a channel resistance and a contact resistance and a method of manufacturing the same.

Another object of the present disclosure is to provide an active matrix organic light-emitting diode display device including a transition metal chalcogenide based backplane which forms an insulating layer having a high permittivity below a transition metal chalcogenide based channel layer to reduce a roughness of a substrate or a scattering effect due to charges trapped by the substrate, thereby effectively reducing hysteresis and a method of manufacturing the same.

Another object of the present disclosure is to provide an active matrix organic light-emitting diode display device which is applicable to a wearable device or a flexible device to be utilized in various fields including medical or sports, such as health monitoring system which is attachable to skin or clothes through a transition metal chalcogenide based backplane having excellent reliability and uniformity and a method of manufacturing the same.

Another object of the present disclosure is to provide an active matrix organic light-emitting diode display device and a method of manufacturing the same which are capable of manufacturing a large size tactile sensor using a transition metal chalcogenide based backplane.

According to an aspect of the present disclosure, a manufacturing method of an active matrix organic light-emitting diode display device includes forming a sacrificial layer on a carrier layer; forming a flexible substrate on the sacrificial layer; forming a first insulating layer on the flexible substrate; forming at least one transition metal chalcogenide based backplane on the first insulating layer; and forming an opening unit after forming a capping layer on the at least one transition metal chalcogenide based backplane; and forming at least one active matrix organic light-emitting diode unit which is electrically connected to the at least one transition metal chalcogenide based backplane in the opening unit, in which the forming of at least one transition metal chalcogenide based backplane includes: forming a first insulating layer on the flexible substrate; forming source/drain electrodes which are spaced apart from each other on the first insulating layer; forming a channel layer including transition metal chalcogenide in a channel region and the source/drain electrodes of the flexible substrate; doping the channel layer by forming a second insulating layer on the channel layer; and forming a gate electrode on the second insulation layer, and in the at least one transition metal chalcogenide based backplane, the channel region is doped with electrons by the doping and a contact portion of the source/drain electrodes with the channel layer is doped with electrons.

The manufacturing method of an active matrix organic light emitting diode display device may further include: removing the sacrificial layer and the carrier layer.

The active matrix organic-light emitting diode unit may further include: forming a first electrode which is electrically connected to the at least one transition metal chalcogenide based backplane; forming an organic light emitting layer on the first electrode; and forming a second electrode on the organic light emitting layer.

The organic light emitting layer may include a hole injection layer, a hole transporting layer, a light emitting layer, an electron transporting layer, and an electron injection layer.

The first electrode may be a transparent electrode.

The transition metal chalcogenide may be a single layer or a multilayered structure.

The first insulating layer and the second insulating layer may be formed of the same material.

The channel layer may be any one of a single layer, a double layer, and a multiple layer.

The first insulating layer or the second insulating layer may be any one of alumina ($Al_2O_3$), silica ($SiO_2$), hafnium oxide ($HfO_2$), zirconium oxide ($ZrO_2$), zinc oxide (ZnO) and titanium oxide ($TiO_2$).

According to another aspect of the present disclosure, an active matrix organic light-emitting diode display device is manufactured by a method according to any one of claims 1 to 10.

An object of the present disclosure is to provide an active matrix organic light-emitting diode display device which includes a transition metal chalcogenide based backplane with an increased electron mobility of a backplane by interposing a transition metal chalcogenide based channel layer between insulating layers having a high permittivity and a method of manufacturing the same.

The present disclosure may provide an active matrix organic light-emitting diode display device including a transition metal chalcogenide based backplane which forms an insulating layer having a high permittivity above a transition metal chalcogenide based channel layer to be doped with a channel layer of the back plane to simultaneously reduce a channel resistance and a contact resistance and a method of manufacturing the same.

The present disclosure may provide an active matrix organic light-emitting diode display device including a transition metal chalcogenide based backplane which forms an insulating layer having a high permittivity below a transition metal chalcogenide based channel layer to reduce a roughness of a substrate or a scattering effect due to charges trapped by the substrate, thereby effectively reducing hysteresis and a method of manufacturing the same.

The present disclosure may provide an active matrix organic light-emitting diode display device which is applicable to a wearable device or a flexible device to be utilized in various fields including medical or sports, such as health monitoring system which is attachable to skin or clothes through a transition metal chalcogenide based back plane having an excellent reliability and uniformity and a method of manufacturing the same.

The present disclosure may provide an active matrix organic light-emitting diode display device which enables a large area tactile sensor using a transition metal chalcogenide based backplane and a method of manufacturing the same.

DETAILED DESCRIPTION OF THE EMBODIMENT

Figure 1A:
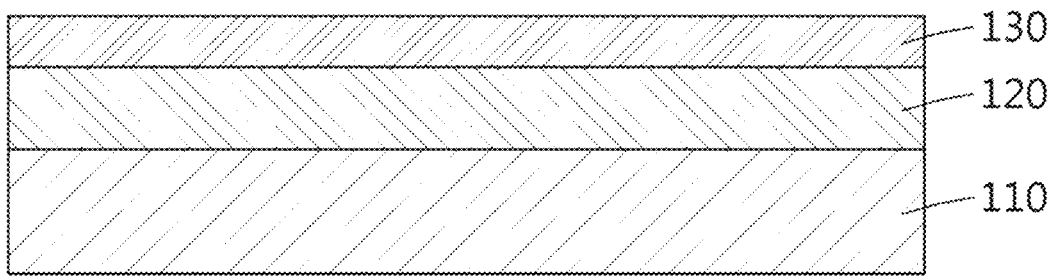
FIGS. 1A to 1J illustrate a manufacturing method of an active matrix organic light-emitting diode display device according to an embodiment of the present disclosure.

Hereinafter, exemplary embodiments of the present invention will be described in detail with reference to accompanying drawings and contents described in the accompanying drawings, but the present invention is not limited or restricted by the exemplary embodiments.

The terms used in the present specification are for explaining the embodiments rather than limiting the present invention. Unless particularly stated otherwise in the present specification, a singular form also includes a plural form. The word "comprises" and/or "comprising" used in the present specification will be understood to imply the inclusion of stated constituents, steps, operations and/or elements but not the exclusion of any other constituents, steps, operations and/or elements.

It may not be interpreted that arbitrary aspect or design of exemplary embodiments", "example", "aspect", or "instance" used in this specification is better than other aspects or designs or has an advantage.

Further, the term "or" means "inclusive or" rather than "exclusive or". That is, unless stated otherwise or clearly understood from the context, the expression "x uses a or b" means any one of natural inclusive permutations.

Further, a singular form ("a" or "an") used in the specification and the claims should be interpreted as "one or more" unless mentioned otherwise or clearly understood to indicate a singular form from the context.

Further, when it is described that a part such as a film, a layer, a region, or a component is disposed "on" or "above" the other part, it is not only immediately on the other part, but also a third film, layer, a region, or a component is interposed between the above two parts.

Those skilled in the art may make various modifications to the present invention and the present invention may have various embodiments thereof, and thus specific embodiments will be illustrated in the drawings and described in detail in detailed description. However it should be understood that the invention is not limited to the specific embodiments, but includes all changes, equivalents, or alternatives which are included in the spirit and technical scope of the present invention. In the description of respective drawings, like reference numerals denote like elements.

FIGS. 1A to 1J illustrate a manufacturing method of an active matrix organic light-emitting diode display device according to an embodiment of the present disclosure.

Referring to FIG. 1A, according to a manufacturing method of an active matrix organic light-emitting diode display device 100 according to an embodiment of the present disclosure, a flexible substrate 130 is formed on a carrier layer 110 on which a sacrificial layer 120 is formed.

The carrier layer 100 is necessary to maintain a shape and uses a silicon wafer (Si wafer) which has no defect at a high purity and has an excellent electrical property. Depending on the embodiment, the carrier layer 110 may be a glass substrate as an insulating substrate, but is not limited thereto, and may be formed of various materials.

The sacrificial layer 120 is a member which separates the carrier layer 100 from the flexible substrate 130 in a process to be performed later and a material thereof is not specifically limited.

For example, the material of the sacrificial layer may include at least one selected from a group consisting of polyethylene, polypropylene, polydimethylsiloxane (PDMS), poly(methylmethacrylate) (PMMA), polyimide, polycarbonate, polyacrilate, polyetherimide, polyethersulfone, polyethylene terphthalate, polyethylene naphthalate, polysulfone, polyvinylidene fluoride, and polyacrylonitrile.

The flexible substrate 130 is a substrate which supports various components of a transition metal chalcogenide based backplane and an active organic light-emitting oxide diode unit and a material thereof is not specifically limited.

For example, the flexible substrate 130 may be formed of any one material selected from a group consisting of glass, polyimide polymer, polyester polymer, silicon polymer, acrylic polymer, polyolefin polymer, or a copolymer thereof.

Depending on the embodiment, the flexible substrate 130 may be formed of a transparent flexible material configured by any one material selected from a group consisting of polyester, polyvinyl, polycarbonate, polyethylene, polyacetate, polyimide, polyethersulphone (PES), polyacrylate (PAR), polyethylenenaphthelate (PEN), and polyethyleneterephehalate (PET).

Figure 1B:
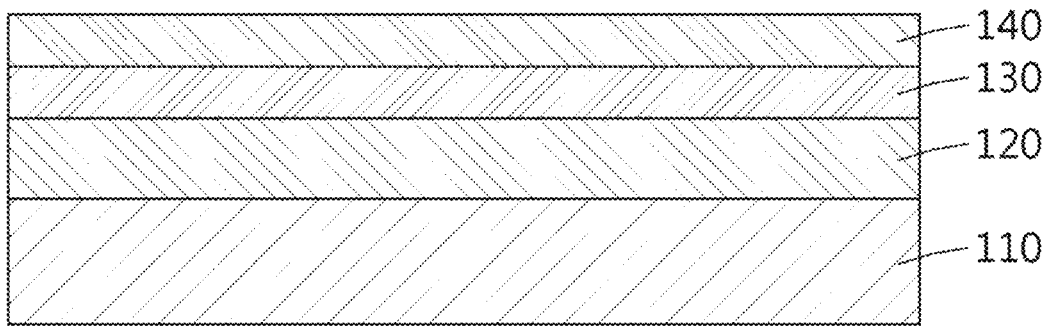

Referring to FIG. 1B, according to the manufacturing method of an active matrix organic light-emitting diode display device 100 according to an embodiment of the present disclosure, a first insulating layer 140 is formed on the flexible substrate 130.

The first insulating layer 140 may be any one of alumina ($Al_2O_3$), silica ($SiO_2$), hafnium oxide ($HfO_2$), zirconium oxide ($ZrO_2$), zinc oxide (ZnO)m and titanium oxide ($TiO_2$).

However, a material which forms the first insulating layer 140 and a processing method are not limited thereto, and other known materials and other methods may be used.

Figure 1C:
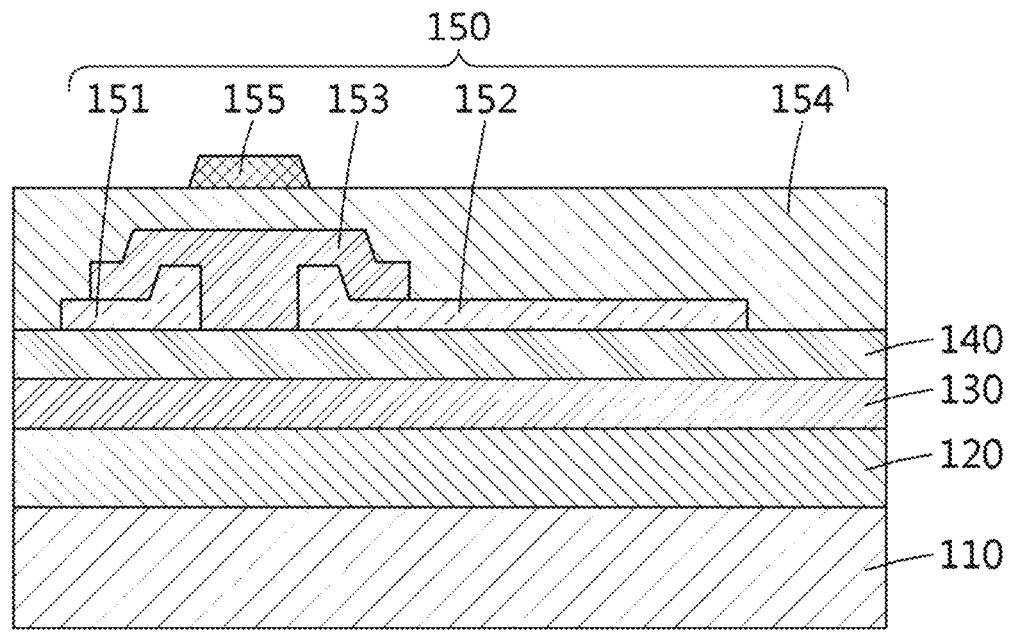

Referring to FIG. 1C, according to the manufacturing method of an active matrix organic light-emitting diode display device 100 according to an embodiment of the present disclosure, at least one transition metal chalcogenide based backplane 150 (hereinafter, referred to as a transition metal chalcogenide based backplane) is formed on the first insulating layer 140.

The transition metal chalcogenide based backplane 150 includes source electrode 151/drain electrode 152, a channel layer 153 including a transition metal chalcogenide, a second insulating layer 154, and a gate electrode 155 formed on the flexible substrate 130 on which the first insulating layer 140 is formed.

The method of manufacturing the transition metal chalcogenide based backplane 150 will be described in detail with reference to FIGS. 2A to 2F.

Figure 1D:
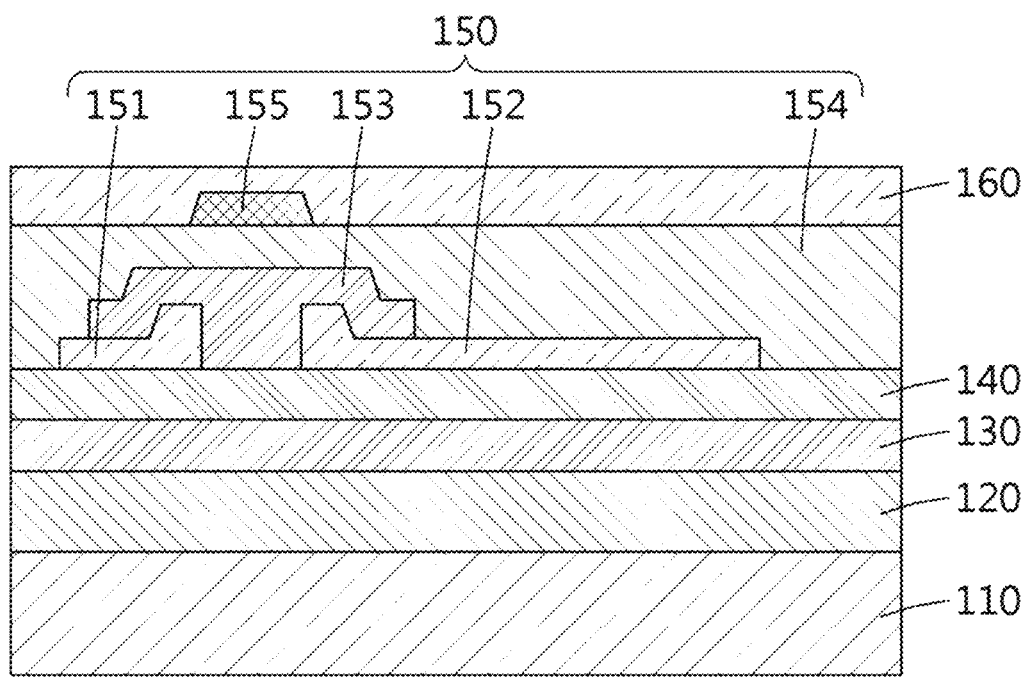

Referring to FIG. 1D, according to the manufacturing method of an active matrix organic light-emitting diode display device 100 according to an embodiment of the present disclosure, a capping layer 160 is formed on the transition metal chalcogenide based backplane 150.

The capping layer 160 is formed on the second insulating layer 154 on which the gate electrode 155 of the transition metal chalcogenide based backplane 150 is formed and protects the transition metal chalcogenide based backplane 150.

The capping layer 160 may use at least one of inorganic materials such as silicon oxide (SiOx), silicon nitride (SiNx), titanium oxide (TiOx) or hafnium oxide (HfOx), or organic materials such as polyvinyl alcohol (PVA), polyvinylpyrrolidone (PVP), or polymethyl methacrylate (PMMA), but is not limited thereto.

Further, the capping layer 160 may be formed by a single layer or a multilayered structure including the above-described material.

Figure 1E:
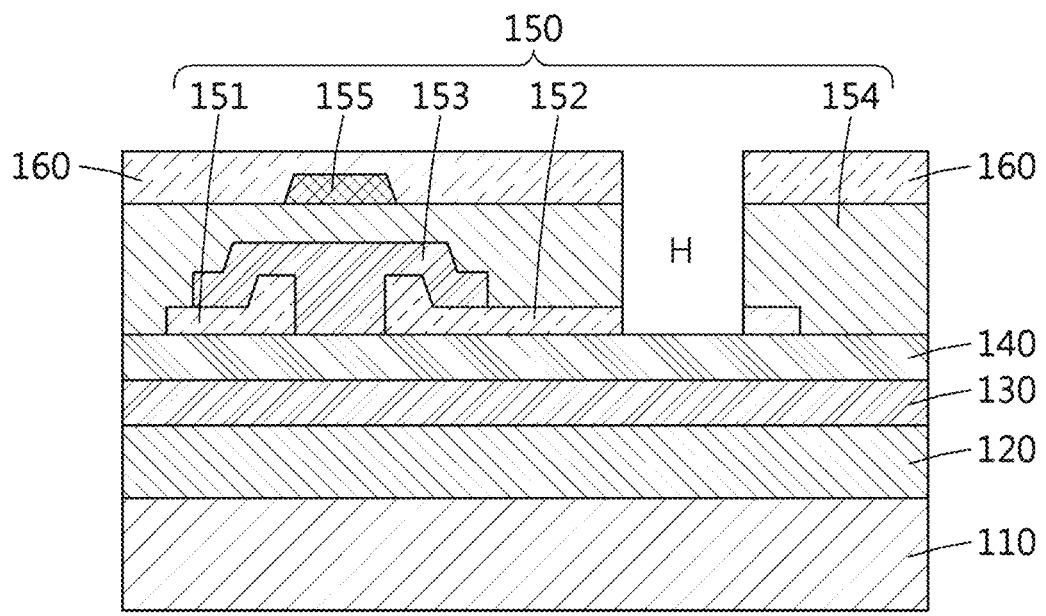

Referring to FIG. 1E, according to the manufacturing method of an active matrix organic light-emitting diode display device 100 according to an embodiment of the present disclosure, an opening unit H is formed to electrically connect the drain electrode 152 of the transition metal chalcogenide based backplane 150 and at least one active matrix organic light-emitting diode unit 170 (hereinafter, referred to as an active matrix organic light-emitting diode unit).

The opening unit H is formed by etching the second insulating layer 154 and the capping layer 160 and in the opening unit H, a first electrode 171 which is connected to an organic light emitting layer 172 of the active matrix organic light-emitting diode unit 170 to be formed by a subsequent process may be included.

Figure 1F:
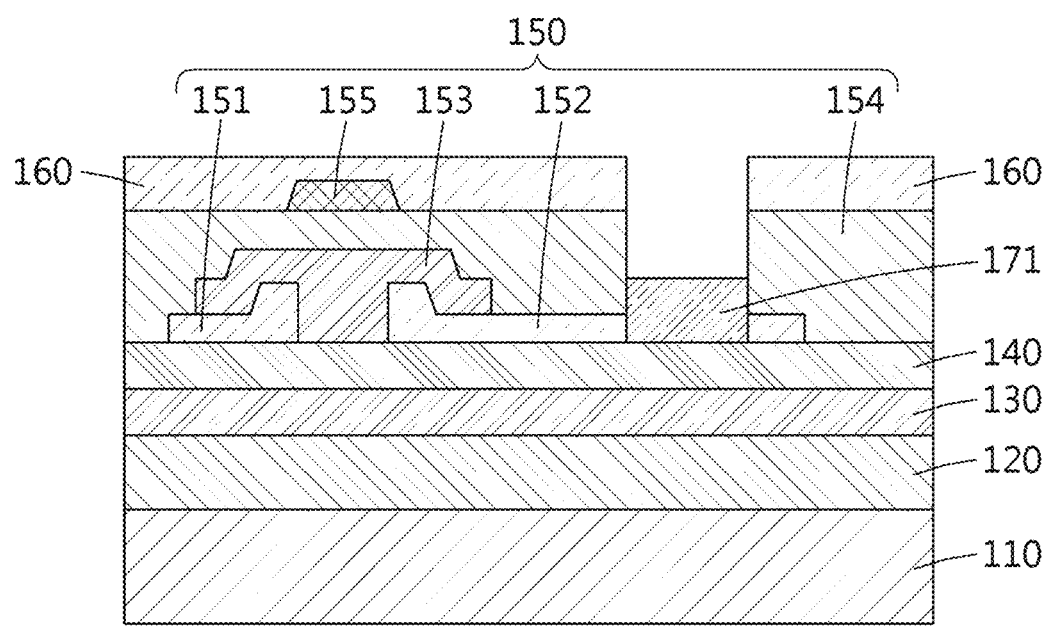
Figure 1G:
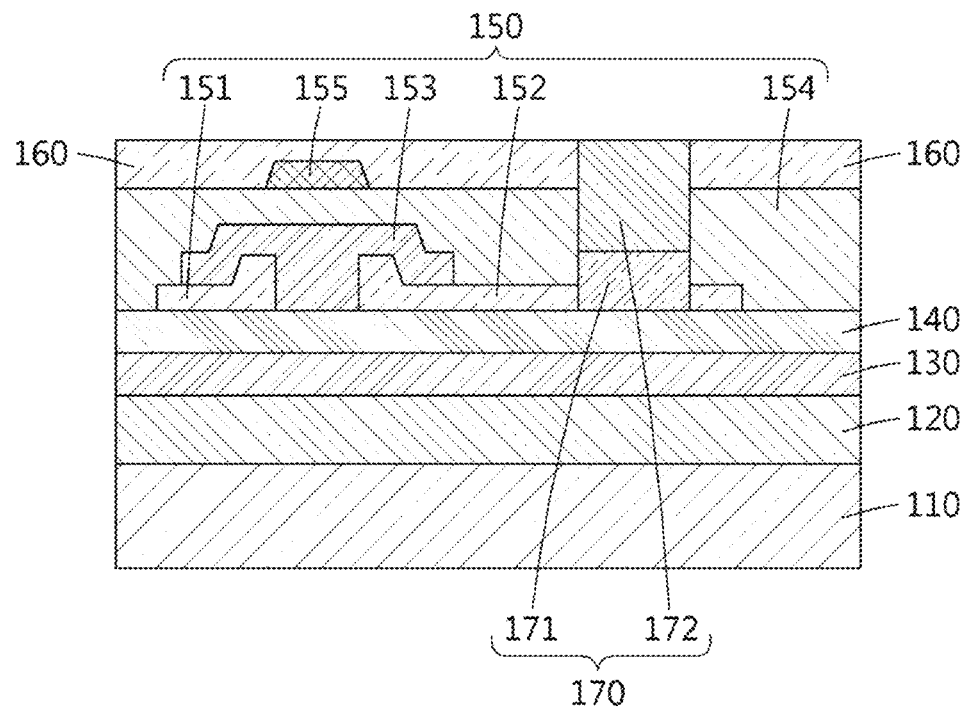
Figure 1H:
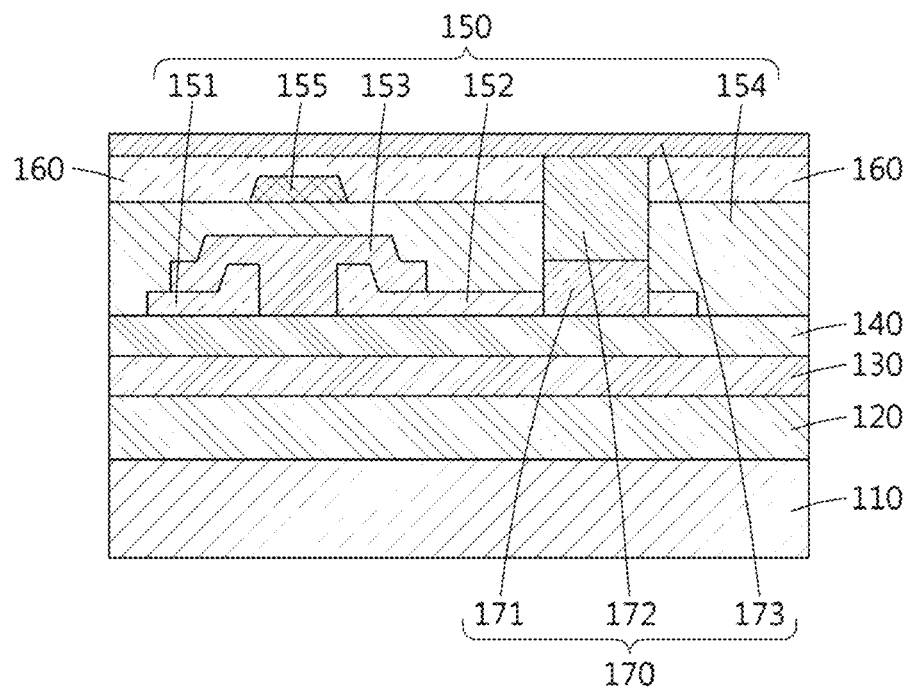

Referring to FIGS. 1F and 1G, according to the manufacturing method of an active matrix organic light-emitting diode display device 100 according to an embodiment of the present disclosure, the active matrix organic light-emitting diode unit 170 which is electrically connected to the drain electrode 152 of the transition metal chalcogenide based backplane 150 is formed in the opening unit H.

The active matrix organic light-emitting diode unit 170 includes the first electrode 171, a second electrode 173, and an organic light emitting layer 172 formed between the first electrode 171 and the second electrode 173.

The first electrode 171 may be formed by depositing a conductive material in the opening unit H and then selectively etching (patterning) the conductive material with a photoresist pattern as a mask.

Therefore, the first electrode 171 may be formed in the opening unit H and a surface of the first insulating layer.

The first electrode 171 may include metal or metal oxide which is a conductive material. Specifically, the first electrode may be formed of at least one material of metals such as molybdenum (Mo), aluminum (Al), chrome (Cr), gold (Au), titanium (Ti), silver (Ag), nickel (Ni), neodymium (Nd), and copper (Cu) and a metal oxide such as indium tin oxide (ITO), indium zinc oxide (IZO), or indium tin zinc oxide (ITZO), or a combination thereof, but is not limited thereto.

Depending on the embodiment, an electron transporting layer or an electron injection layer may be further included between the first electrode 171 and the organic light emitting layer 172 and a hole injection layer or a hole transporting layer may be further included between the organic light emitting layer 172 and the second electrode 173.

The second electrode 173 is formed on the capping layer 160 and the organic light emitting layer 172 and the second electrode 173 may include metal or metal oxide which is a conductive material. Specifically, the second electrode may be formed of at least one material of metals such as molybdenum (Mo), aluminum (Al), chrome (Cr), gold (Au), titanium (Ti), silver (Ag), nickel (Ni), neodymium (Nd), and copper (Cu) and a metal oxide such as indium tin oxide (ITO), indium zinc oxide (IZO), or indium tin zinc oxide (ITZO), or a combination thereof, but is not limited thereto.

Figure 1I:
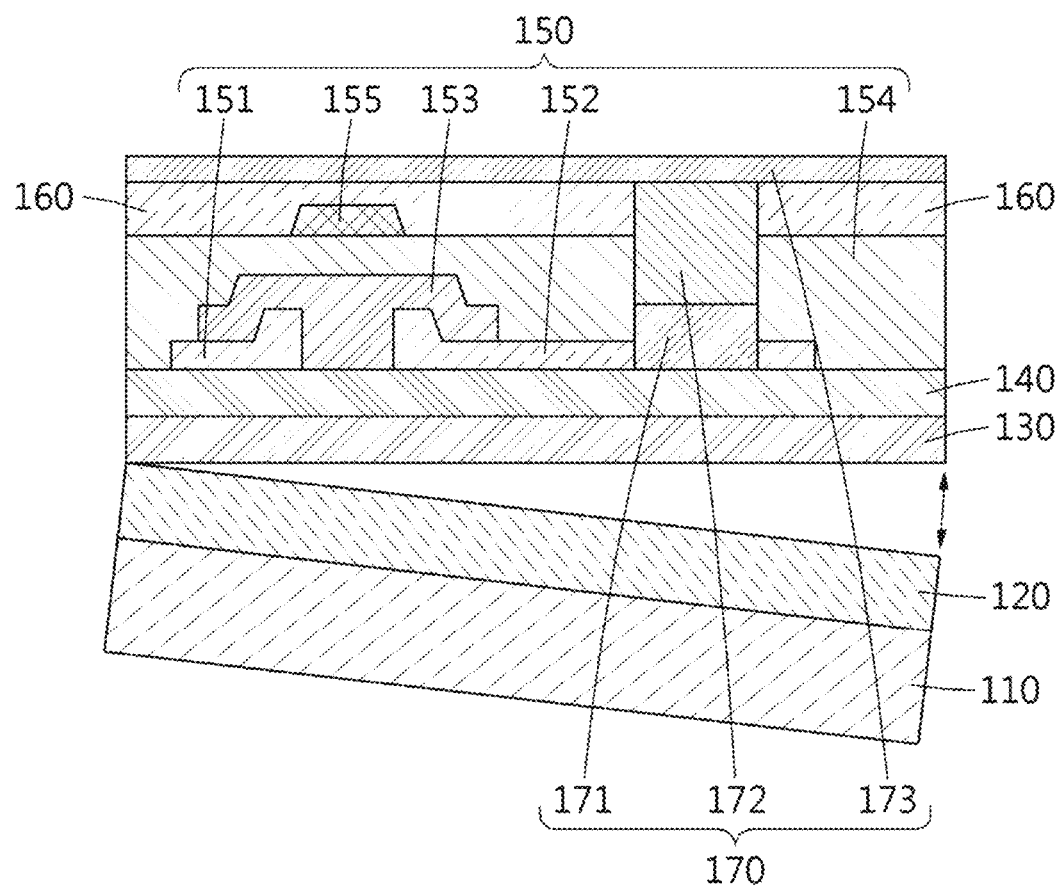
Figure 1J:
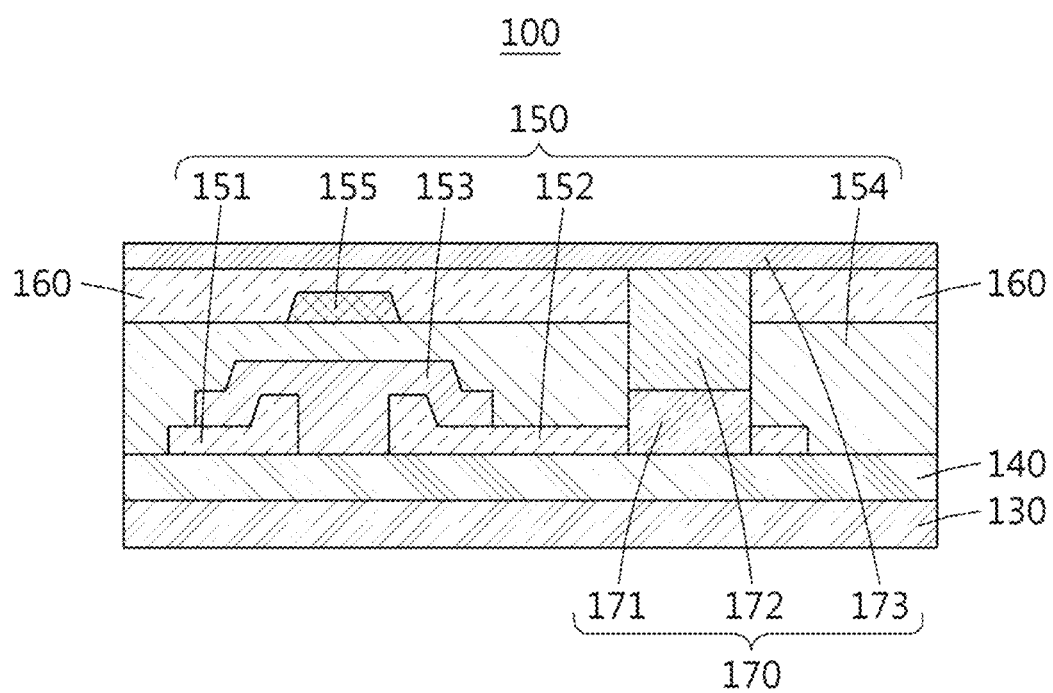

Referring to FIGS. 1I and 1J, according to the manufacturing method of an active matrix organic light-emitting diode display device 100 according to an embodiment of the present disclosure, the active matrix organic light-emitting diode display device 100 including a transition metal chalcogenide based backplane and an active matrix organic light-emitting diode unit which is electrically connected to the transition metal chalcogenide based backplane is formed by separating the flexible substrate 130 from the carrier layer 110 and the sacrificial layer 120.

The flexible substrate 130 may be separated from the carrier layer 110 and the sacrificial layer 120 by at least one manufacturing process of photolithography, E-beam lithography, metal deposition, etching, and lift-off processes, but the method is not limited thereto and a known other method may also be used.

The active matrix organic light-emitting diode display device 100 according to the embodiment of the present disclosure formed by the above-described manufacturing method may be formed to have a thickness of 7 μm or smaller.

Hereinafter, a method of forming a transition metal chalcogenide based backplane will be described in detail with reference to FIGS. 2A to 2F.

FIGS. 2A to 2F illustrate a manufacturing method of a transition metal chalcogenide based backplane 200 included in an active matrix organic light-emitting diode display device 100 according to an embodiment of the present disclosure.

A transition metal chalcogenide based backplane 200 according to an embodiment of the present disclosure includes a flexible substrate 210, a first insulating layer 220, source/drain electrodes 230 and 240, a channel layer 250, a second insulating layer 260, and a gate electrode 270.

Figure 2A:
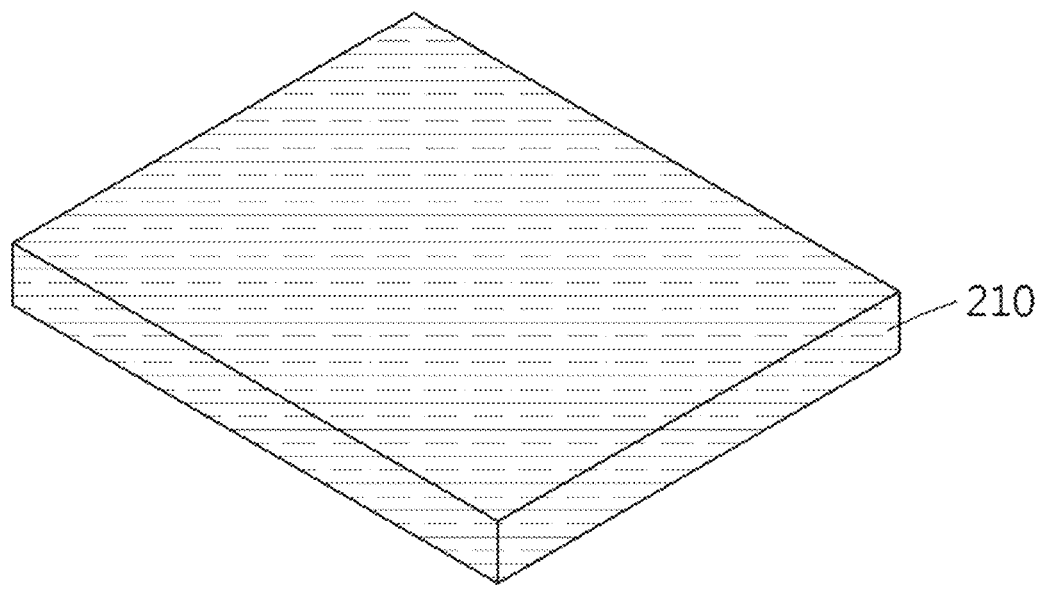
FIGS. 2A to 2F illustrate a manufacturing method of a transition metal chalcogenide based backplane 200 included in an active matrix organic light-emitting diode display device 100 according to an embodiment of the present disclosure.
Figure 2B:
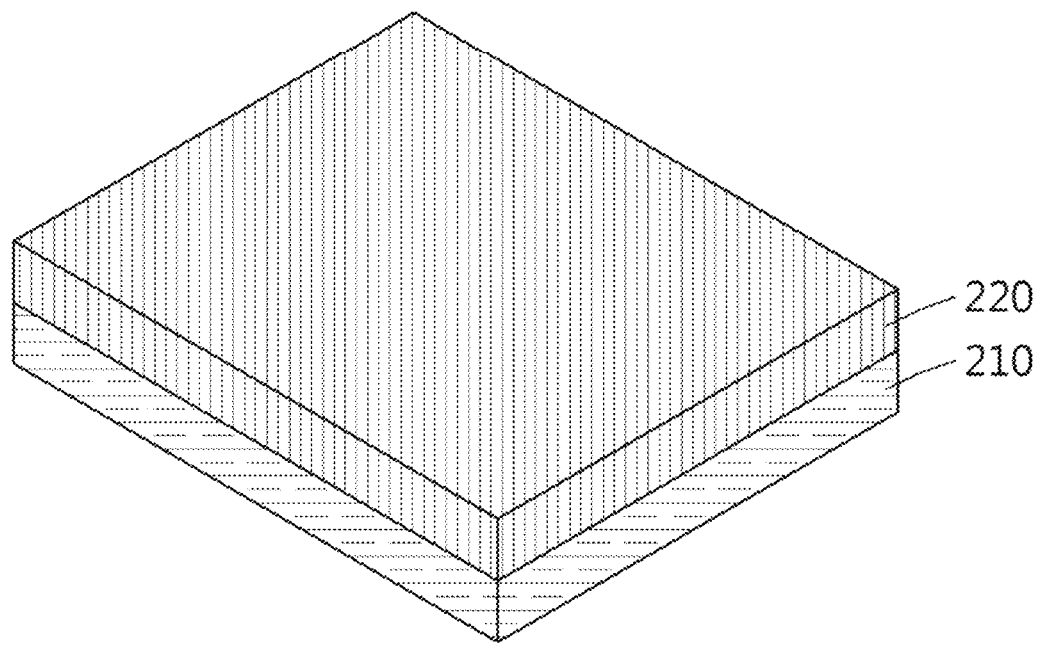

Referring to FIGS. 2A and 2B, according to the manufacturing method of a transition metal chalcogenide based backplane 200 according to an embodiment of the present disclosure, the flexible substrate 210 is prepared and the first insulating layer 220 is formed on the prepared flexible substrate 210.

As illustrated in FIG. 2A, the flexible substrate 210 is a substrate which supports a plurality of components of the transition metal chalcogenide based backplane 200, but the material is not specifically limited.

For example, the flexible substrate 210 may be formed of any one material selected from a group consisting of glass, polyimide polymer, polyester polymer, silicon polymer, acrylic polymer, polyolefin polymer, or a copolymer thereof.

Depending on the embodiment, the flexible substrate 210 may be formed of a transparent flexible material configured by any one material selected from a group consisting of polyester, polyvinyl, polycarbonate, polyethylene, polyacetate, polyimide, polyethersulphone (PES), polyacrylate (PAR), polyethylenenaphthelate (PEN), and polyethyleneterephehalate (PET).

As illustrated in FIG. 2B, the first insulating layer 220 may be formed on the flexible substrate 210.

The first insulating layer 220 may be any one of alumina ($Al_2O_3$), silica ($SiO_2$), hafnium oxide ($HfO_2$), zirconium oxide ($ZrO_2$), zinc oxide (ZnO)m and titanium oxide ($TiO_2$).

The first insulating layer 220 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

However, the material which configures the first insulating layer 220 and a processing method are not limited thereto and known other materials or other methods may be used.

Figure 2C:
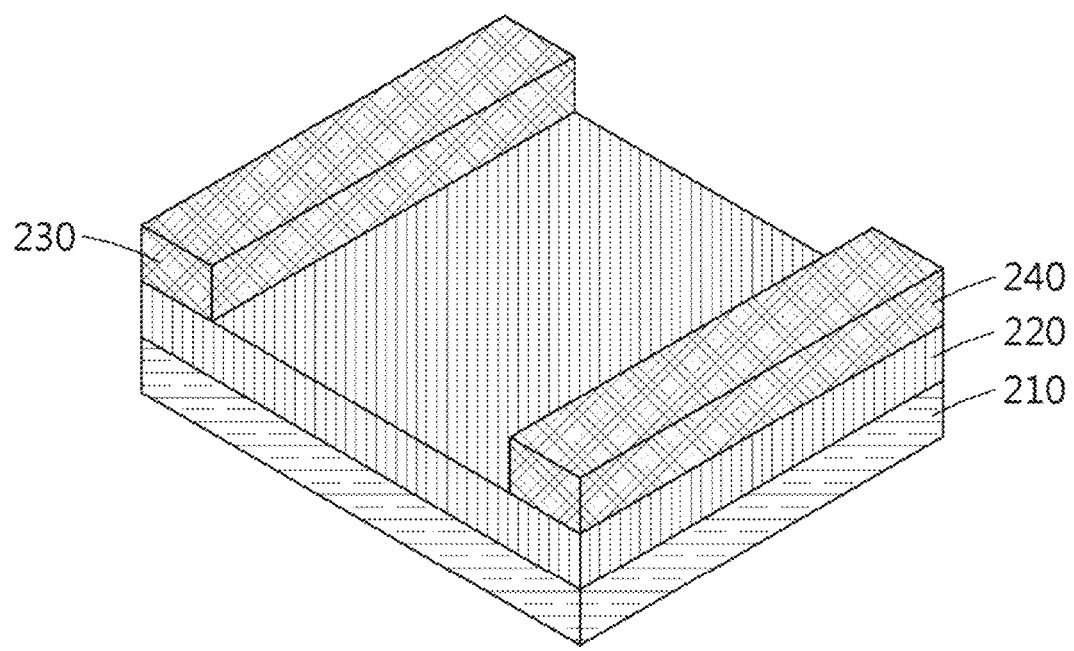

Referring to FIG. 2C, according to the manufacturing method of a transition metal chalcogenide based backplane 200 according to an embodiment of the present disclosure, the source electrode 230 and the drain electrode 240 are formed to be spaced apart from each other on the flexible substrate 210 on which the first insulating layer 220 is formed.

The source electrode 230 and the drain electrode 240 may use a conductive material having a low resistance, such as aluminum (Al), aluminum alloy (Al alloy), tungsten (W), copper (Cu), nickel (Ni), chrome (Cr), molybdenum (Mo), titanium (Ti), platinum (Pt), or tantalum (Ta).

Further, the source electrode 230 and the drain electrode 240 may use a transparent conductive material, such as indium tin oxide (ITO), indium zinc oxide (IZO), or indium tin zinc oxide (ITZO). Depending on the embodiment, the source electrode 230 and the drain electrode 240 may be formed to have a multilayered structure on which two or more of conductive materials are laminated.

However, the material which configures the source electrode 230 and the drain electrode 240 and a processing method are not limited thereto and known other materials or other methods may be used.

Figure 2D:
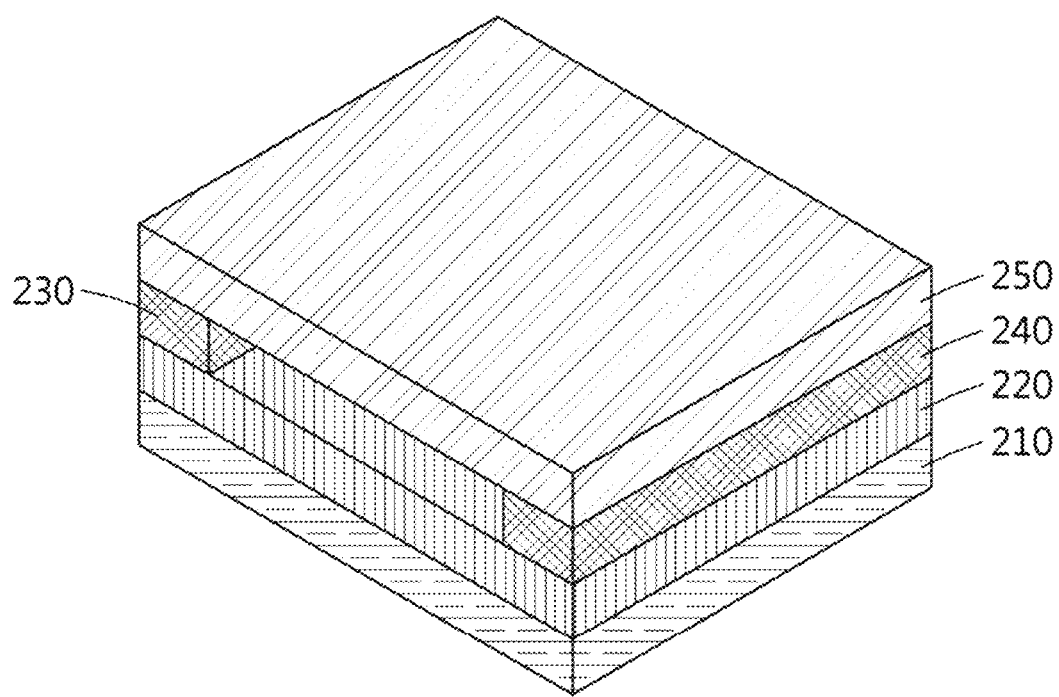

Referring to FIG. 2D, according to the manufacturing method of a transition metal chalcogenide based backplane 200 according to an embodiment of the present disclosure, the channel layer 250 is formed on a channel region of the flexible substrate 210 and the source electrode 230 and the drain electrode 240.

The channel layer 250 is formed of a transition metal chalcogenide and has the following characteristic.

The transition metal chalcogenide is a compound formed by a transition metal and chalcogen and has a layered structure in which a strong interatomic covalent bond is formed in a plane and a plurality of transition metal dechalcogenide layers is connected threbetween with a weak van der Waals force. The transition metal dechalcogenide has a semiconductor characteristic having a band gap.

The transition metal chalcogenide includes molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), and tungsten ditelluride ($WTe_2$).

The channel layer 240 including the transition metal chalcogenide may be a single layer, a double layer, or a multilayered structure.

Figure 2E:
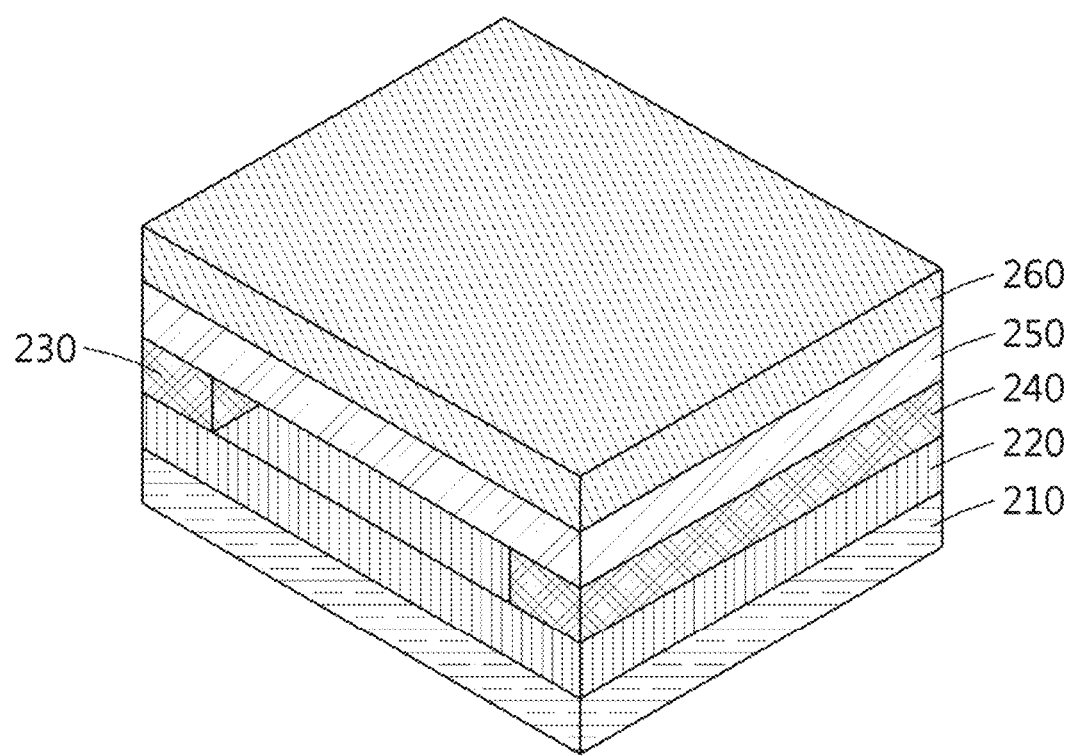

Referring to FIG. 2E, according to the manufacturing method of a transition metal chalcogenide based backplane 200 according to an embodiment of the present disclosure, the second insulating layer 260 is formed on the channel layer 250 to dope the channel layer 250 with electrons.

The second insulating layer 260 may be any one of alumina ($Al_2O_3$), silica ($SiO_2$), hafnium oxide ($HfO_2$), zirconium oxide ($ZrO_2$), zinc oxide (ZnO)m and titanium oxide ($TiO_2$).

The second insulating layer 260 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

However, the material which configures the second insulating layer 260 and a processing method are not limited thereto and known other materials or other methods may be used.

The first insulating layer 220 and the second insulating layer 250 may be formed of the same material, and desirably formed of alumina ($Al_2O_3$).

The second insulating layer 260 is formed on the channel layer 250 to dope the channel layer 250 so that the channel region of the flexible substrate 210 is doped and a contact portion of the source electrode 230 and the drain electrode 240 with the channel layer 250 is also doped with electrons, by doping the channel region.

Both a channel resistance and a contact resistance may be reduced by the doping.

Figure 2F:
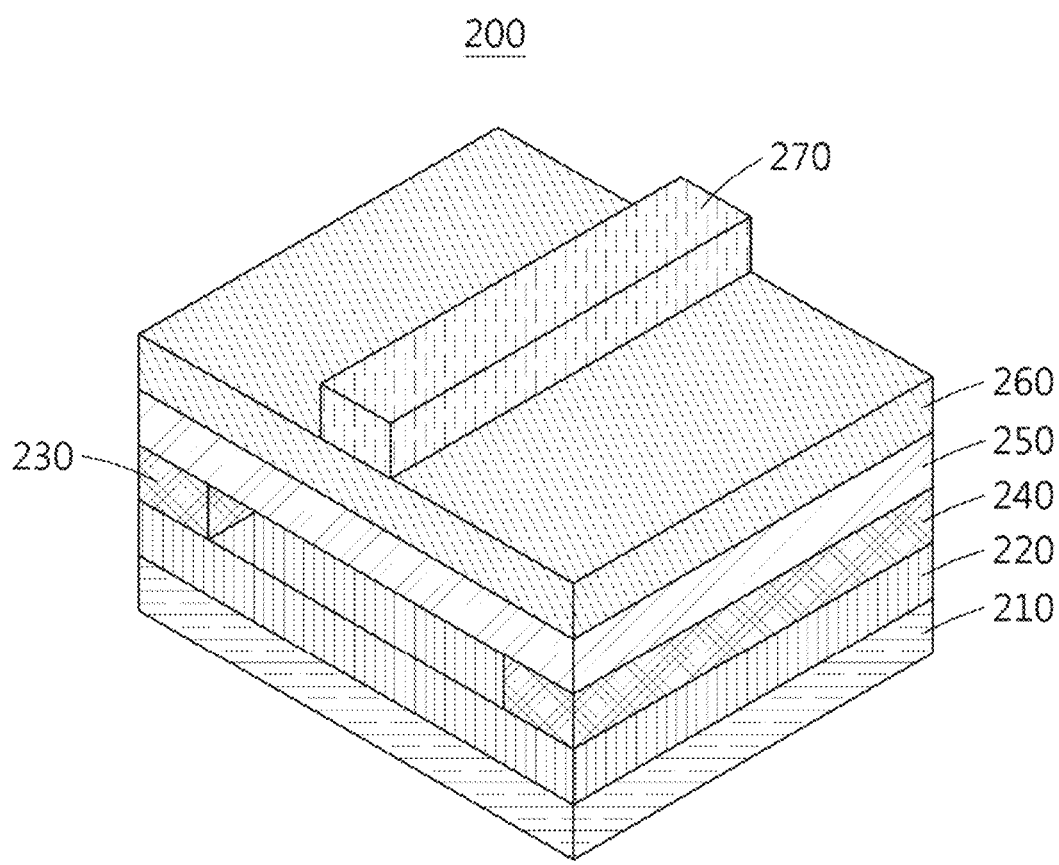

Referring to FIG. 2F, according to the manufacturing method of a transition metal chalcogenide based backplane 200 according to an embodiment of the present disclosure, the gate electrode 270 is formed on the second insulating layer 260.

As illustrated in FIG. 2F, the gate electrode 270 may be formed on the second insulating layer 260.

For example, the gate electrode 270 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

The gate electrode 270 may be formed any one of molybdenum (Mo), aluminum (Al), chromium (Cr), gold (Au), titanium (Ti), nickel (Ni), neodymium (Nd), and copper (Cu), or a combination thereof, but is not limited thereto and formed of various materials.

Further, depending on the embodiment, a p$^+$-Si material may be used for the gate electrode 270.

Hereinafter, a characteristic of an active matrix organic light-emitting diode display device according to an embodiment of the present disclosure will be described.

Example (Synthesis of Molybdenum Disulfide (MoS$_2$))

A double layered molybdenum disulfide was grown using MOCVD. A 4-inch Si wafer containing thermally grown SiO$_2$ with a thickness of 300 nm was placed in a quartz tube with a 4.3-inch diameter.

Before growing molybdenum disulfide, washing was performed with water, acetone, and isopropanol to remove organic materials or impurities that may have formed on the surface of the SiO$_2$/p$^+$-Si substrate.

Molybdenum hexacarbonyl (WIC; 577766, Sigma-Aldrich) and dimethylsulfide (DMS; 471577, Sigma-Aldrich) with a high equilibrium vapor pressure were selected as precursors of Mo and S, respectively, and H$_2$ and Ar were used as gaseous carrier gases.

The double-layered molybdenum disulfide was grown with a condition of a pressure of 7.5 torr, a growth temperature of 550° C., a growth time of 20 hours, a MHC flow rate of 1.0 sccm per minute, a DMS flow rate of 0.3 sccm, and a flow rate of H$_2$ and Ar of 300 sccm and 10 sccm.

(To Form Molybdenum Disulfide Based Backplane)

After depositing Al$_2$O$_3$ layer with a thickness of 50 nm on an SiO$_2$ wafer with a thickness of 300 nm using atomic layer deposition (ALD), the source/drain electrodes were patterned on an Al$_2$O$_3$/SiO$_2$ wafer using general photolithography (WL, 300/4 μm).

The double-layered molybdenum disulfide was transferred onto the Al$_2$O$_3$/SiO$_2$ wafer and was patterned onto the channel layer by reactive ion etching which used CHF$_3$/O$_2$ plasma, and an upper Al$_2$O$_3$ layer with a thickness of 50 nm was deposited on the double-layered molybdenum disulfide.

In order to avoid H$_2$O molecular trap and the Mo—O bond during an initial growing cycle of the atomic layer deposition, minimum H$_2$O exposure combination at a low temperature which significantly deteriorated the performance of the molybdenum disulfide based backplane was optimized.

Further, in order to improve the interface of the Al$_2$O$_3$ layer and the double-layered molybdenum disulfide, the baking was performed at 110° C. for one night under a vacuum state of the device.

Finally, the photolithography and the lift-off process were used to form an upper gate electrode (Cr/Ac, 3/30 nm).

In order to analyze the characteristic of the molybdenum disulfide, SourceMeter device (Keithley 4200 SCS parameter analyzer, Keithley Instruments Inc.) was used.

(To Form Active Matrix Organic Light-Emitting Diode Unit)

A substrate coated with ITO was used to form a green active matrix organic light-emitting diode unit.

Washing was performed with water, acetone, and isopropanol to remove organic materials or impurities that may have formed on the surface of the substrate coated with ITO and then UV/ozone treatment was performed for 15 minutes.

N, N'-di(1-naphthyl)-N, N'-diphenyl-(1,10-biphenyl)-4, 40-diamine (40 nm), tris-(8-hydroxy-quinoline) aluminum (Alq3, 30 nm), 2, 3, 6, 7-tetrahydro-1, 1, 7, 7,-tetramethyl-1H,5H,11H-10-(2-benzothiazolyl) quino-lizine [9,9a,1gh] coumarin (5% doping), bathocuproine (5 nm), and Alq3 (25 nm) were deposited at a speed of 1 Å/s under the vacuum of approximately $2 \times 10^{-6}$ Torr, as a hole transporting layer, a light emitting layer, a hole stop layer, and an electron transporting layer.

Thereafter, LiF (1 nm) and Al (100 nm) layers were thermally deposited.

Figure 3A:
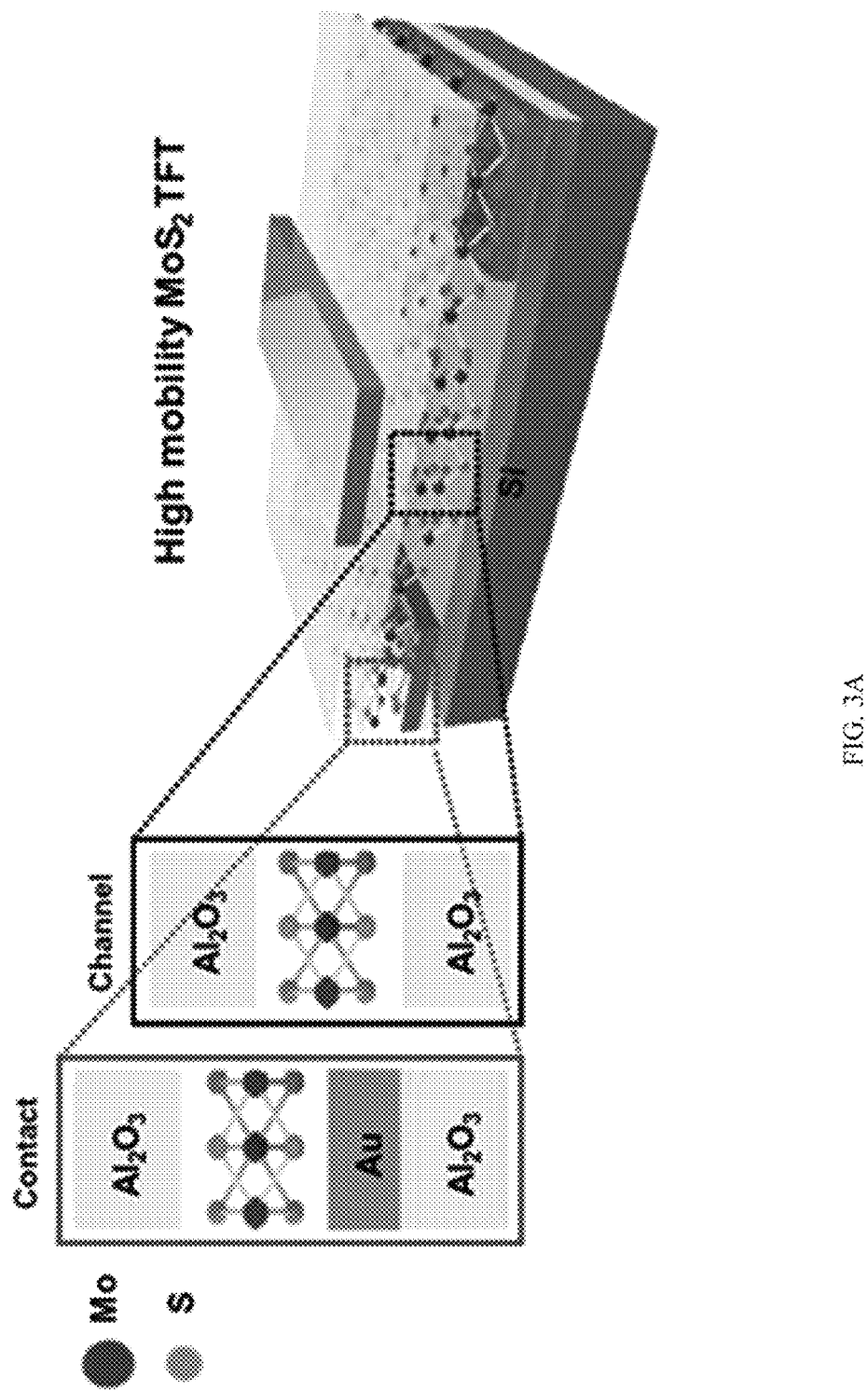
FIG. 3A illustrates a three-dimensional structure of a molybdenum disulfide based backplane formed by a manufacturing method of a transition metal chalcogenide based backplane according to an embodiment of the present disclosure.
Figure 3B:
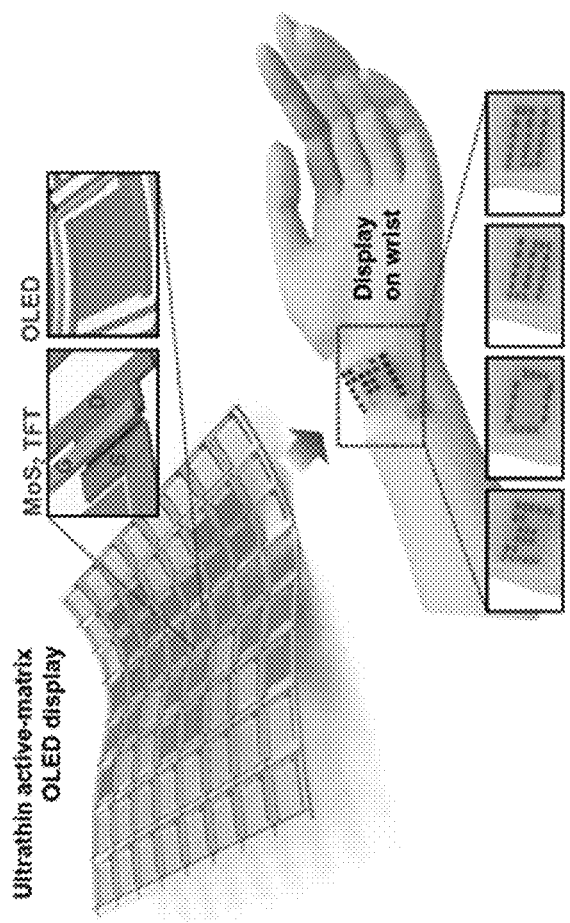
FIG. 3B illustrates an optical image of an active matrix organic light-emitting diode display device formed on a flexible substrate and an image when an wearable display to which an active matrix organic light-emitting diode display device is applied is attached to a wrist.
Figure 3B:
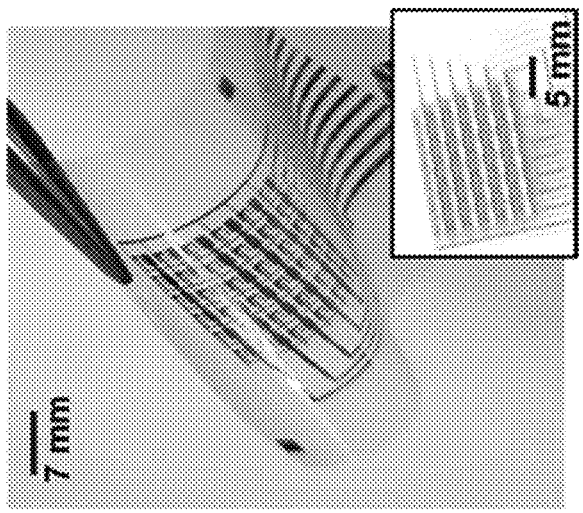

FIG. 3A illustrates a three-dimensional structure of a molybdenum disulfide based backplane formed by a manufacturing method of a transition metal chalcogenide based backplane according to an embodiment of the present disclosure, and FIG. 3B illustrates an optical image of an active matrix organic light-emitting diode display device formed on a flexible substrate and an image when an wearable display to which an active matrix organic light-emitting diode display device is applied is attached to a wrist.

Referring to FIG. 3A, it was understood that the molybdenum disulfide based backplane had a top gate structure in which a channel layer formed of molybdenum disulfide was interposed between the Al$_2$O$_3$ layers and the source electrode and the drain electrode were located below the channel layer.

In the molybdenum disulfide based backplane, as the channel layer formed of molybdenum disulfide was interposed between the Al$_2$O$_3$ layers having a high permittivity, the channel layer was doped by the doping by the Al$_2$O$_3$ layer thereabove and the contact area of the source/drain electrodes with the channel layer was also doped with electrons.

Accordingly, the electron mobility can be improved, and the channel resistance and the contact resistance can be simultaneously lowered.

Referring to FIG. 3B, it can be understood that the molybdenum disulfide based backplane with a reduced contact resistance and an improved electron mobility is applicable to an active matrix organic light-emitting diode display device which requires a large amount of current.

The low bending stiffness of the active matrix organic light-emitting diode display device formed on a flexible substrate can provide super flexibility and can be easily operated even when it is bent or attached to a human wrist so that the active matrix organic light-emitting diode display device including the molybdenum disulfide based backplane may also be applied to a wearable display.

FIGS. 4A to 4F illustrate a Raman spectrum and a photoluminescence spectrum of a channel layer in accordance with a position of an Al$_2$O$_3$ layer in a molybdenum disulfide based backplane formed by a manufacturing method of a transition metal chalcogenide based backplane according to an embodiment of the present disclosure.

A black line indicates a Raman spectrum and a photoluminescence (PL) spectrum of a channel layer before depositing the Al$_2$O$_3$ layer and a dashed line indicates a Raman spectrum and a photoluminescence (PL) spectrum of a channel layer after depositing the Al$_2$O$_3$ layer.

Figure 4A:
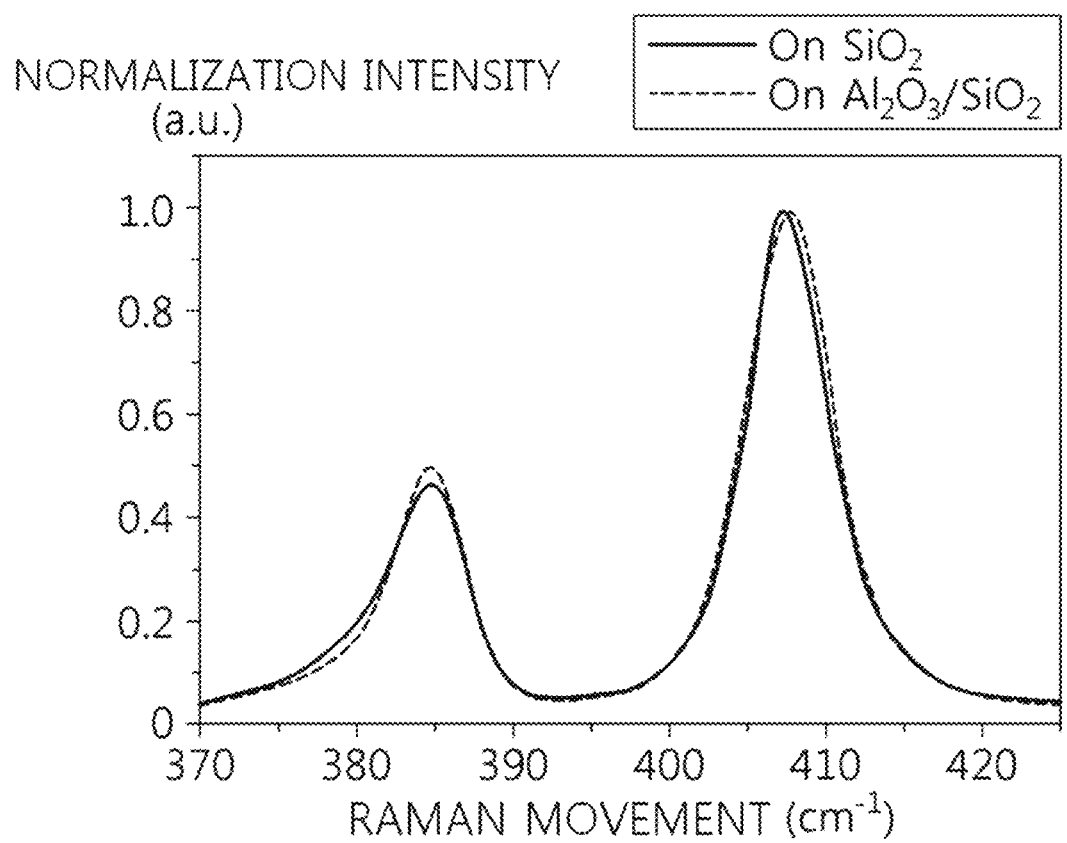
FIGS. 4A to 4F illustrate a Raman spectrum and a photoluminescence spectrum of a channel layer in accordance with a position of an $Al_2O_3$ layer in a molybdenum disulfide based backplane formed by a manufacturing method of a transition metal chalcogenide based backplane according to an embodiment of the present disclosure.
Figure 4B:
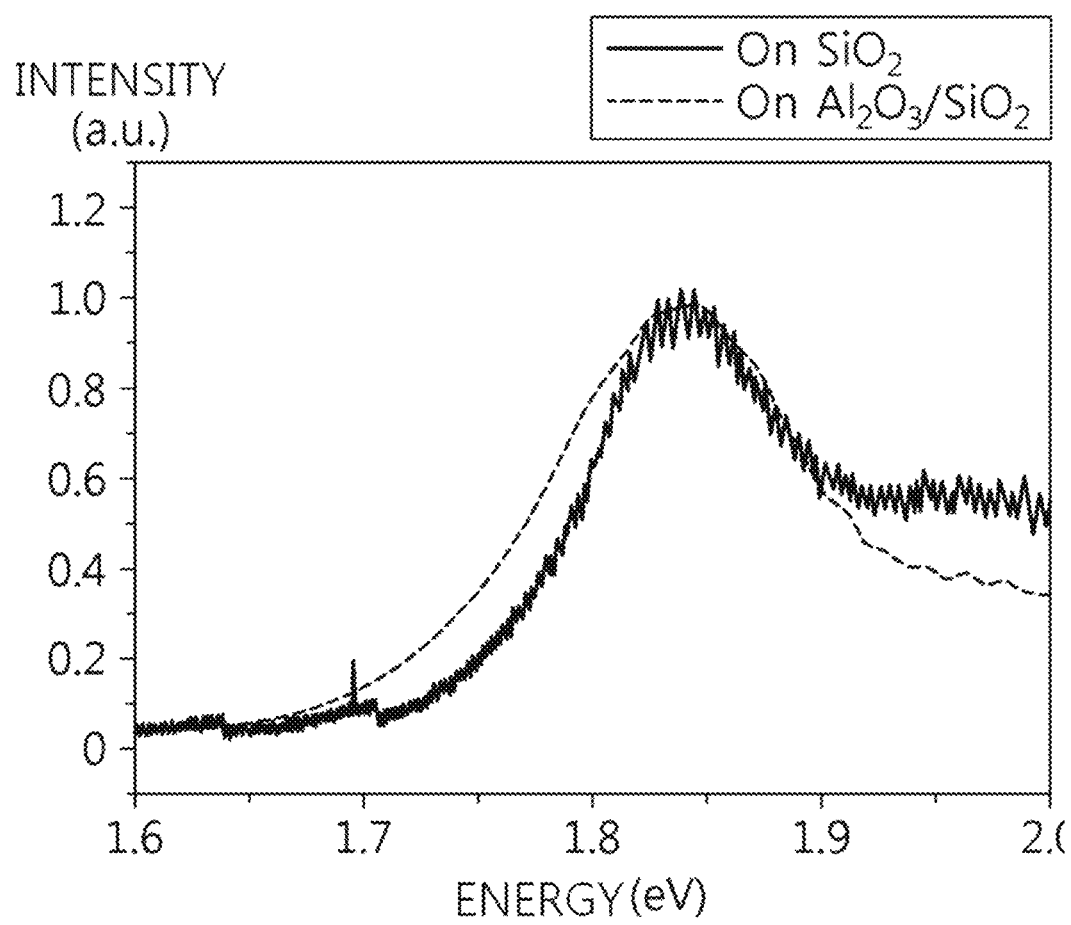

Referring to FIGS. 4A and 4B, it is understood that when the Al$_2$O$_3$ layer is formed below the channel layer, the A$_{1g}$ peak and the photoluminescence peak do not move. Therefore, it is understood that the lower $Al_2O_3$ layer does not dope the channel layer.

Figure 4C:
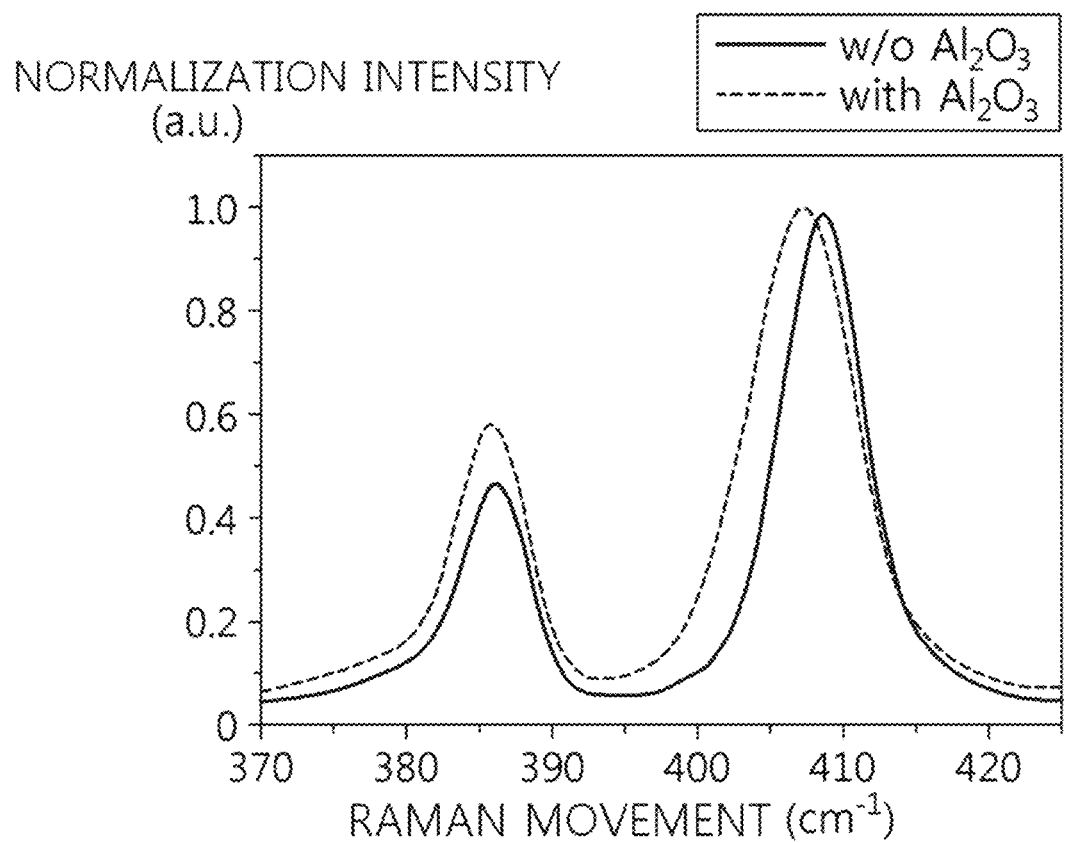
Figure 4D:
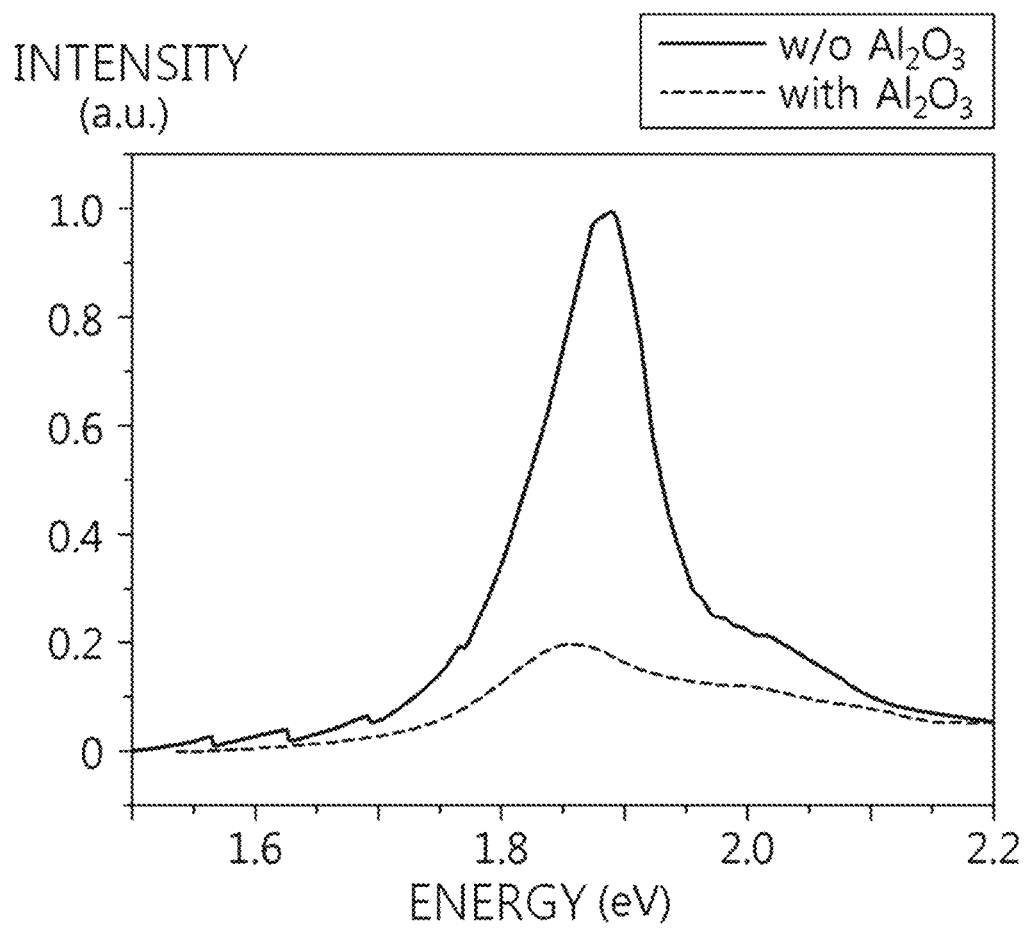

Referring to FIGS. 4C and 4D, it is understood that when the $Al_2O_3$ layer is formed above the channel layer, the $A_{1g}$ peak and the photoluminescence peak are red-shifted and the upper $Al_2O_3$ layer dopes the channel layer.

Figure 4E:
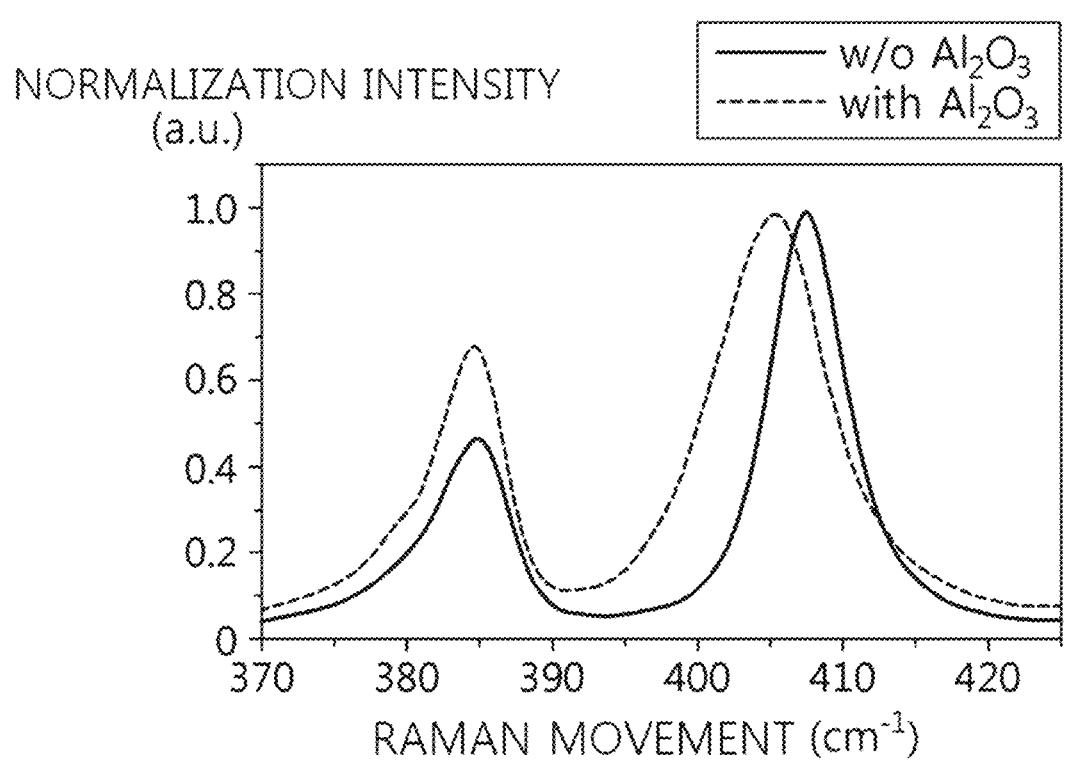
Figure 4F:
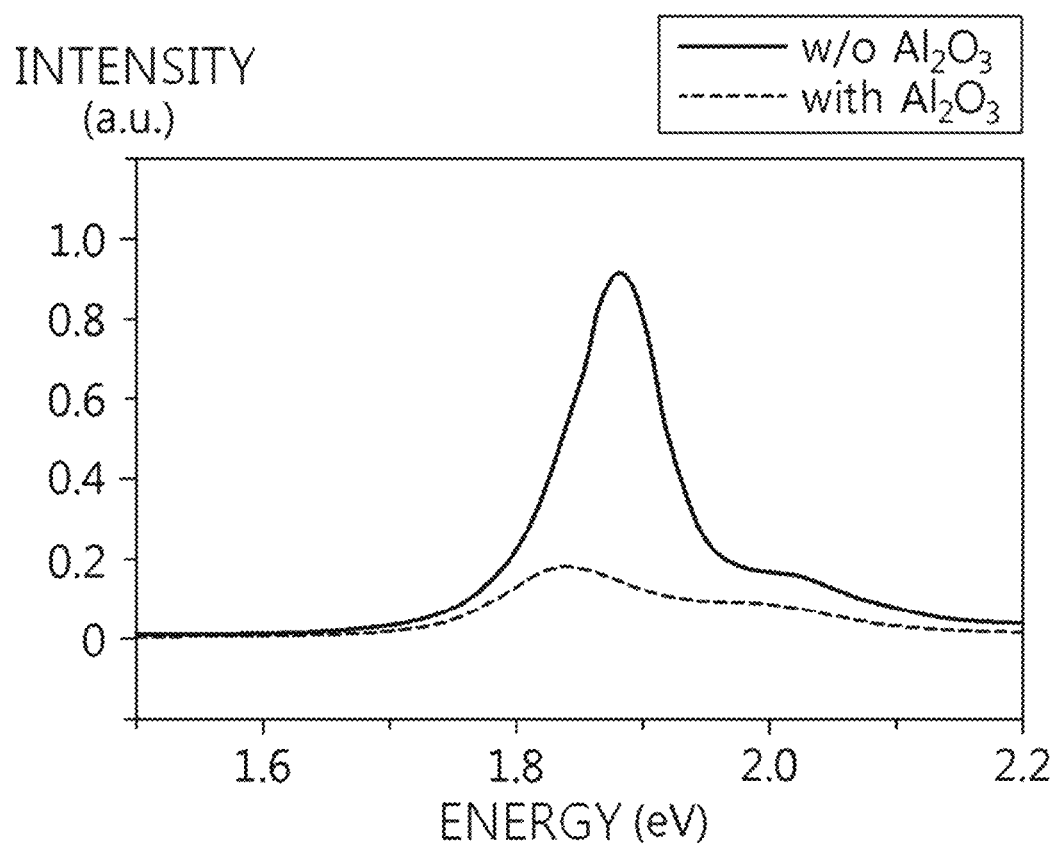

Referring to FIGS. 4E and 4F, it is understood that when the $Al_2O_3$ layers are formed above and below the channel layer, the $A_{1g}$ peak and the photoluminescence peak are further red-shifted as compared with the case that the $Al_2O_3$ layer is formed only below the channel layer and the structure in which the channel layer is interposed between alumina layers may effectively dope the channel layer.

The upper $Al_2O_3$ layer dopes the channel layer by the structure in which the channel layer is interposed between $Al_2O_3$ layers and the lower $Al_2O_3$ layer provides a smooth surface of the substrate without affecting the doping of the channel layer.

Figure 5A:
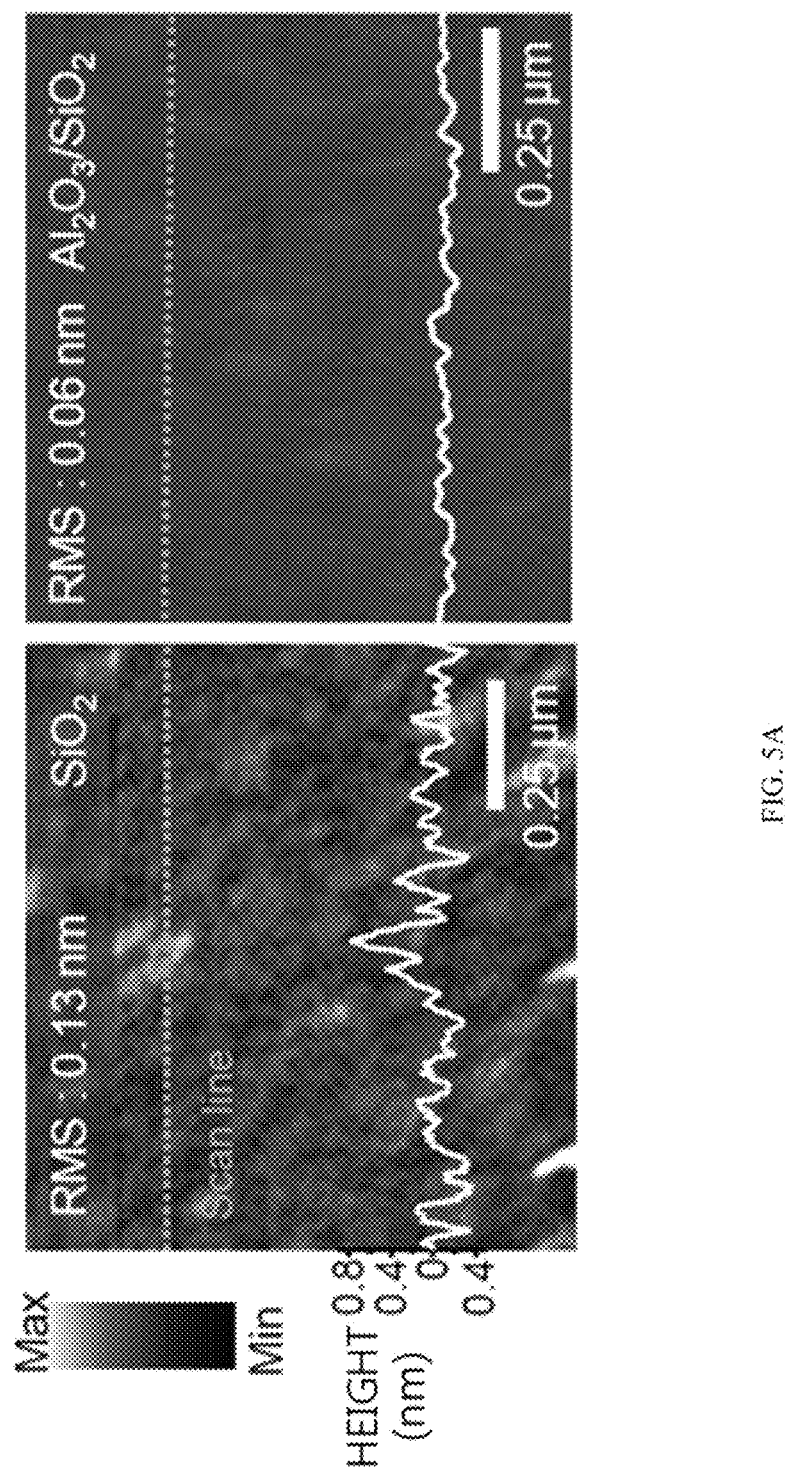
FIG. 5A illustrates an atomic force microscope of an $SiO_2$ substrate and an $SiO_2$ substrate on which an $Al_2O_3$ layer is deposited, in a molybdenum disulfide based backplane formed by a manufacturing method of a transition metal chalcogenide based backplane according to an embodiment of the present disclosure.
Figure 5B:
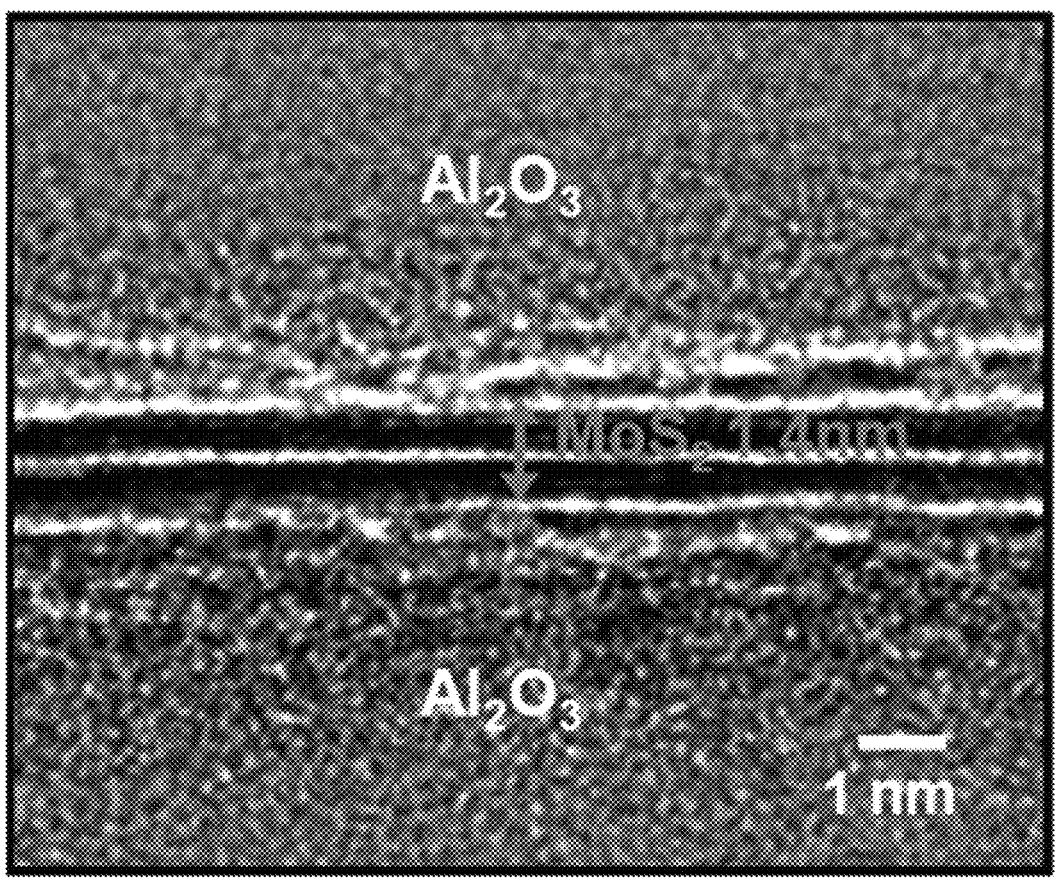
FIG. 5B illustrates a cross-sectional transmission electron microscopy image of a structure in which a channel layer is interposed between $Al_2O_3$ layers.

FIG. 5A illustrates an atomic force microscope of an $SiO_2$ substrate and an $SiO_2$ substrate on which an $Al_2O_3$ layer is deposited, in a molybdenum disulfide based backplane formed by a manufacturing method of a transition metal chalcogenide based backplane according to an embodiment of the present disclosure and FIG. 5B illustrates a cross-sectional transmission electron microscopy image of a structure in which a channel layer is interposed between $Al_2O_3$ layers.

Referring to FIG. 5A, it is understood that when the $SiO_2$ substrate is compared with an $SiO_2$ substrate on which the $Al_2O_3$ layer is deposited, a root mean square (RMS) value is reduced from 0.13 nm to 0.06 nm.

Referring to FIG. 5B, in the structure in which the channel layer is interposed between the $Al_2O_3$ layers, it is understood that uniform bonding and a clean interface without having a gap above and below the channel layer were observed.

As described above, the $Al_2O_3$ layer is deposited on the $SiO_2$ substrate so that a low surface roughness is provided and a flat surface without having a pin hole is provided. Therefore, a smooth interface for the channel layer may be formed.

Figure 6:
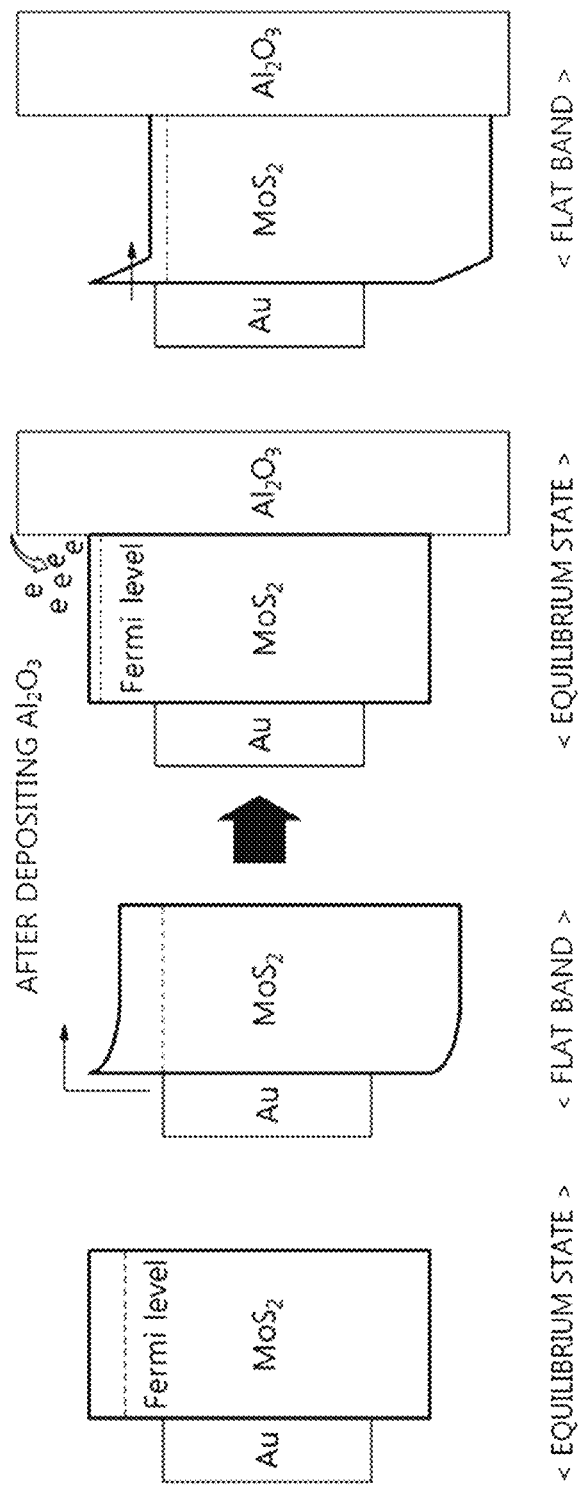
FIG. 6 illustrates that a channel area and a contact resistance are reduced by an $Al_2O_3$ layer in a molybdenum disulfide based backplane formed by a manufacturing method of a transition metal chalcogenide based backplane according to an embodiment of the present disclosure.

FIG. 6 illustrates that a channel area and a contact resistance are reduced by an $Al_2O_3$ layer in a molybdenum disulfide based backplane formed by a manufacturing method of a transition metal chalcogenide based backplane according to an embodiment of the present disclosure.

Referring to FIG. 6, the $Al_2O_3$ layer located in an upper portion of the molybdenum disulfide based backplane is used to dope the channel layer in the channel region and the contact region of the molybdenum disulfide based backplane.

The contact region of the channel layer and the source/drain electrode generates a Schottky barrier by a difference in a work function and thus the contact resistance is high.

However, a tunnel current is generated by a barrier which becomes thinner due to electronic doping by depositing the $Al_2O_3$ layer above the channel layer and the contact resistance becomes lower. Further, the resistance in the channel region may also be lowered by the electronic doping.

Figure 7A:
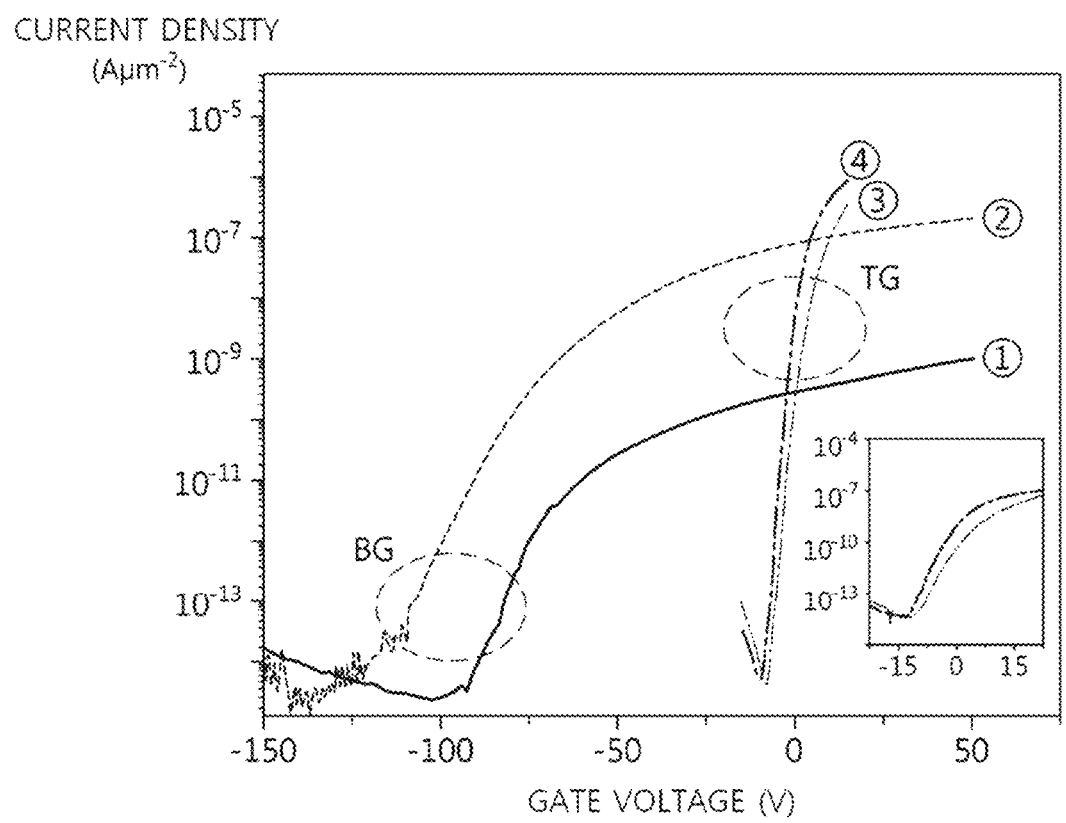
FIG. 7A is a graph illustrating a switching characteristic of a molybdenum disulfide based backplane formed by a manufacturing method of a transition metal chalcogenide based backplane according to an embodiment of the present disclosure and a molybdenum disulfide based backplane having various structures.
Figure 7B:
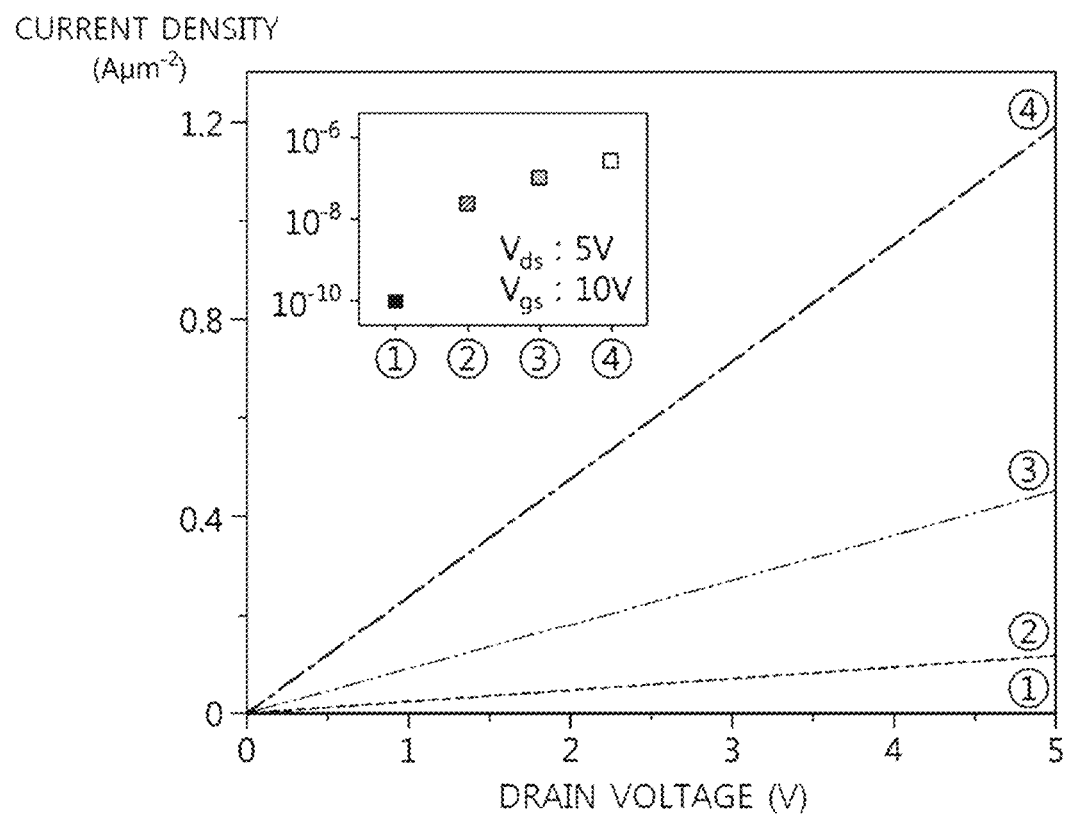
FIG. 7B is a graph illustrating an output characteristic.
Figure 7C:
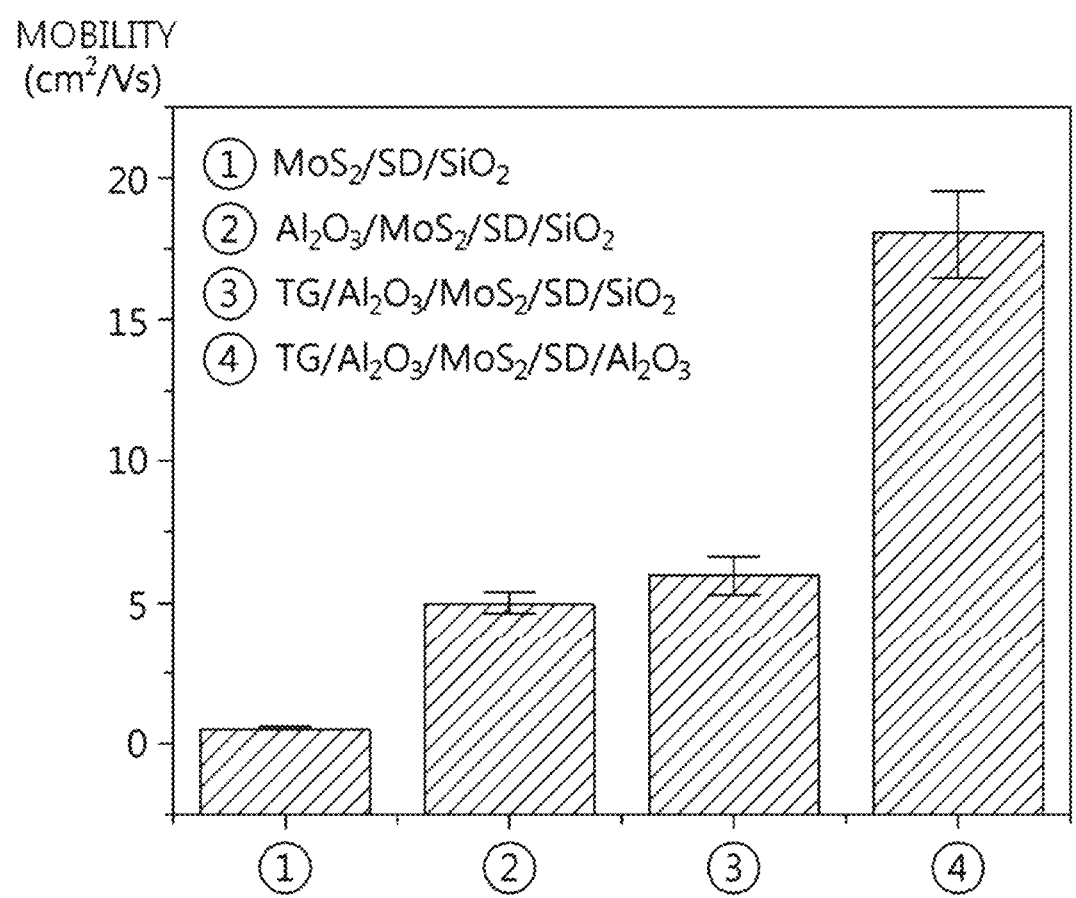
FIG. 7C is a graph illustrating a mobility.

FIG. 7A is a graph illustrating a switching characteristic of a molybdenum disulfide based backplane formed by a manufacturing method of a transition metal chalcogenide based backplane according to an embodiment of the present disclosure and a molybdenum disulfide based backplane having various structures, FIG. 7B is a graph illustrating an output characteristic, and FIG. 7C is a graph illustrating a mobility.

More specifically, transfer characteristics of (1) a molybdenum disulfide based backplane with a back gate structure in which the $Al_2O_3$ layer is not deposited, (2) a molybdenum disulfide based backplane with a back gate structure in which a channel layer is interposed between the $Al_2O_3$ layers, (3) a molybdenum disulfide based backplane with a top gate structure in which the $Al_2O_3$ layer is not deposited, and (4) a molybdenum disulfide based backplane with a top gate structure in which a channel layer is interposed between the $Al_2O_3$ layers are illustrated and in all cases, the channel layer is located on the source/drain electrodes.

Referring to FIG. 7A, it is understood that the switching characteristics of the molybdenum disulfide based backplanes (3) and (4) with a top gate structure were improved as compared with the switching characteristics of the molybdenum disulfide based backplanes (1) and (2) with a back gate structure.

Further, it is understood that the molybdenum disulfide based backplane (4) with a top gate structure in which a channel layer is interposed between the $Al_2O_3$ layers has the highest switching characteristic.

Therefore, when the molybdenum disulfide based backplane with a top gate structure in which a channel layer is interposed between the $Al_2O_3$ layers is applied to the active matrix organic light-emitting diode display, the leakage current is reduced and a noise caused thereby may be minimized.

Referring to FIGS. 7B and 7C, it is understood that the molybdenum disulfide based backplane (4) with a top gate structure in which a channel layer is interposed between the $Al_2O_3$ layers shows a high output characteristic of approximately 1.2 mA and a mobility of approximately 18 $cm^2 \cdot V^{-1} \cdot s^{-1}$.

Figure 8:
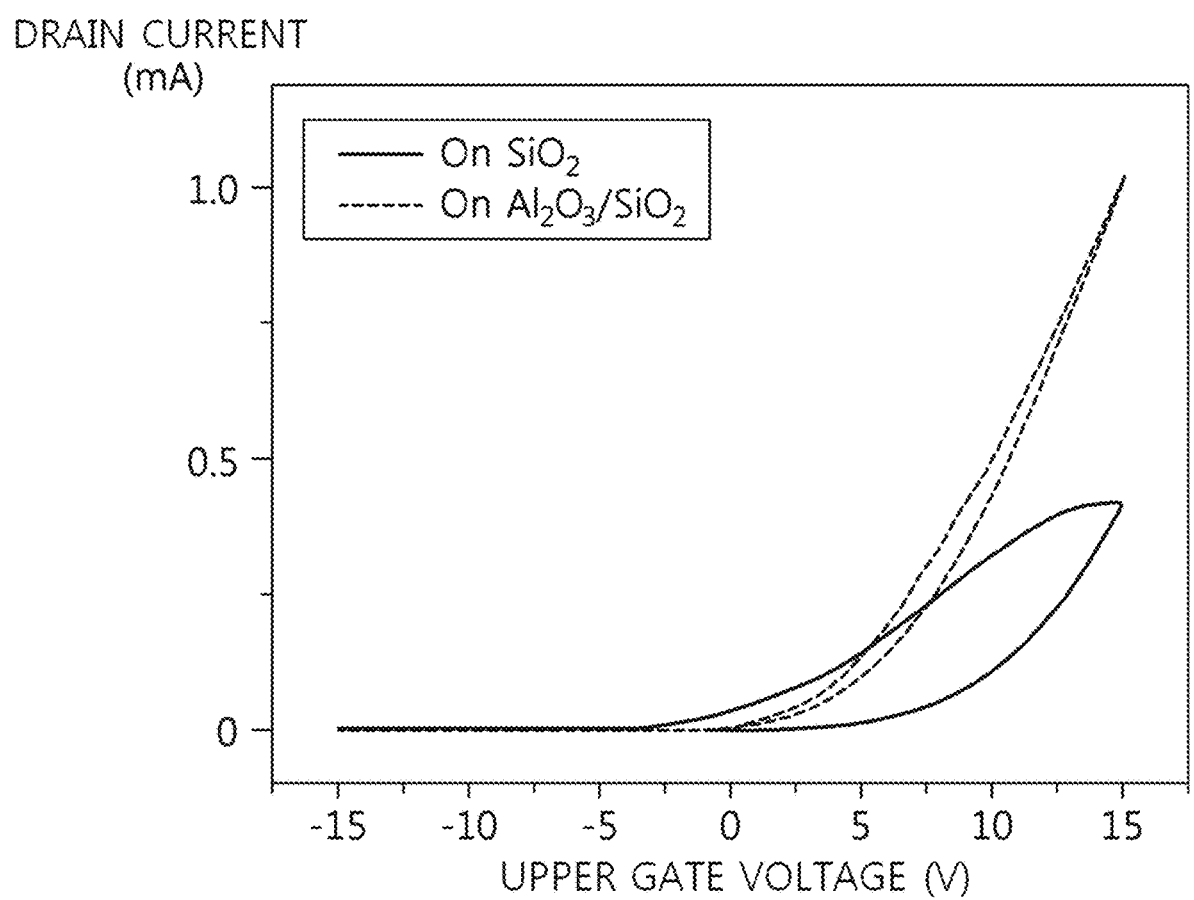
FIG. 8 is a graph illustrating a hysteresis curve of a molybdenum disulfide based backplane formed by a manufacturing method of a transition metal chalcogenide based backplane according to an embodiment of the present disclosure and a molybdenum disulfide based backplane on which an $Al_2O_3$ layer is not deposited.

FIG. 8 is a graph illustrating a hysteresis curve of a molybdenum disulfide based backplane formed by a manufacturing method of a transition metal chalcogenide based backplane according to an embodiment of the present disclosure and a molybdenum disulfide based backplane on which an $Al_2O_3$ layer is not deposited.

Referring to FIG. 8, it is understood that a molybdenum disulfide based backplane (a dashed line) with a top gate structure in which a channel layer is interposed between the $Al_2O_3$ layers shows a relatively low hysteresis voltage than a molybdenum disulfide based backplane (a solid line) with a top gate structure on which an $Al_2O_3$ layer is not deposited.

Generally, the hysteresis is caused by the roughness of the substrate or charges trapped between the channel and the substrate interface. Therefore, the molybdenum disulfide based backplane with a top gate structure in which a channel layer is interposed between the $Al_2O_3$ layers forms a clean interface so that it shows a relatively low hysteresis voltage.

Figure 9A:
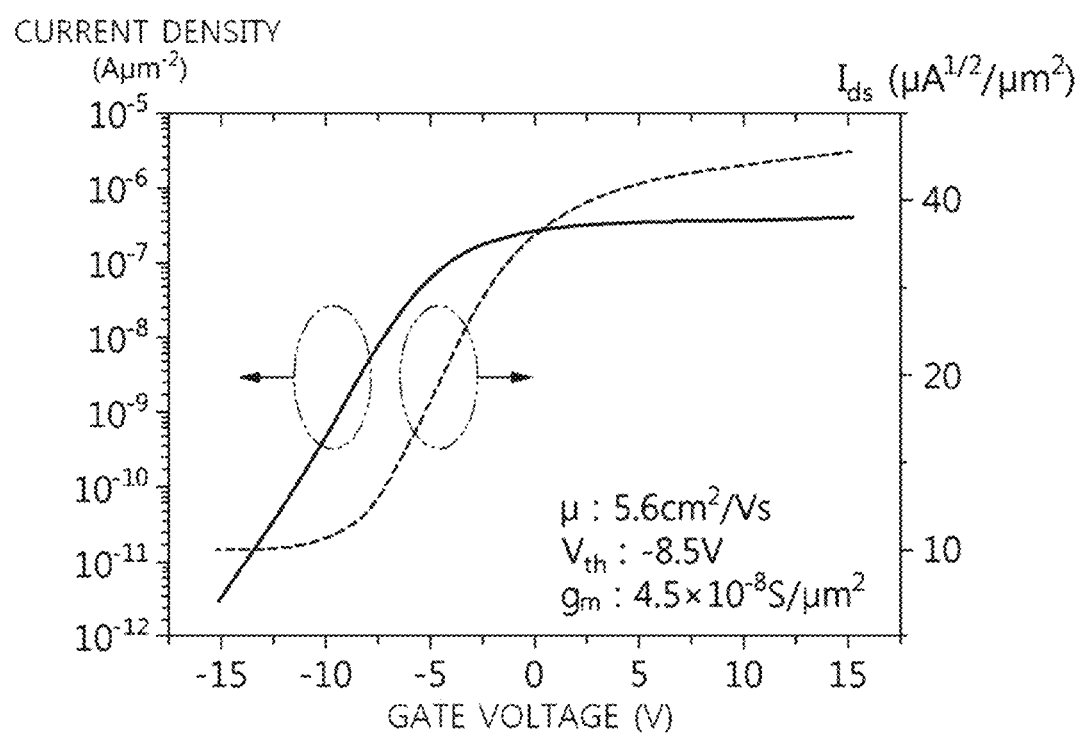
FIG. 9A is a view illustrating an electrical characteristic of a single crystal molybdenum disulfide based backplane on which an $Al_2O_3$ layer is not deposited.
Figure 9B:
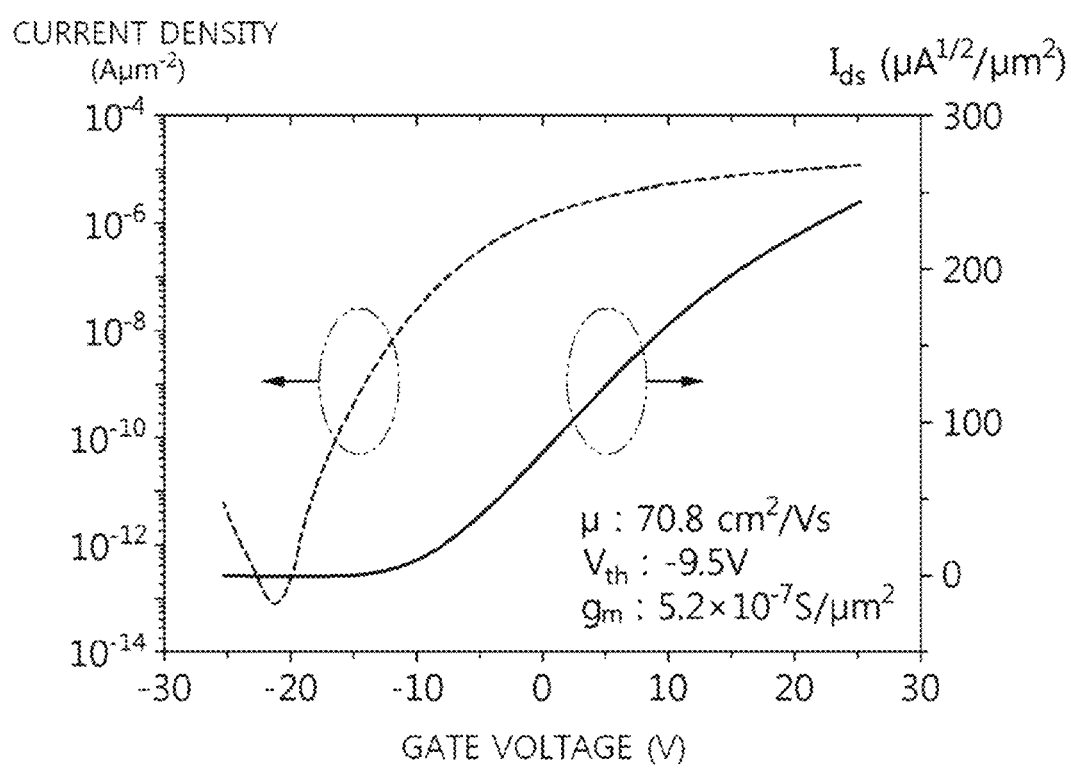
FIG. 9B is a view illustrating an electrical characteristic of a single crystal molybdenum disulfide based backplane on which a channel layer is interposed between $Al_2O_3$ layers.

FIG. 9A is a view illustrating an electrical characteristic of a single crystal molybdenum disulfide based backplane on which an $Al_2O_3$ layer is not deposited; and FIG. 9B is a view illustrating an electrical characteristic of a single crystal molybdenum disulfide based backplane on which a channel layer is interposed between $Al_2O_3$ layers.

Referring to FIG. 9A, it is understood that the single crystal molybdenum disulfide based backplane on which an $Al_2O_3$ layer is not deposited has an electron mobility of 5.6 $cm^{21}Vs$, a threshold voltage of −8.5 V, and a transconductance of $4.5 \times 10^{-8}$ $S/\mu m^2$.

Referring to FIG. 9B, it is understood that the single crystal molybdenum disulfide based backplane on which the channel layer is interposed between the $Al_2O_3$ layers has an electron mobility of 70.8 $cm^{21}Vs$, a threshold voltage of −9.5 V, and a transconductance of $5.2 \times 10^{-7}$ $S/\mu m^2$.

Referring to FIGS. 9A and 9B, similarly to the double-layered molybdenum disulfide based backplane, it is understood that in the single layer molybdenum disulfide based backplane, the electrical characteristic of the molybdenum disulfide based backplane in which the channel layer is interposed between the $Al_2O_3$ layers is improved.

Figure 10A:
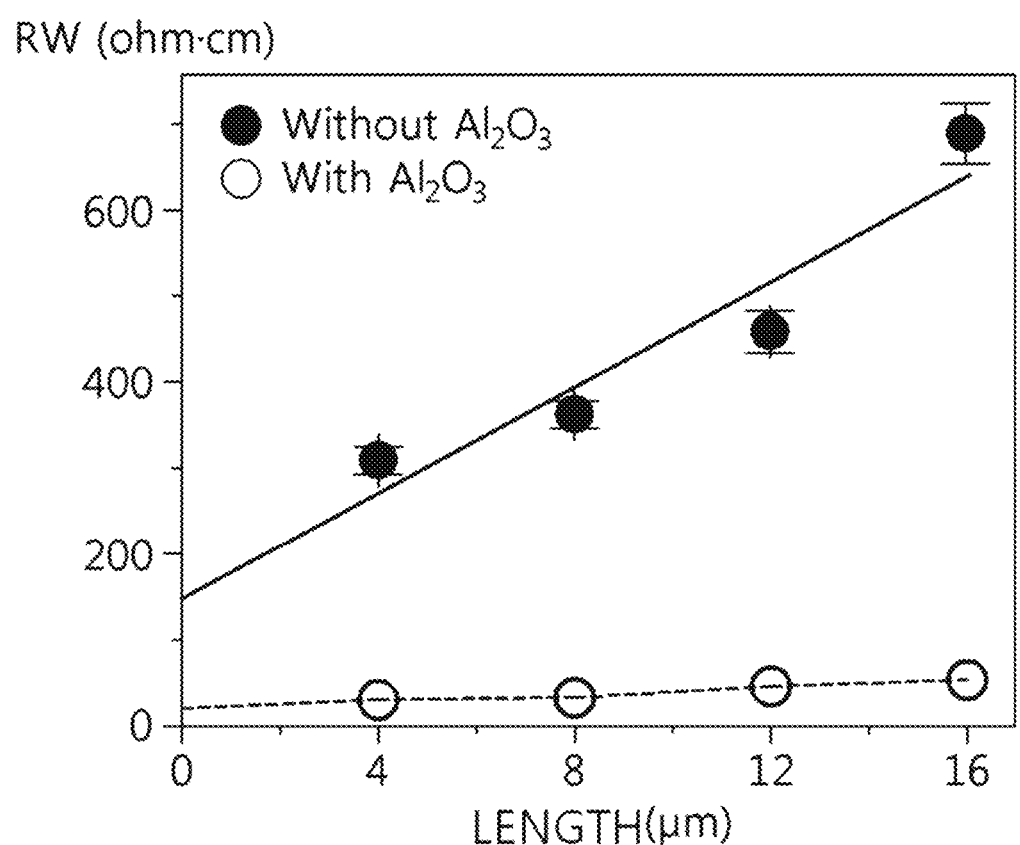
FIGS. 10A to 10C are graphs illustrating a result of analyzing a contact resistance and a channel resistance of a molybdenum disulfide based backplane formed by a manufacturing method of a transition metal chalcogenide based backplane according to an embodiment of the present disclosure in accordance with a transfer length method (TLM).
Figure 10B:
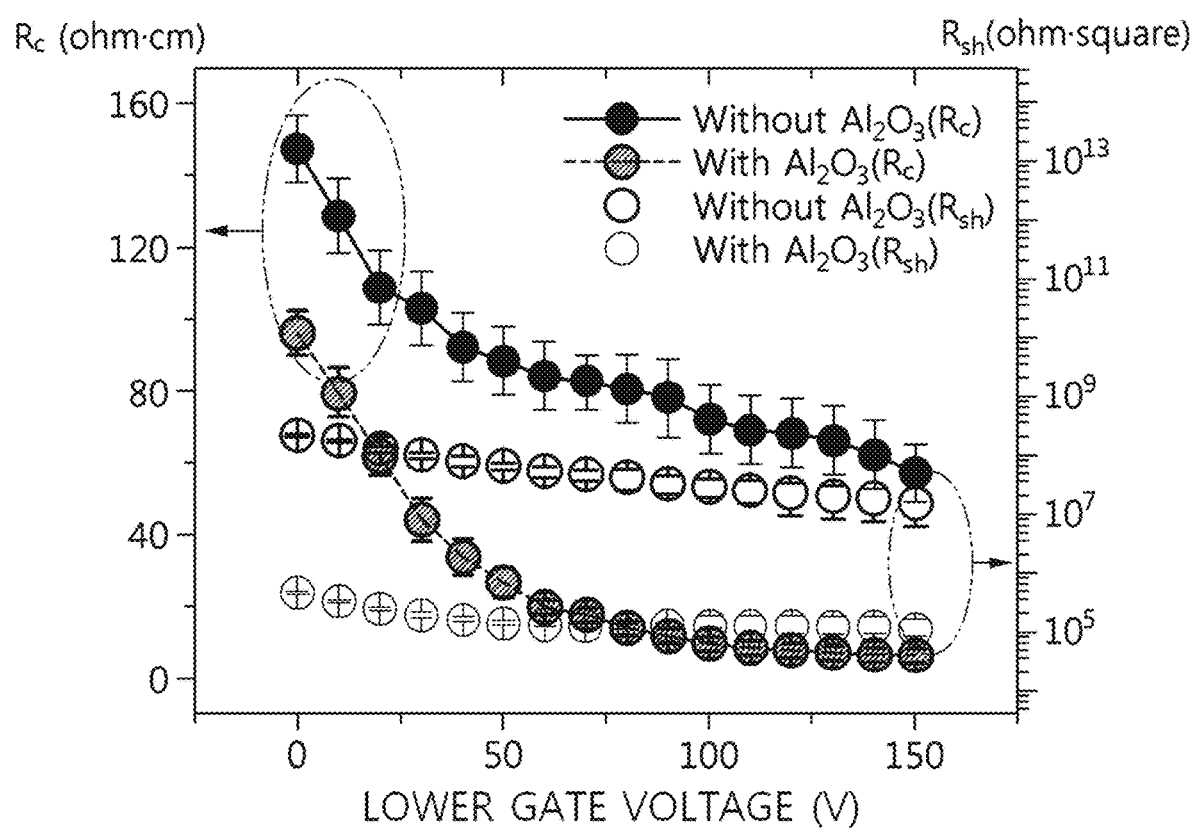
Figure 10C:
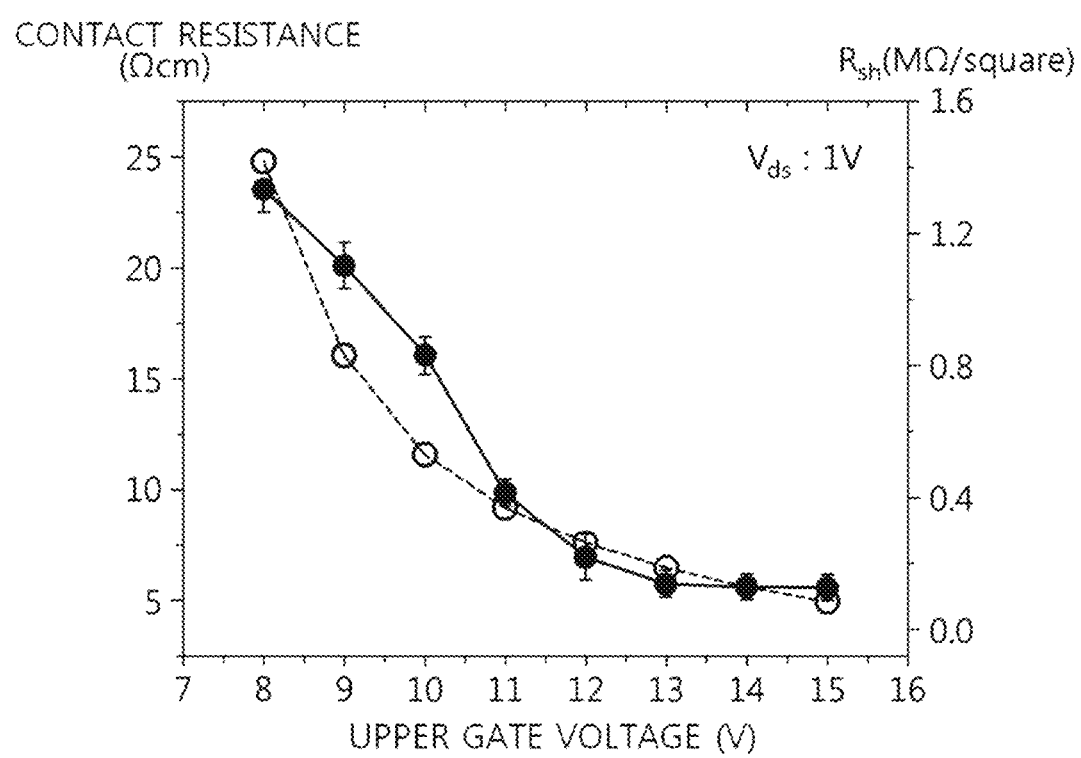

FIGS. 10A to 10C are graphs illustrating a result of analyzing a contact resistance and a channel resistance of a molybdenum disulfide based backplane formed by a manufacturing method of a transition metal chalcogenide based backplane according to an embodiment of the present disclosure in accordance with a transfer length method (TLM).

The contact resistance $R_c$ and the channel resistance $R_{sh}$ which are important elements affecting the mobility of the molybdenum disulfide based backplane were estimated from the contact region of the source/drain electrodes and the channel layer and the channel layer between the source/drain metal electrodes.

Referring to FIG. 10A, it is understood that the molybdenum disulfide based backplane in which the $Al_2O_3$ layer is not deposited has a high contact resistance of 56.7±9.1 ohm·cm at a bottom gate voltage of 150 V but the molybdenum disulfide based backplane in which the channel layer is interposed between the $Al_2O_3$ layers has a low contact resistance of 5.9±0.7 ohm·cm which is reduced by approximately 10 times.

The contact region of the channel layer and the source/drain electrode causes a Schottky barrier by a difference in a work function and thus the contact resistance is high. However, a tunnel current is generated by a barrier which becomes thinner due to the electronic doping by depositing the $Al_2O_3$ layer above the channel layer and the contact resistance becomes lower.

Referring to FIG. 10B, it is understood that the molybdenum disulfide based backplane in which the $Al_2O_3$ layer is not deposited has a channel resistance of 15.9±10 MΩ/cm at a bottom gate voltage of 150 V but the molybdenum disulfide based backplane in which the channel layer is interposed between the $Al_2O_3$ layers has a channel resistance of 0.1±0.02 MΩ/cm which is reduced by approximately 140 times. Referring to FIG. 10C, it is understood that the molybdenum disulfide based backplane having a top gate structure in which channel layer is interposed between the $Al_2O_3$ layers has a low contact resistance of 5.5±0.6 MΩ/cm and a low channel resistance of 66.5±9.5 kΩ/cm.

The contact resistance and the channel resistance are reduced and the electron mobility is significantly improved by the upper $Al_2O_3$ layer. Further, it is understood that the upper $Al_2O_3$ layer effectively dopes the channel layer in both the channel region and the contact region with the low contact resistance and channel resistance.

Figure 11A:
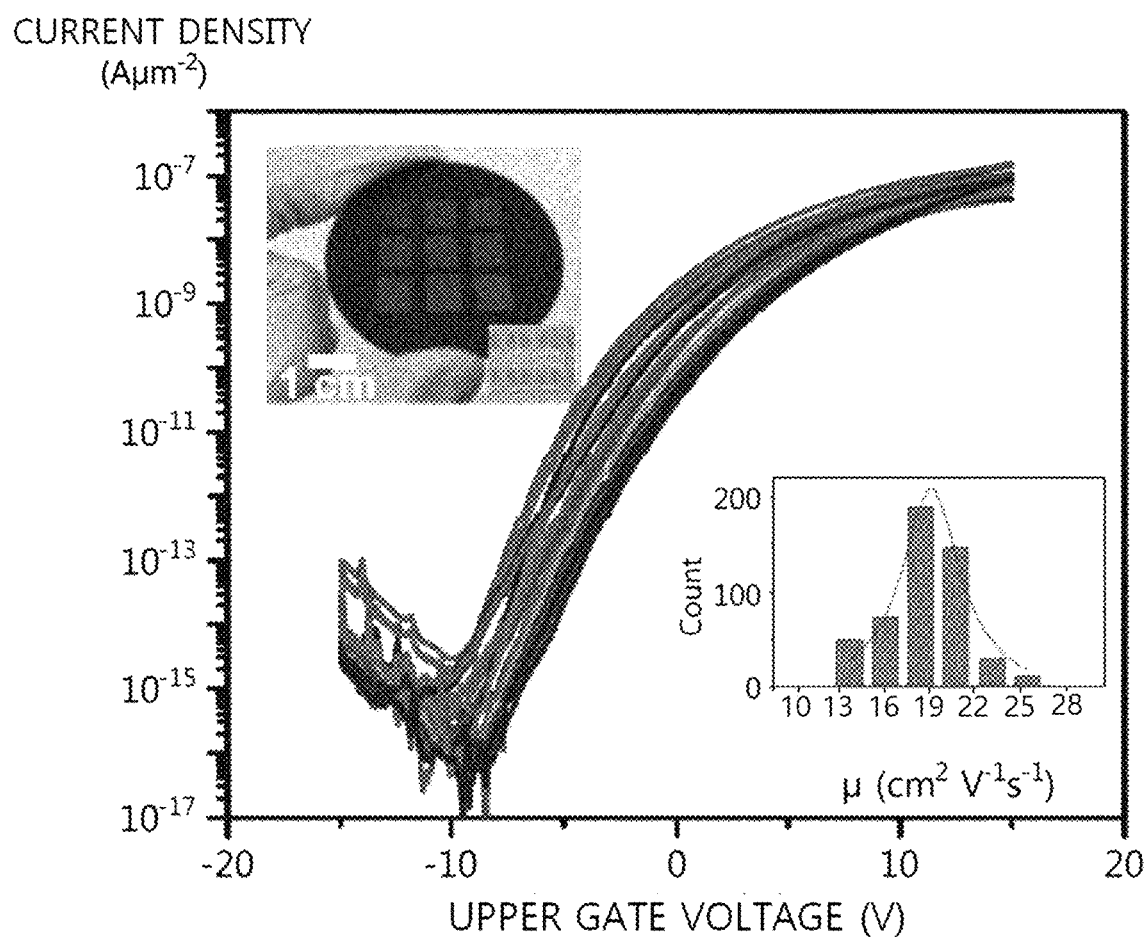
FIG. 11A is a graph illustrating an electrical characteristic of a molybdenum disulfide based backplane formed by a manufacturing method of a transition metal chalcogenide based backplane according to an embodiment of the present disclosure.
Figure 11B:
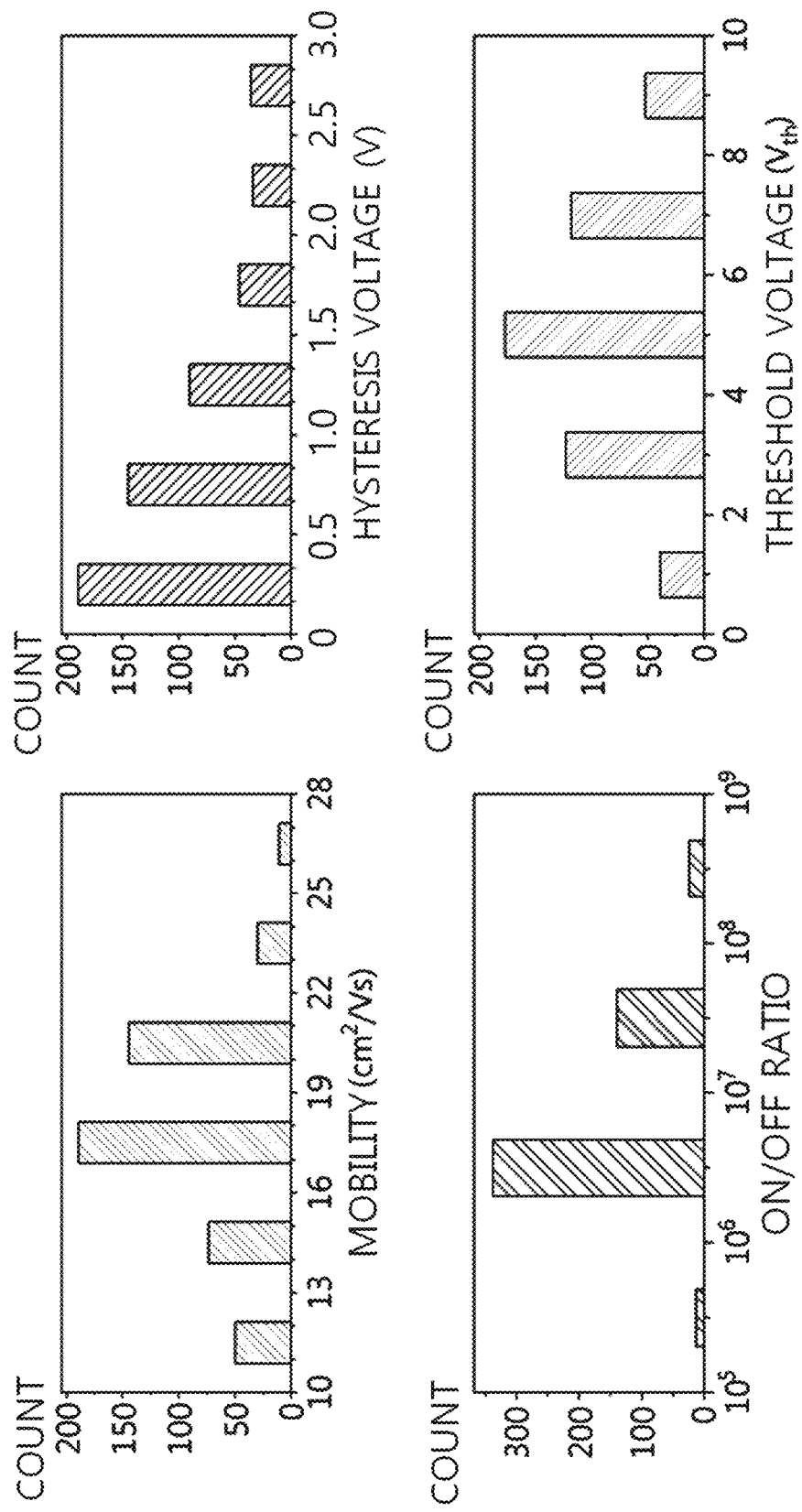
FIG. 11B illustrates a histogram.

FIG. 11A is a graph illustrating an electrical characteristic of a molybdenum disulfide based backplane formed by a manufacturing method of a transition metal chalcogenide based backplane according to an embodiment of the present disclosure and FIG. 11B illustrates a histogram.

Referring to FIG. 11A, it is understood that an average mobility for 500 molybdenum disulfide based backplanes with a top gate structure in which the channel layer is interposed between the $Al_2O_3$ layers is 18.1 $cm^2/Vs$ (a graph inserted at a lower portion).

Referring to FIG. 11B, it is understood that 500 molybdenum disulfide based backplanes with a top gate structure in which the channel layer is interposed between the $Al_2O_3$ layers have a high electron mobility of 17 $cm^2/Vs$ to 20 $cm^2/Vs$, a low hysteresis voltage of 0.75 V or lower, a high ON/OFF ratio of $10^6$ or higher, and a positive threshold voltage Vth of 5±2 V.

Specifically, the molybdenum disulfide based backplane with a top gate structure in which the channel layer is interposed between the $Al_2O_3$ layers shows a threshold voltage having a positive value, which allows to maintain an off state of a pixel without supplying an additional gate bias voltage. As a result, unnecessary power consumption at the time of operation of a selective pixel may be reduced.

Figure 12A:
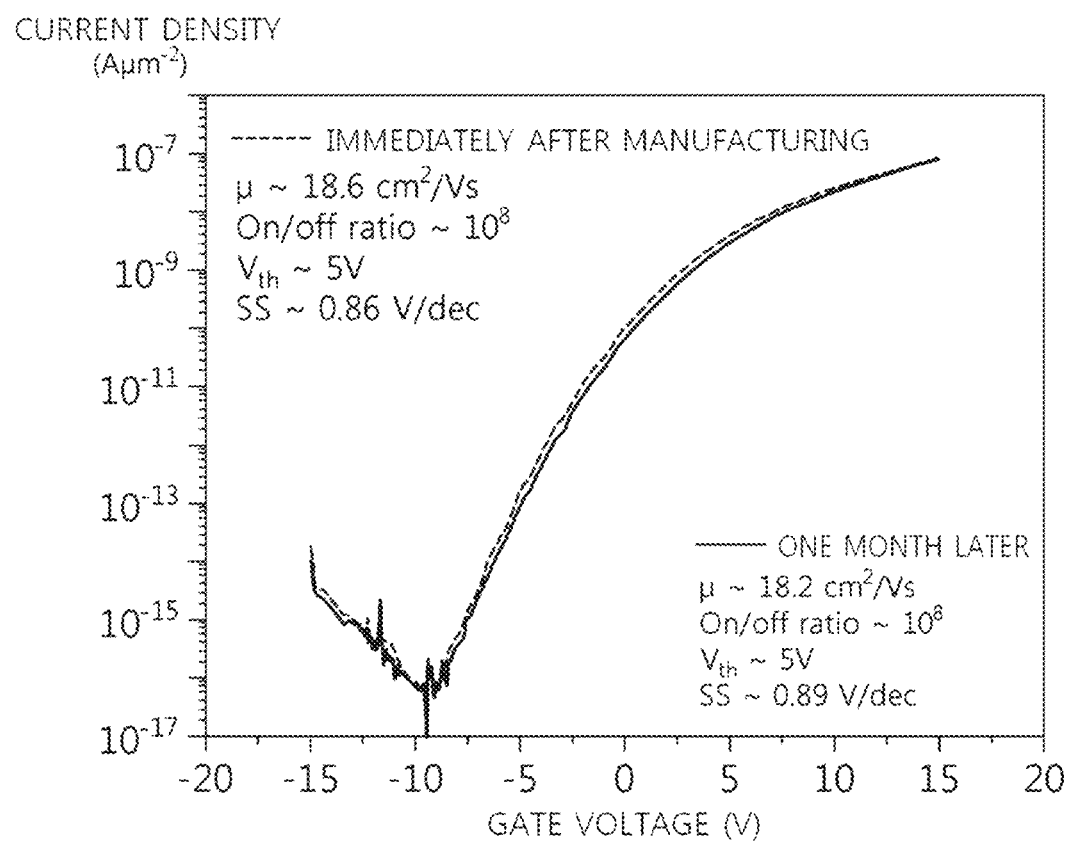
FIGS. 12A and 12B are graphs illustrating a stability of a molybdenum disulfide based backplane formed by a manufacturing method of a transition metal chalcogenide based backplane according to an embodiment of the present disclosure.
Figure 12B:
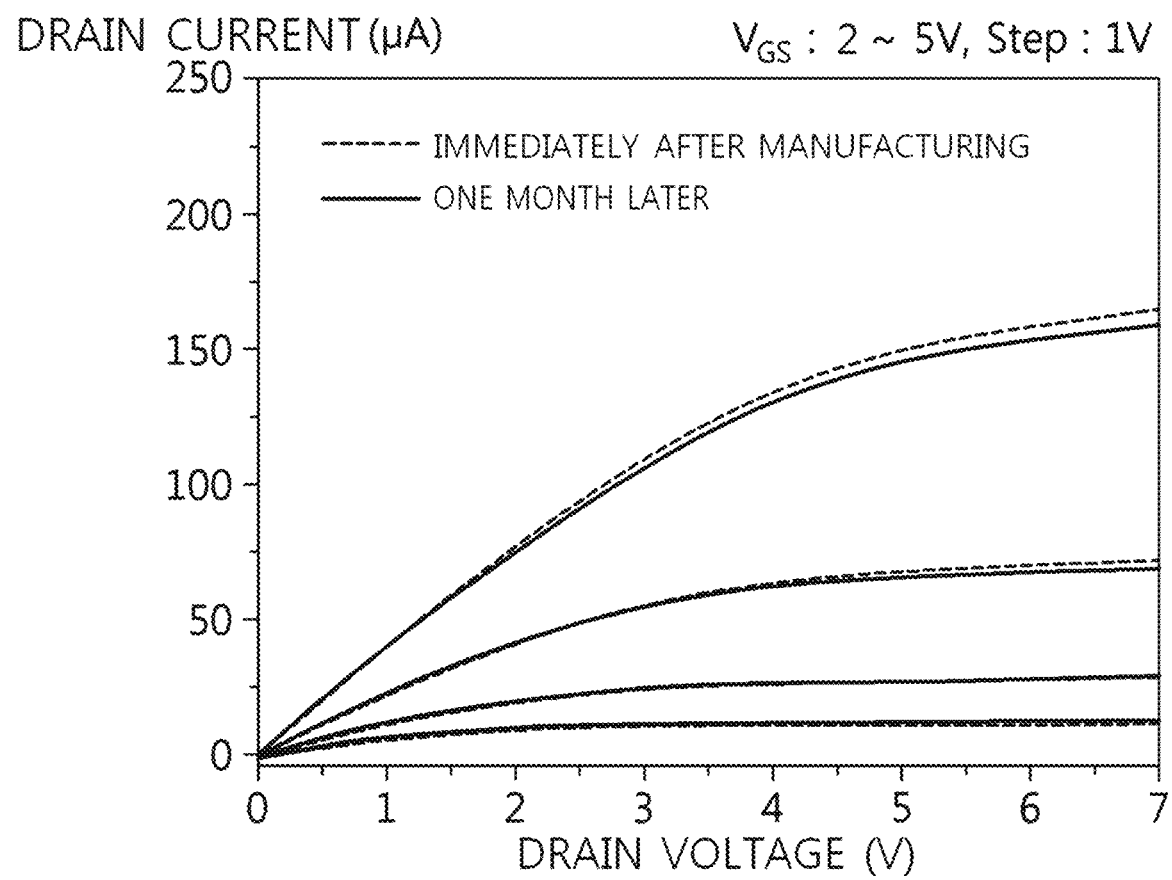

FIGS. 12A and 12B are graphs illustrating a stability of a molybdenum disulfide based backplane formed by a manufacturing method of a transition metal chalcogenide based backplane according to an embodiment of the present disclosure.

Referring to FIG. 12A, as a result (a solid line) of measuring a switching characteristic one month after manufacturing the molybdenum disulfide based backplane with a top gate structure in which the channel layer is interposed between the $Al_2O_3$ layers, it is understood that the electron mobility, the ON/OFF ratio, the threshold voltage, and a subthreshold switching value are almost unchanged.

Referring to FIG. 12B, as a result (a solid line) of measuring an output characteristic one month after manufacturing the molybdenum disulfide based backplane with a top gate structure in which the channel layer is interposed between the $Al_2O_3$ layers, similarly to the switching characteristic, it is understood that the output characteristic is almost unchanged.

Therefore, it is understood that the molybdenum disulfide based backplane with a top gate structure in which the channel layer is interposed between the $Al_2O_3$ layers has an excellent reliability and uniformity, so that it is suitable to be applied to an active matrix organic light-emitting diode display.

FIGS. 13A to 13E illustrate a performance of a single pixel of an active matrix organic light-emitting diode which is electrically connected to a molybdenum disulfide based backplane formed by a manufacturing method of a transition metal chalcogenide based backplane according to an embodiment of the present disclosure.

Figure 13A:
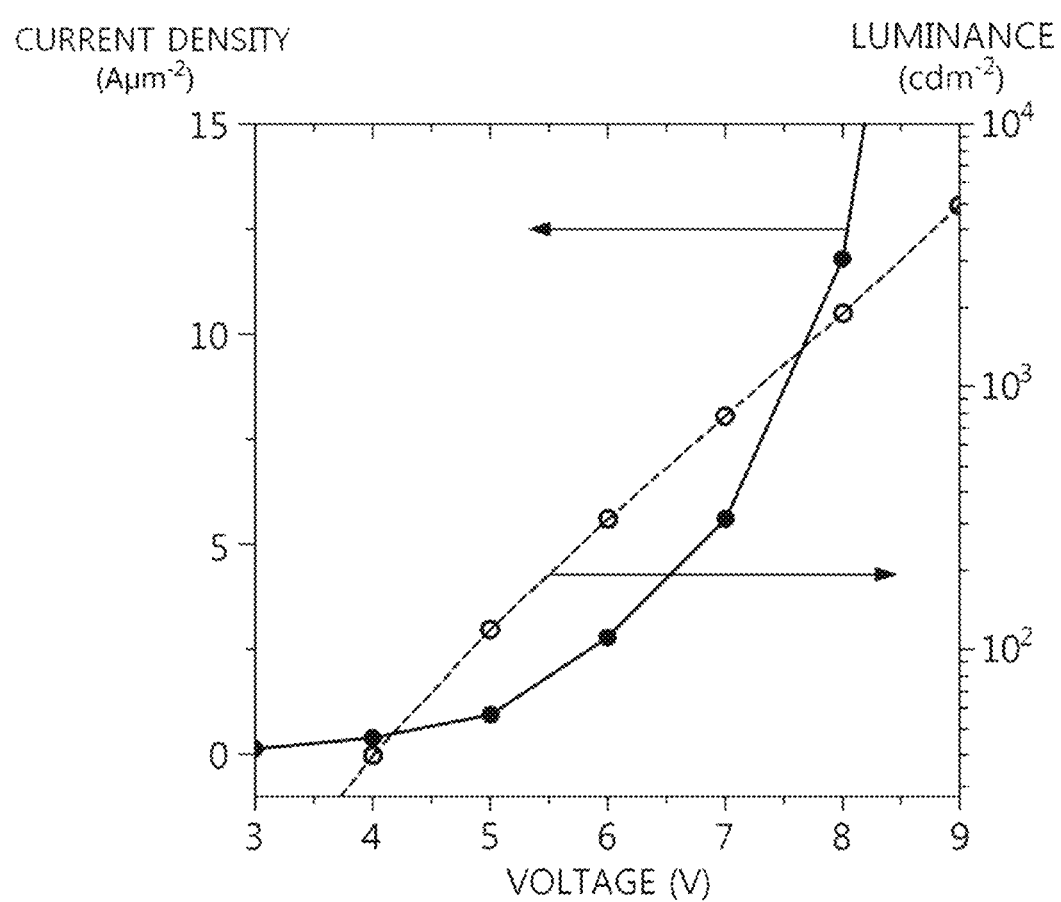
FIGS. 13A to 13E illustrate a performance of a single pixel of an active matrix organic light-emitting diode which is electrically connected to a molybdenum disulfide based backplane formed by a manufacturing method of a transition metal chalcogenide based backplane according to an embodiment of the present disclosure.

Referring to FIG. 13A, it is understood that when the luminance is 10 $cdm^{-2}$, a turn-on voltage is 4 V and the luminance is linearly increased at a voltage of 8 V or higher to reach ≥5000 $cdm^{-2}$ so that the active matrix organic light-emitting diode shows an excellent emission ratio.

Figure 13B:
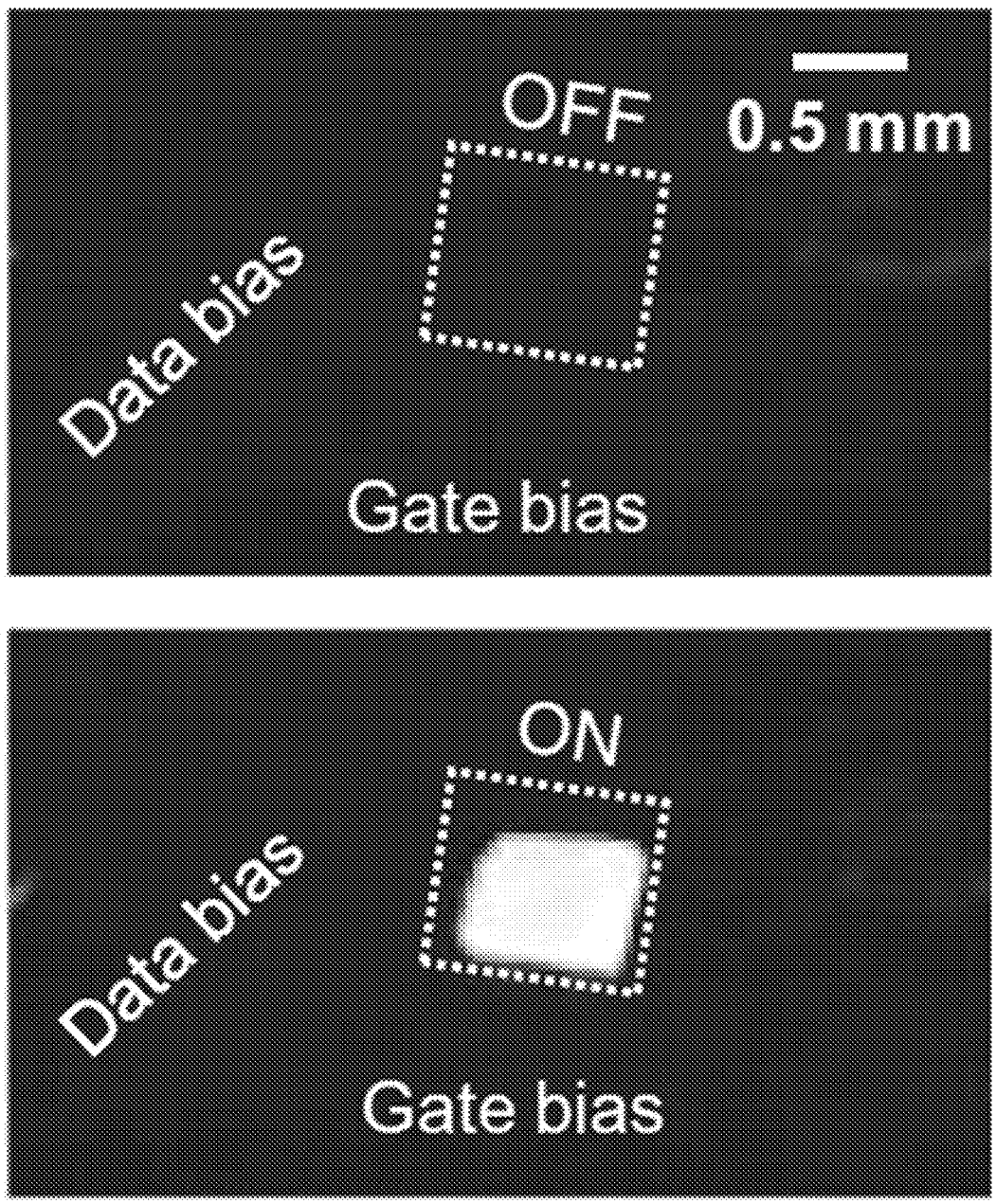

Referring to FIG. 13B, it is understood that when approximately 8 V of $V_{Gate}$ and approximately 9 V of $V_{Data}$ are applied to the gate electrode and the drain electrode, respectively, the active matrix organic light-emitting diode shows excellent photoluminescence.

Figure 13C:
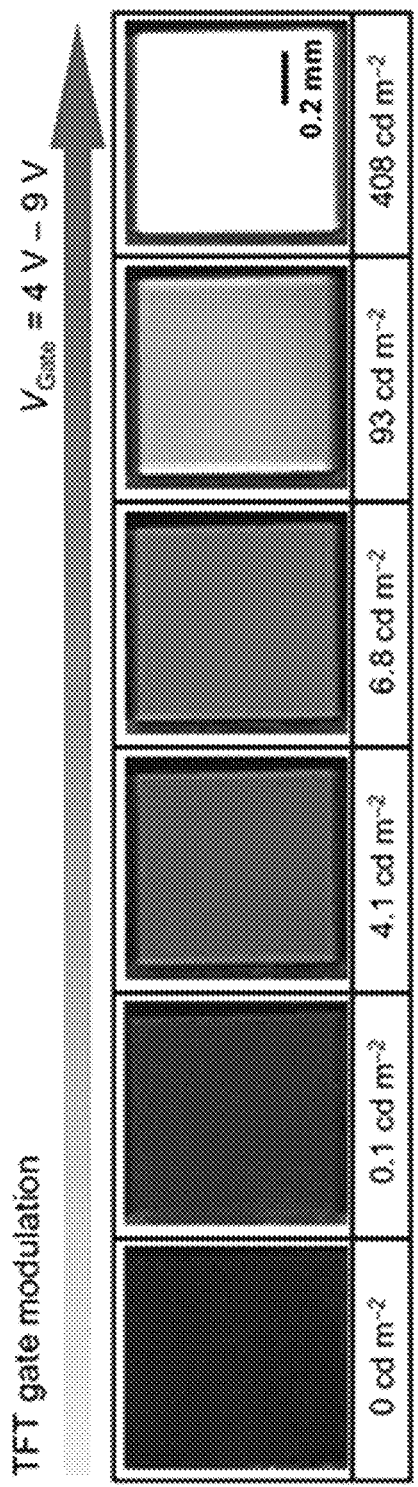

Referring to FIG. 13C, it is understood that when $V_{Gate}$ is increased from 4 V to 9 V at a constant $V_{Data}$ of approximately 9 V, the emission intensity of the active matrix organic light-emitting diode is distinguishable.

Further, it is understood that when $V_{Gate}$ is 9 V, a maximum luminescence reaches 408 $cdm^{-2}$, which is sufficiently applicable to the display device, and the molybdenum disulfide based backplane can drive the active matrix organic light-emitting diode.

Figure 13D:
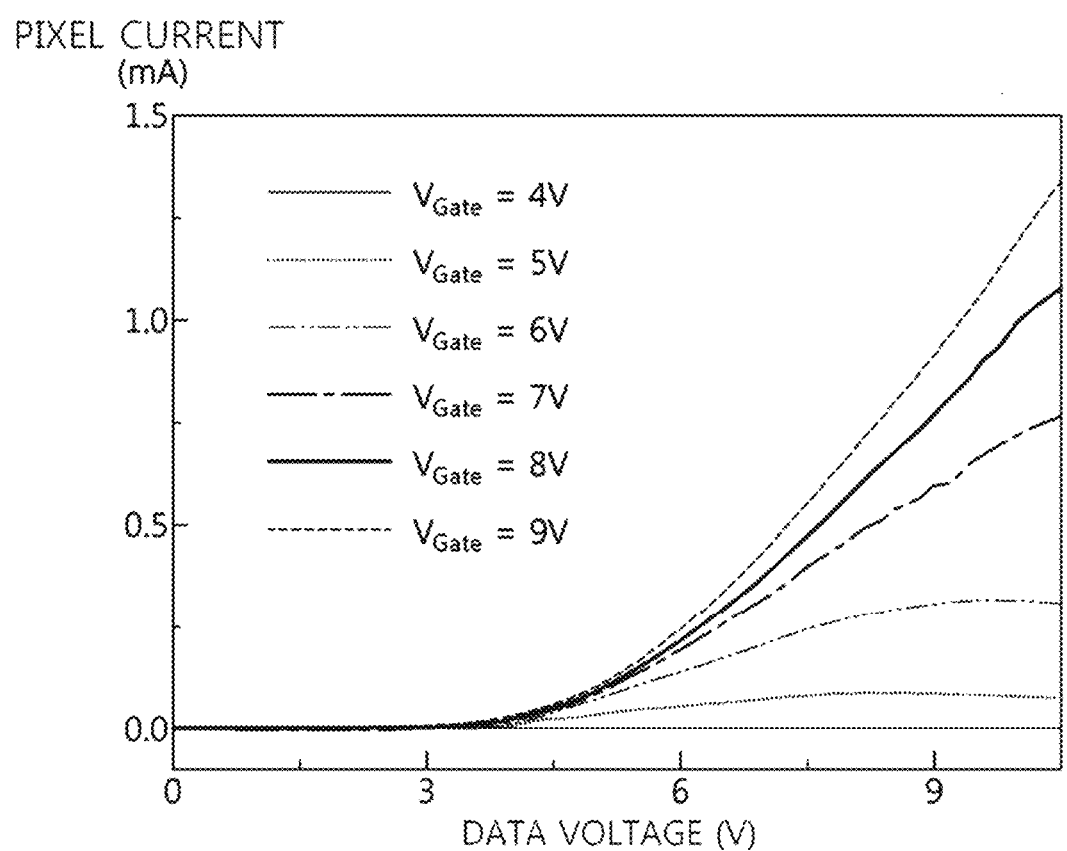

Referring to FIG. 13D, it is understood that when $V_{Gate}$ is increased from 4 V to 9 V, an active matrix organic light-emitting diode current $I_{OLED}$ for different $V_{Gate}$ values is increased. The active matrix organic light-emitting diode does not operate at low $V_{Data}$ which is lower than 5 V so that it is understood that $I_{OLED}$ and $V_{Gate}$ are independent from each other.

In contrast, it is understood that the active matrix organic light-emitting diode operates at high $V_{Data}$ which exceeds 5 V and $I_{OLED}$ is significantly increased as $V_{Data}$ is increased and depends on $V_{Gate}$.

Figure 13E:
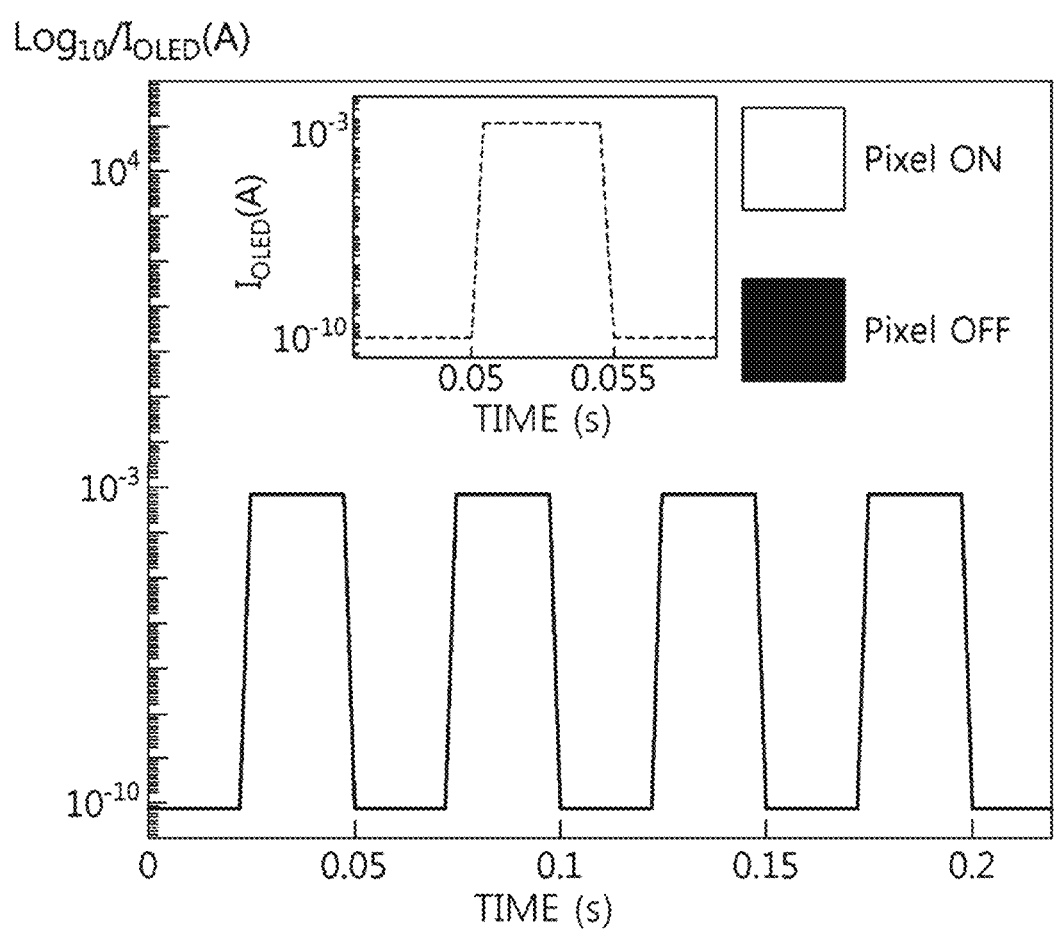

Referring to FIG. 13E, the active matrix organic light-emitting diode is quickly turned on and off with respect to a repeated $V_{Gate}$ pulse of ±10V.

It is understood that a response time is estimated to be 2.5 ms which is limited by a measurement system, but is low enough to drive the active matrix organic light-emitting diode with a short delay time.

As described above, it is understood that the molybdenum disulfide based backplane formed by the manufacturing method of a transition metal chalcogenide based backplane according to the embodiment of the present disclosure is sufficient to drive the active matrix organic light-emitting diode.

Figure 14A:
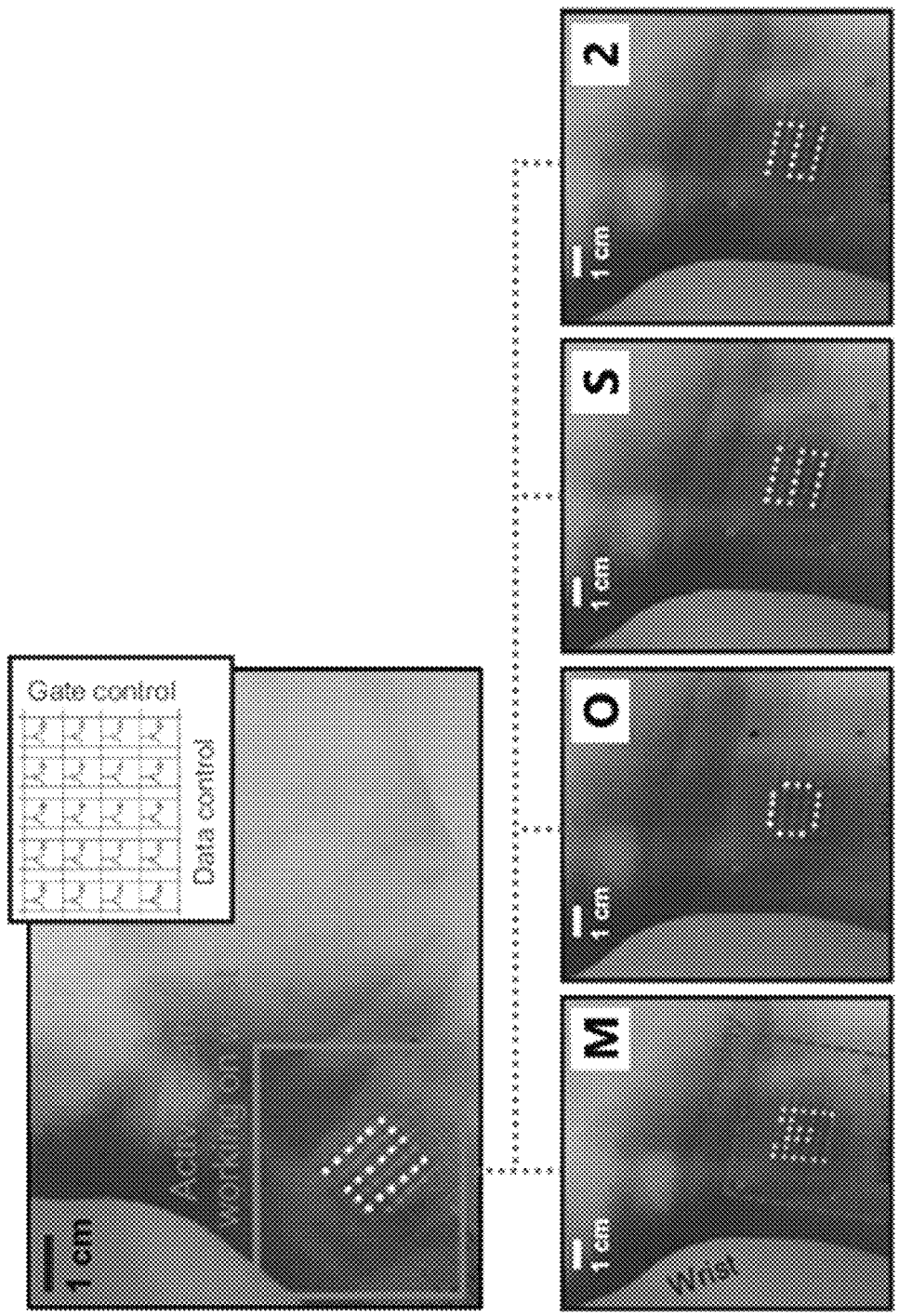
FIG. 14A illustrates an image when an active matrix organic light-emitting diode display device according to an embodiment of the present disclosure is attached to a wrist of a human.
Figure 14B:
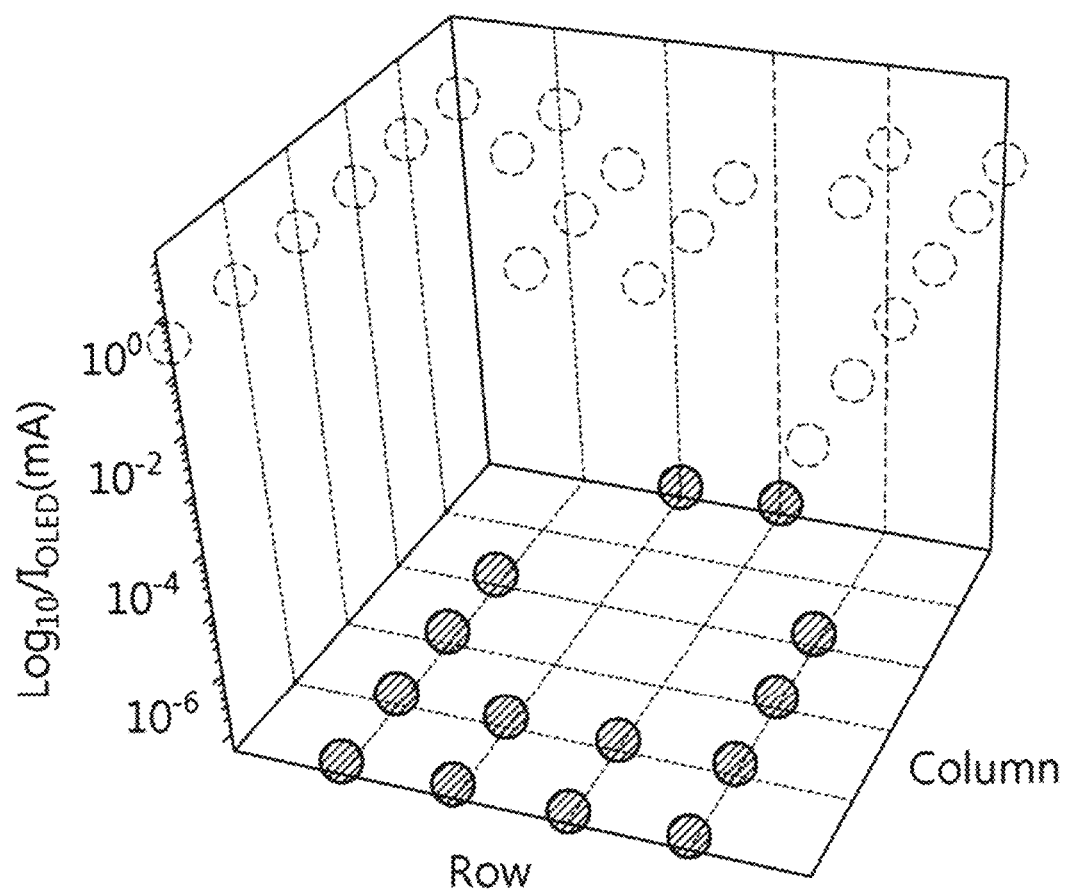
FIG. 14B illustrates a current mapping result during an operation of an active matrix organic light-emitting diode display device.

FIG. 14A illustrates an image when an active matrix organic light-emitting diode display device according to an embodiment of the present disclosure is attached to a wrist of a human and FIG. 14B illustrates a current mapping result during an operation of an active matrix organic light-emitting diode display device.

Referring to FIG. 14A, it is understood that when the active matrix organic light-emitting diode display device is attached to a human wrist, it is stably attached to a human skin due to a very small thickness (7 μm) of the active matrix organic light-emitting diode display device and representative letters "M", "O", "S", and "2" are sequentially changed on the skin in accordance with the active matrix line addressing.

The molybdenum disulfide based backplane formed by the manufacturing method of a transition metal chalcogenide based backplane according to the embodiment of the present disclosure has a low bending stiffness due to excellent mechanical characteristic of a molybdenum disulfide layer which is atomically thin.

Therefore, the low bending stiffness allows conformal contact with the human skin and the excellent mechanical durability of the molybdenum disulfide layer allows the device to be smoothly operated even after being attached to the human skin, and the stable performance for continuous operations may be achieved.

Referring to FIG. 14B, the ON/OFF mapping corresponding to the representative letter "M" shows that all the pixels (6×6 array) function well with the change of ON/OFF current (±2%) without having an external compensation circuit, which confirms the excellent control of the active matrix for the active matrix organic light-emitting diode unit.

Figure 15A:
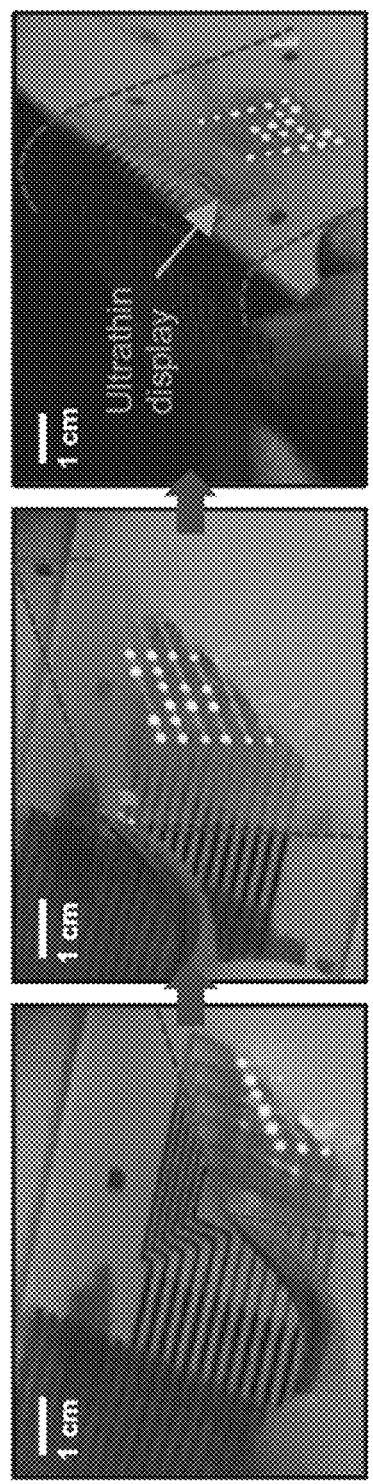
FIG. 15A illustrates an optical image of a process of separating an active matrix organic light-emitting diode display device according to an embodiment of the present disclosure from a carrier substrate.
Figure 15B:
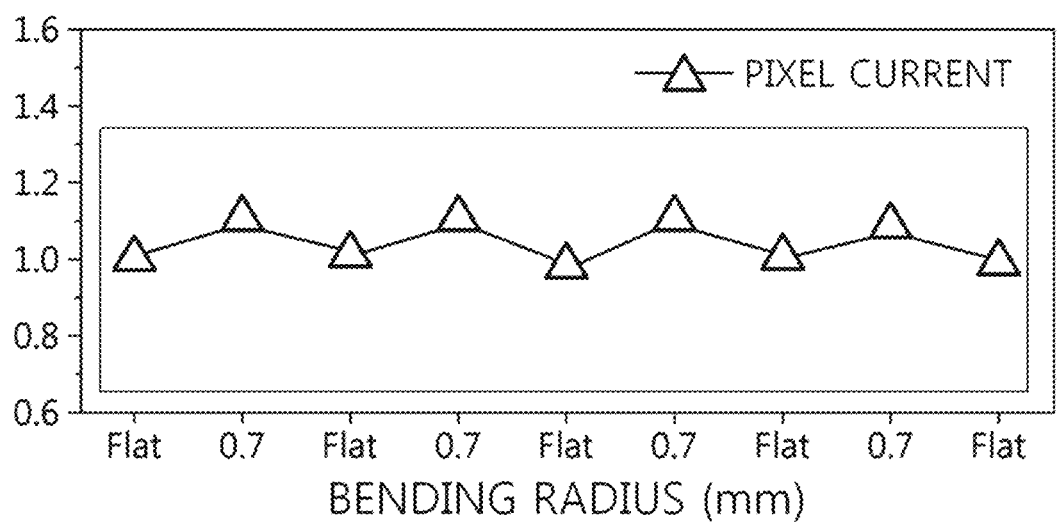
FIG. 15B is a graph illustrating a repeated bending test result with a bending radius of 0.7 mm.

FIG. 15A illustrates an optical image of a process of separating an active matrix organic light-emitting diode display device according to an embodiment of the present disclosure from a carrier substrate and FIG. 15B is a graph illustrating a repeated bending test result with a bending radius of 0.7 mm.

Referring to FIG. 15A, it is understood that while separating the active matrix organic light-emitting diode display device from a glass substrate which is a carrier substrate, it does not affect the operation of the active matrix organic light-emitting diode display device.

Further, it is understood that the active matrix organic light-emitting diode display device is flexibly folded due to the low bending stiffness of the active matrix organic light-emitting diode display device.

Referring to FIG. 15B, in a repeated bending test with a bending radius of 0.7 mm, it is understood that the active matrix organic light-emitting diode display device shows excellent durability and a small current change within 10%.

It is understood that the small change in current does not affect the operation of the active matrix organic light-emitting diode display device.

Figure 16A:
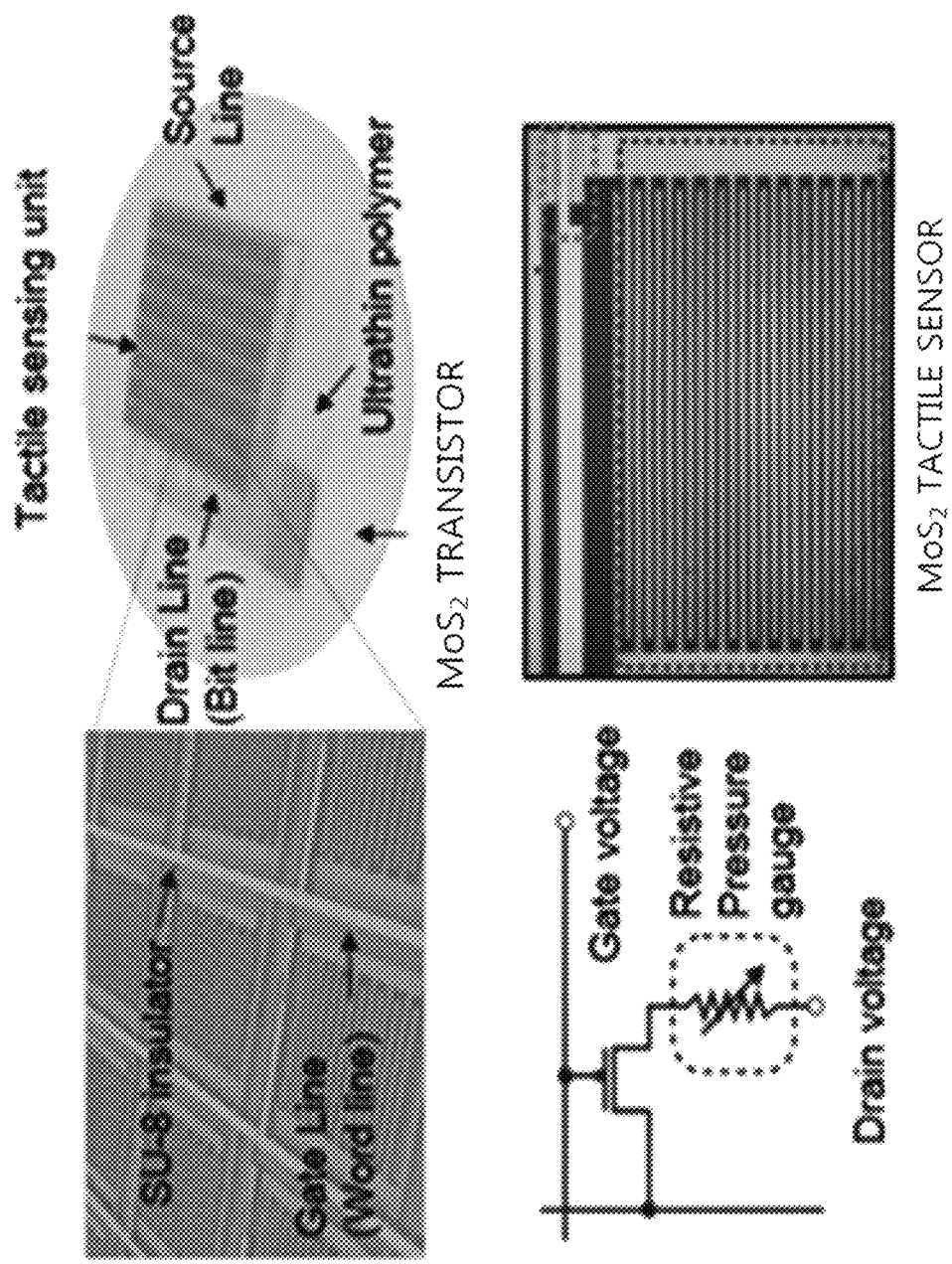
FIG. 16A illustrates a structure of an active tactile sensor including a transition metal chalcogenide based backplane according to an embodiment of the present disclosure.
Figure 16B:
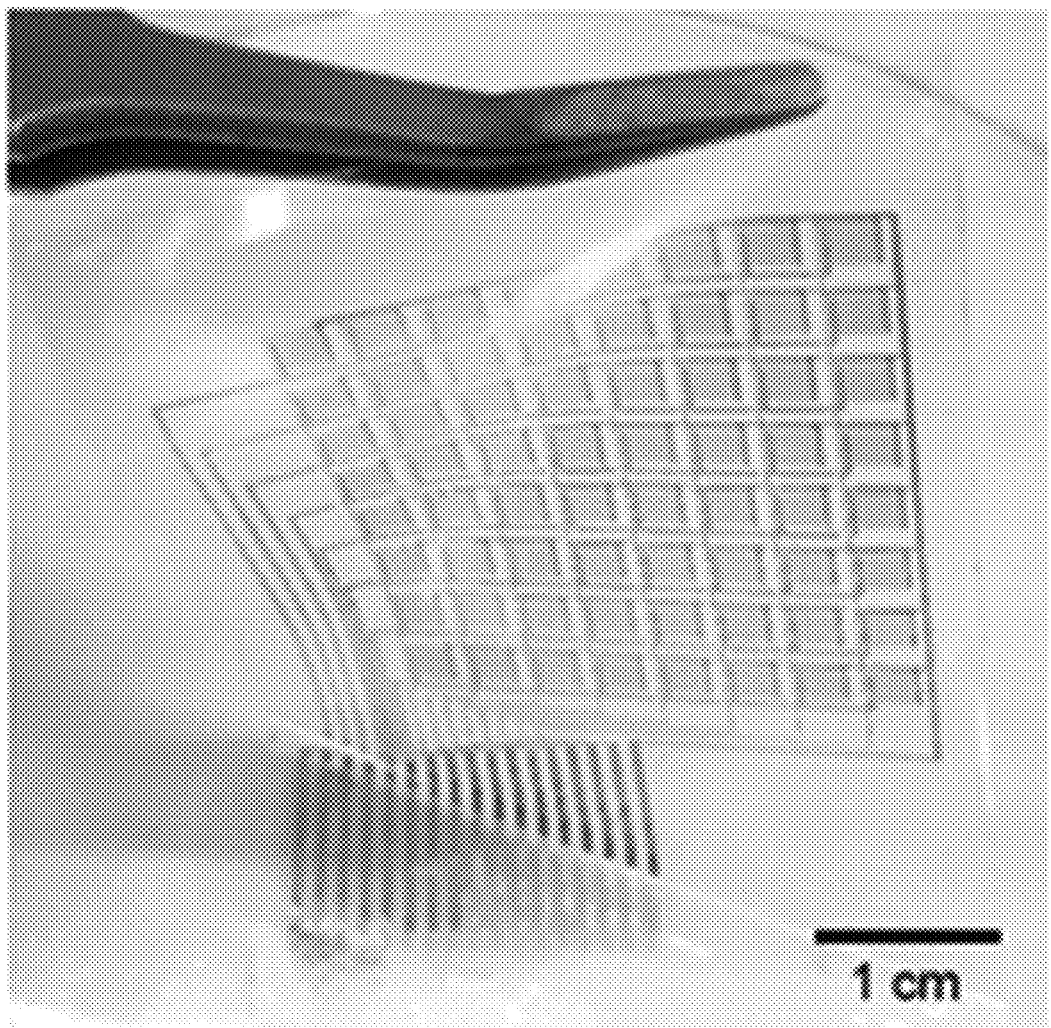
FIG. 16B illustrates an optical image of an active tactile sensor.

FIG. 16A illustrates a structure of an active matrix tactile sensor including a transition metal chalcogenide based backplane according to an embodiment of the present disclosure and FIG. 16B illustrates an optical image of an active tactile sensor.

Referring to FIGS. 16A and 16B, it is understood that in an active tactile sensor including a transition metal chalcogenide based backplane (hereinafter, referred to as an "active tactile sensor"), each molybdenum disulfide pressure gauge has an active structure which is connected to a molybdenum disulfide based backplane which is a transition metal chalcogenide.

An active tactile sensor having 8×8 array on a large area of 2.8 cm×2.8 cm has a thickness of approximately 2.1 μm and a molybdenum disulfide based backplane and molybdenum disulfide pressure gauge may be simultaneously formed using molybdenum disulfide formed by the CVD method.

Therefore, an active tactile sensor to which the molybdenum disulfide based backplane and the molybdenum disulfide pressure gauge are connected may be formed without performing an addition process.

A low bending stiffness due to a very small thickness of the active tactile sensor allows the active tactile sensor to be conformally contact with a curved area of the human skin. Further, an initial electrical characteristic may be stably maintained even with a small bending radius.

Figure 17A:
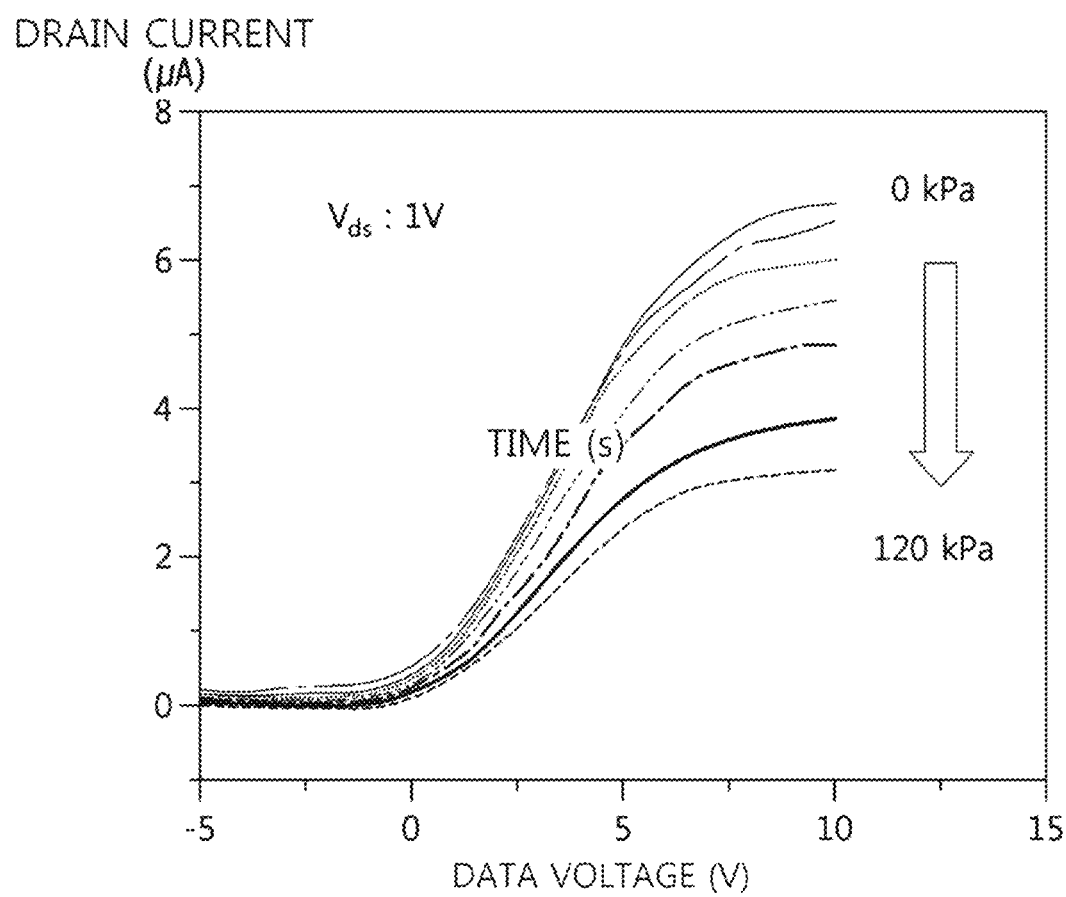
FIG. 17A is a graph illustrating a current-voltage characteristic of an active tactile sensor according to an embodiment of the present disclosure.
Figure 17B:
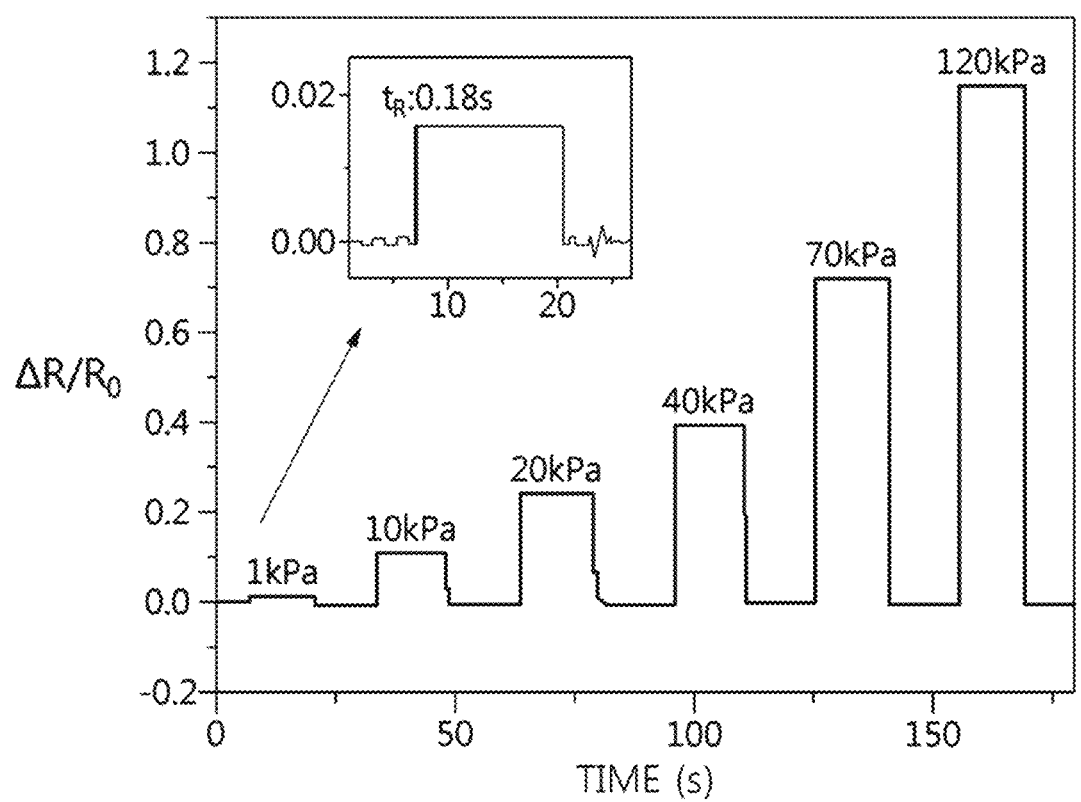
FIG. 17B is a graph illustrating a resistance change in accordance with a time.
Figure 17C:
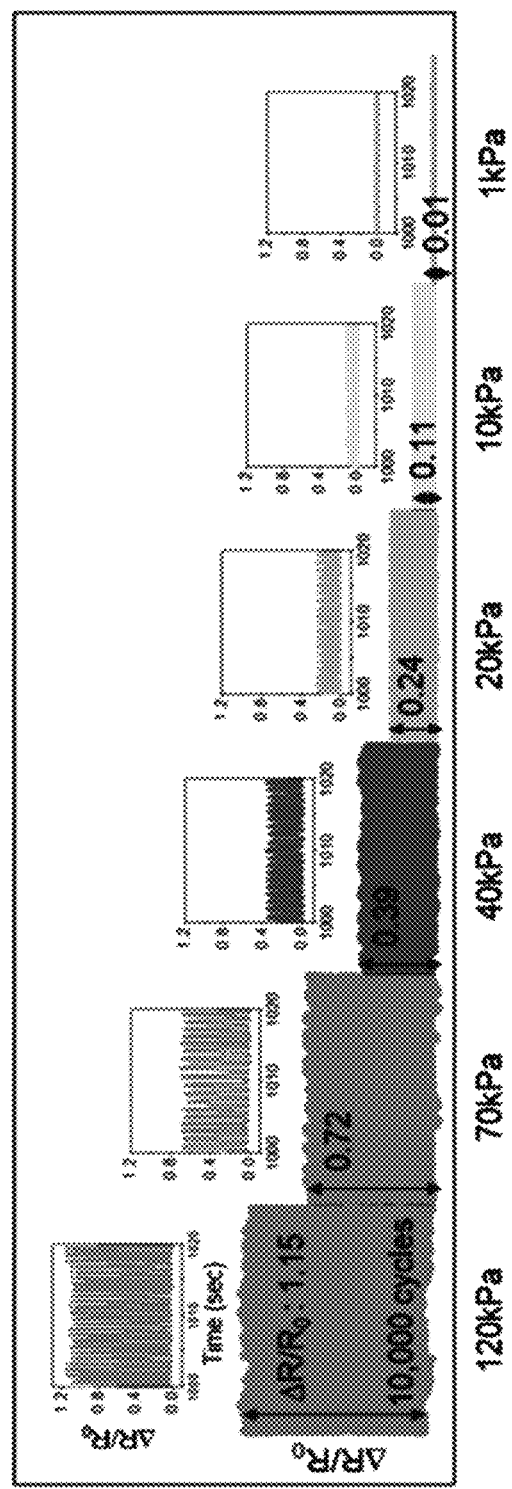
FIG. 17C is a graph illustrating a repetitive characteristic in accordance with a pressure.

FIG. 17A is a graph illustrating a current-voltage characteristic of an active tactile sensor according to an embodiment of the present disclosure, FIG. 17B is a graph illustrating a resistance change in accordance with a time, and FIG. 17C is a graph illustrating a repetitive characteristic in accordance with a pressure.

Referring to FIG. 17A, it is understood that when a pressure of 0 to 120 kPa is applied to the active tactile sensor according to an embodiment of the present disclosure, as the pressure is increased, the current in an On region is evenly reduced. Further, the current has a constant value in an Off region which is 0 V or lower regardless of the change in pressure.

Referring to FIG. 17B, it is understood that the resistance of the active tactile sensor according to an embodiment of the present disclosure is evenly reduced in accordance with the pressure so that the output value of the active tactile sensor has a linearity.

The linearity means that when the pressure is applied, the output characteristic is represented as much as the change. Therefore, in order to accurately measure a magnitude of a constant pressure, it is important that the output value of the sensor has a linearity.

In the active tactile sensor according to the embodiment of the present disclosure, $\Delta R/R_0$ shows a resistance change of 0.015 in accordance with a pressure change of approximately 1 kPa in a pressure range of 1 to 120 kPa.

Therefore, a pressure of at least 1 kPa is sensed, which is a similar sensing area to a skin sensing pressure of 1 to 100 kPa so that the active tactile sensor according to the embodiment of the present disclosure may be utilized as an electronic skin.

Further, it is understood that when a pressure is applied for approximately 13 seconds at every pressure of 1 to 120 kPa, constant resistance change is maintained in the active tactile sensor according to the embodiment of the present disclosure and a response time is 180 ms when a pressure of 1 kPa is applied.

Referring to FIG. 17C, it is understood that the active tactile sensor according to the embodiment of the present disclosure maintains a unique resistance change characteristic for 10000 cycles in accordance with a pressure of 1 to 120 kPa and a very low drift characteristic is shown at a pressure of 120 kPa.

FIGS. 18A to 18D are graphs illustrating a flexible characteristic of an active tactile sensor according to an embodiment of the present disclosure.

Figure 18A:
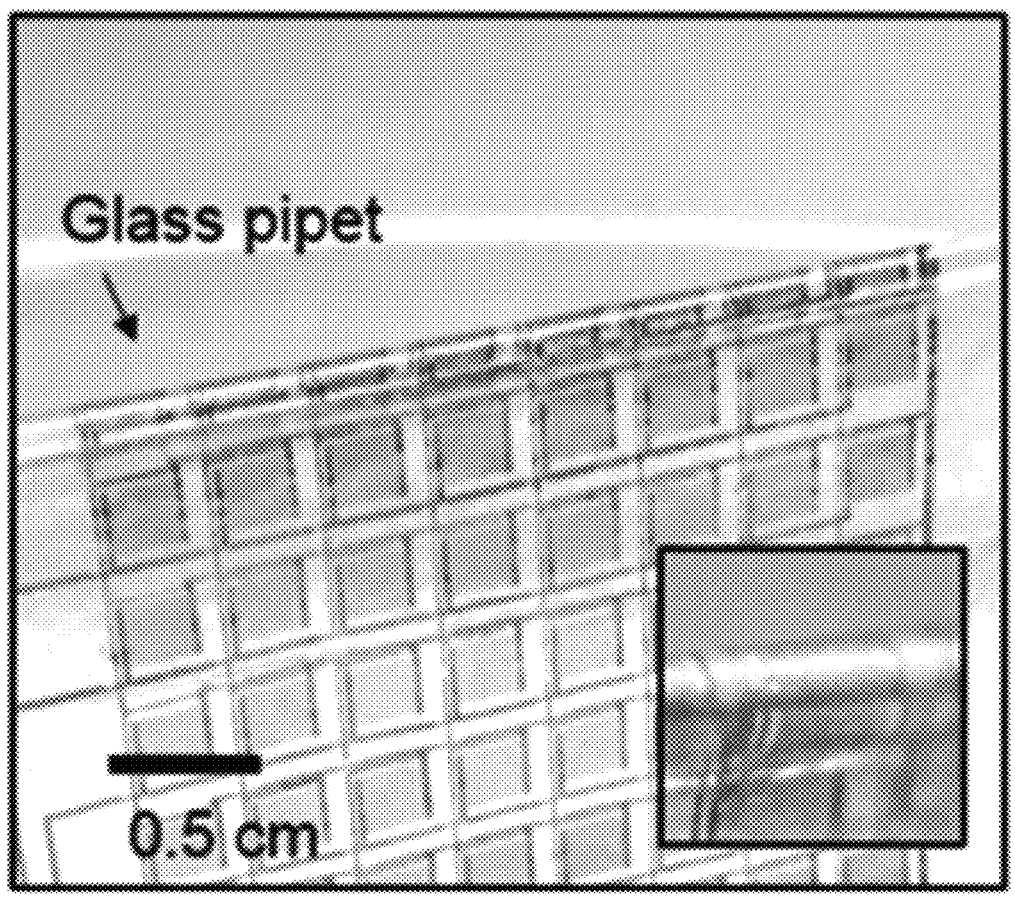
FIGS. 18A to 18D are graphs illustrating a flexible characteristic of an active tactile sensor according to an embodiment of the present disclosure.

Referring to FIG. 18A, it is understood that a large area active tactile sensor according to the embodiment of the present disclosure has a total thickness of approximately 2.1 μm and has an excellent flexible characteristic so that the tactile sensor completely wraps a glass pipet having a diameter of 1 mm.

Referring to an inserted image, when the active tactile sensor is enlarged, no crack is found so that it is understood that it has an excellent mechanical characteristic.

The excellent flexible characteristic allows the pressure to be accurately detected without being affected by a resistance change due to mechanical deformation such as bending, twisting, wrinkle generated on a soft substrate like a human skin.

Figure 18B:
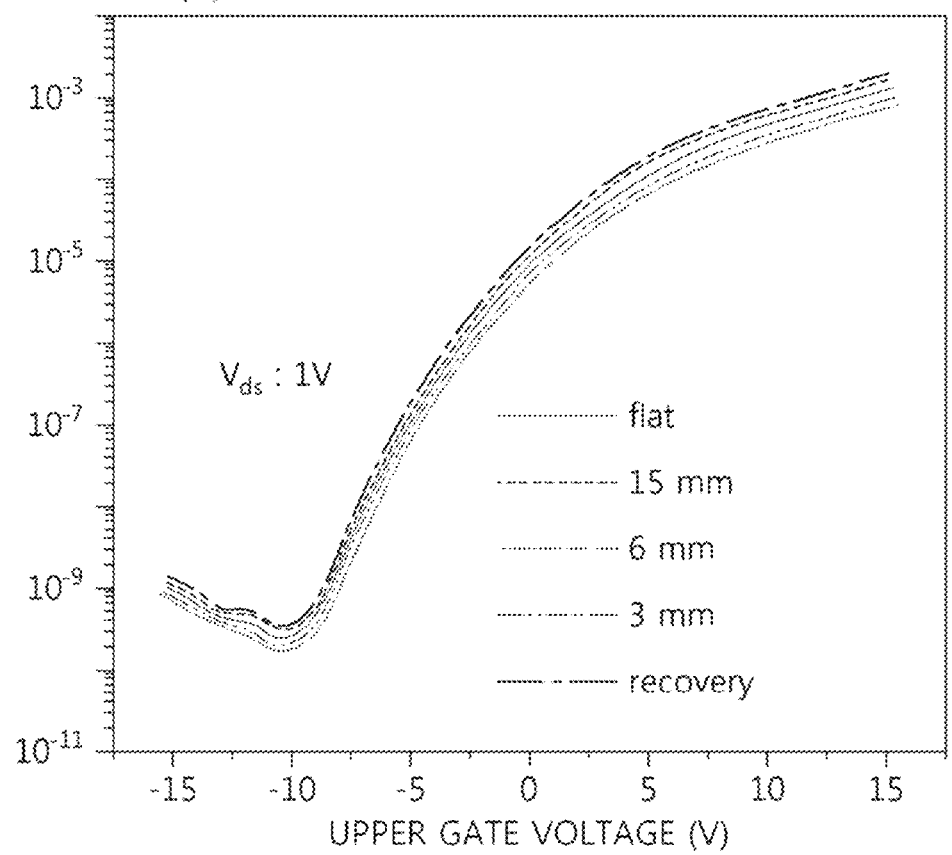
Figure 18C:
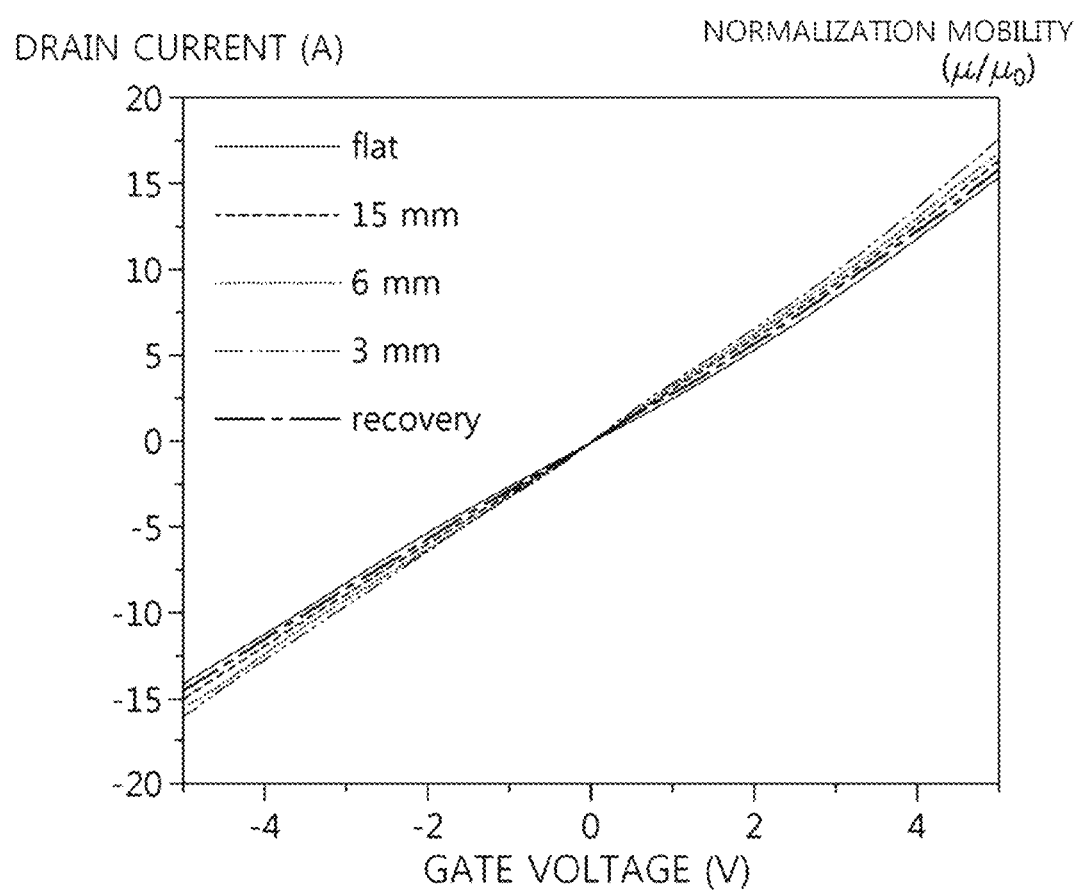
Figure 18D:
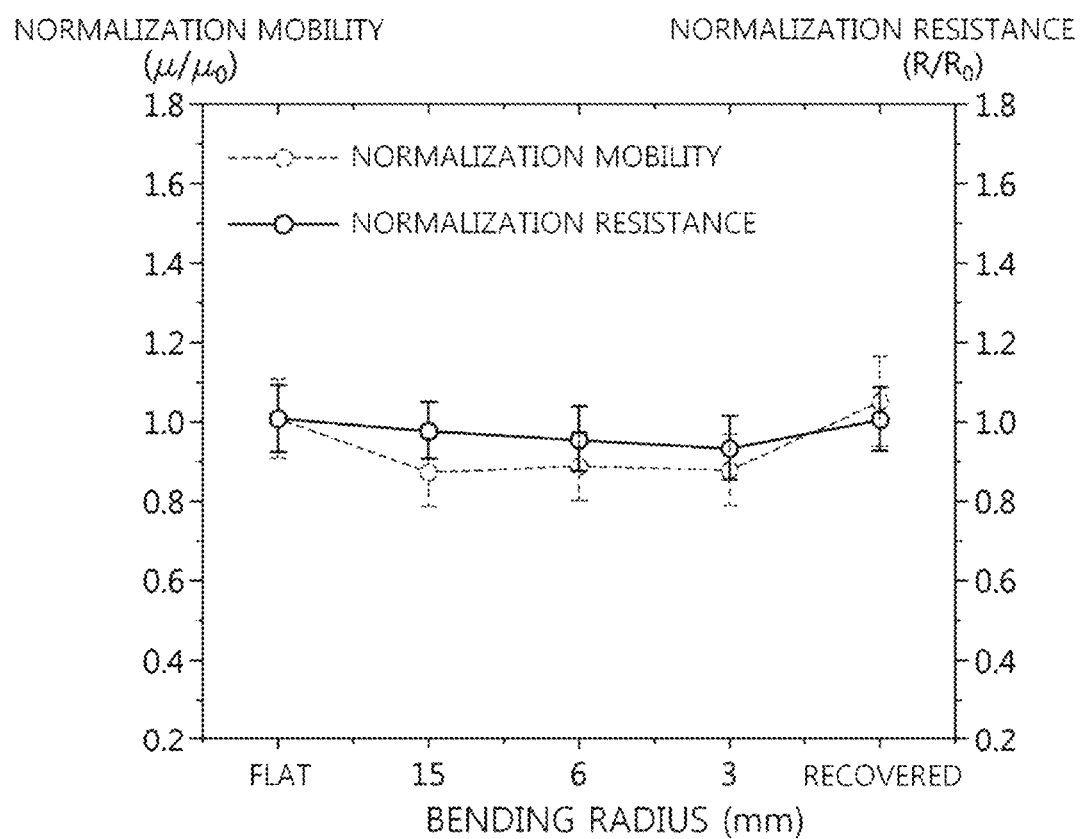

Referring to FIGS. 18B to 18D, when the active tactile sensor is bent until the bending radius becomes 3 mm, the molybdenum disulfide based backplane shows a stable switching characteristic and the molybdenum disulfide pressure gauge shows a stable linearity.

The mobility of the molybdenum disulfide based backplane and the resistance characteristic of the molybdenum disulfide pressure gauge maintain a stable characteristic with a value of 0.8 to 0.9 of $\Delta R/R_0$ at each bending radius and an initial characteristic is well recovered without lowering the characteristic.

The bending test shows that the active tactile sensor maintains the stable characteristic even in the mechanical deformation due to the bending of the human skin or palm.

Figure 19A:
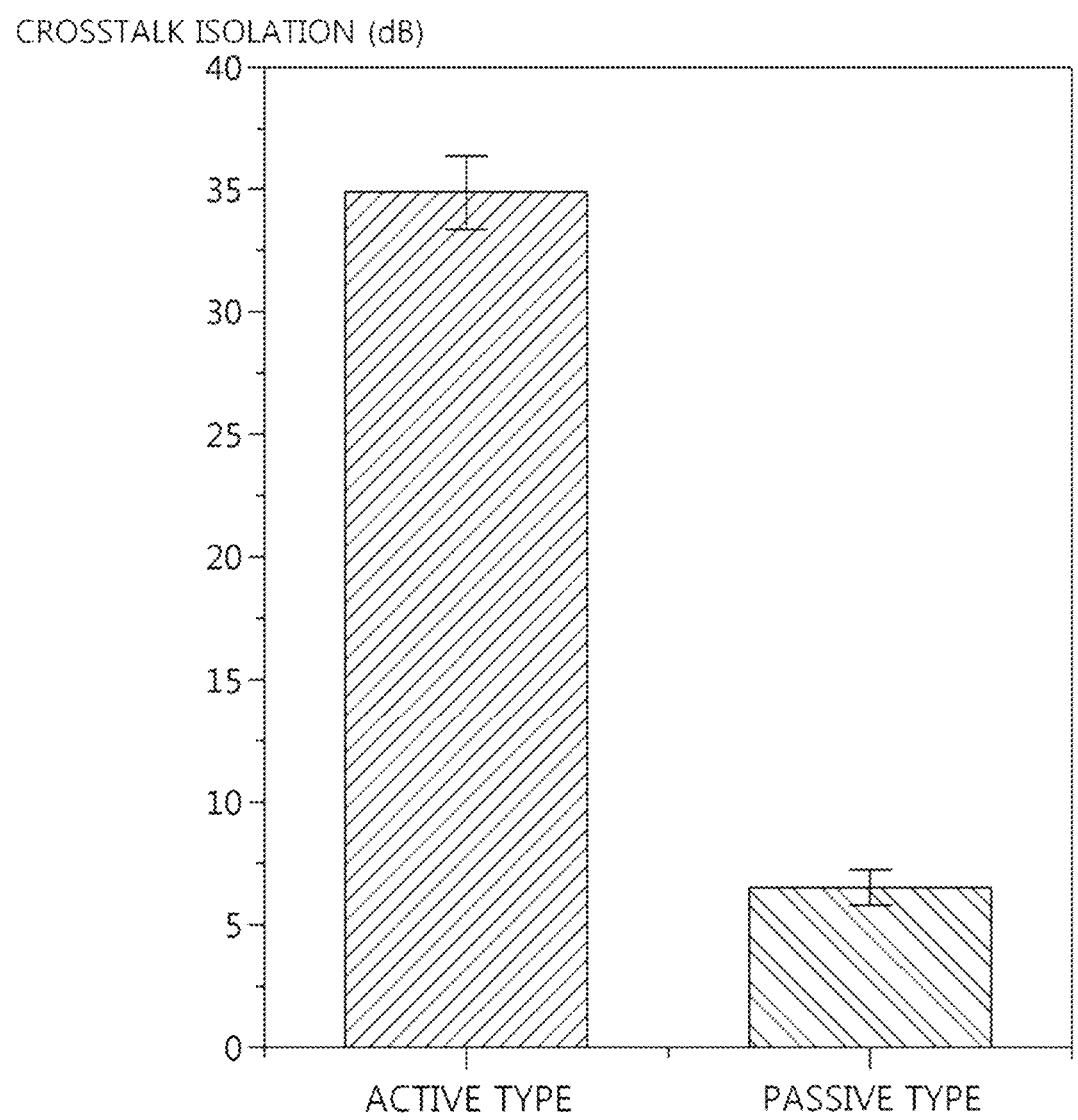
FIG. 19A is a graph illustrating a low crosstalk characteristic of an active tactile sensor according to an embodiment of the present disclosure.
Figure 19B:
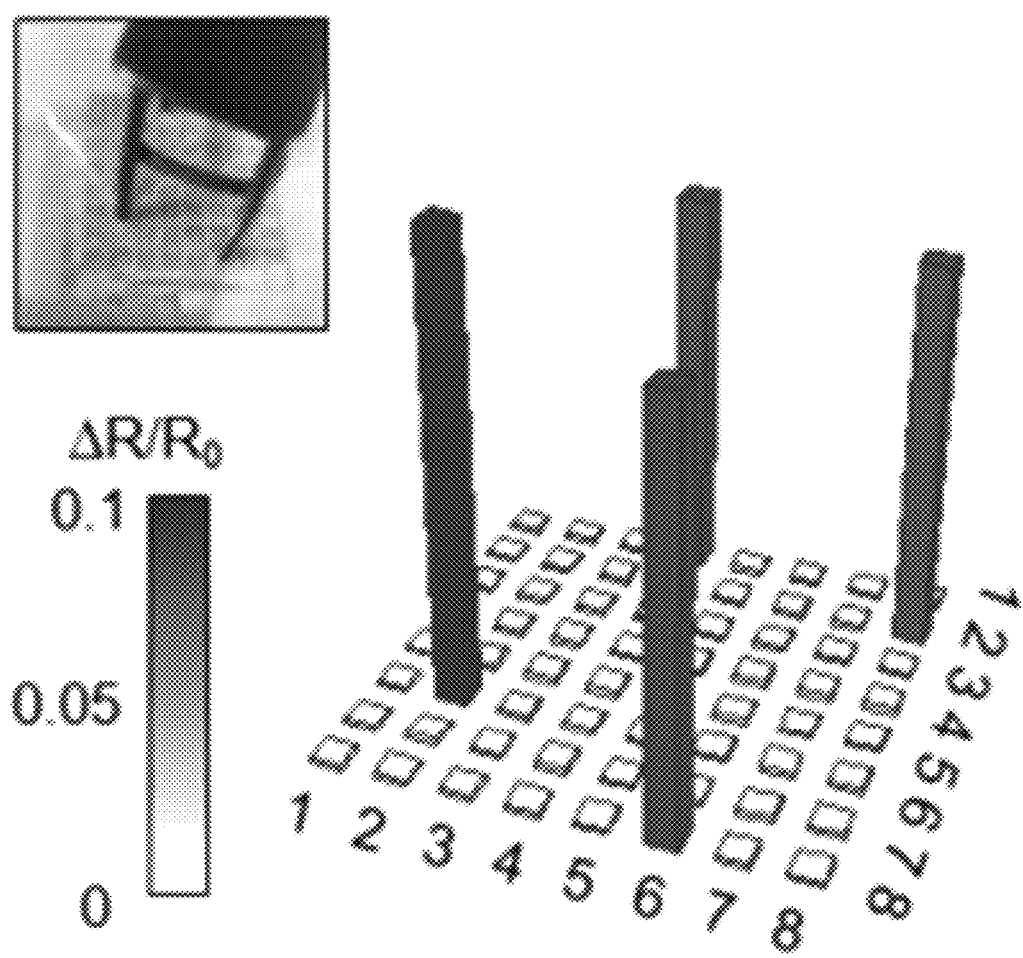
FIG. 19B is a graph illustrating a resistance change of an active tactile sensor.
Figure 19C:
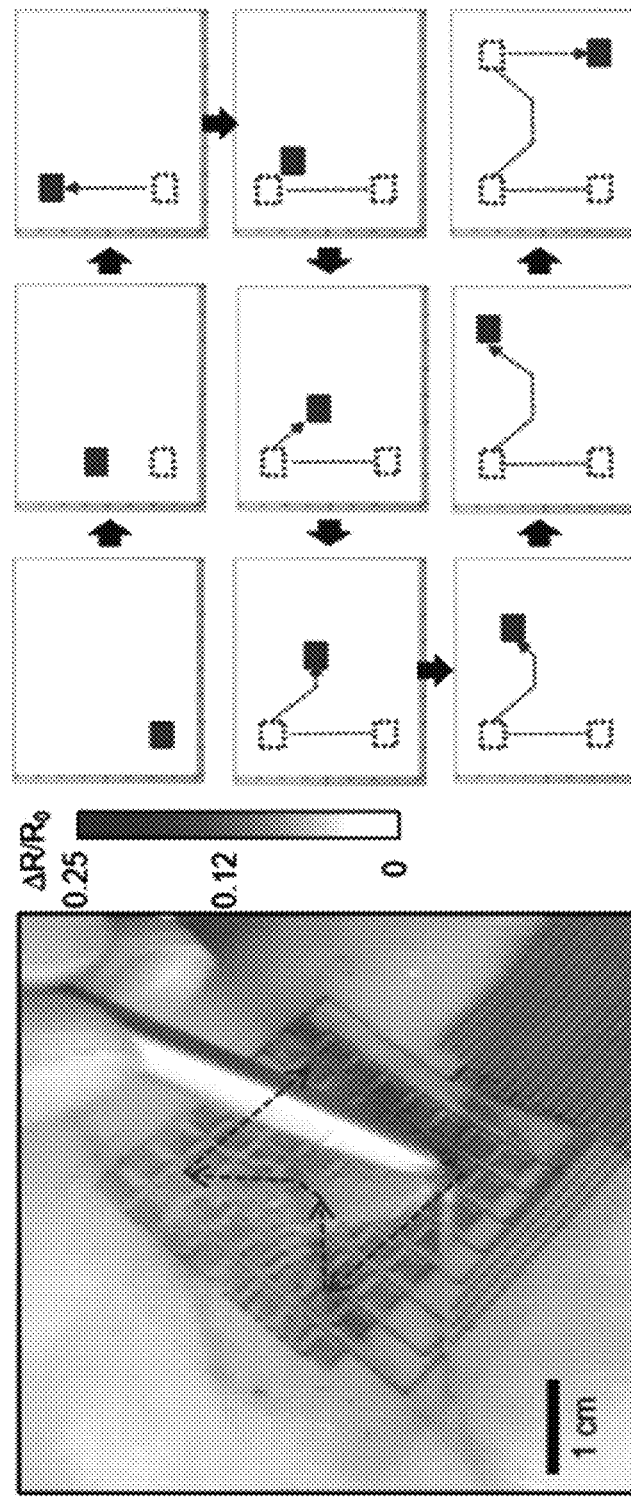
FIG. 19C is an image illustrating pressure mapping when letters are input on an active tactile sensor.

FIG. 19A is a graph illustrating a low crosstalk characteristic of an active tactile sensor according to an embodiment of the present disclosure, FIG. 19B is a graph illustrating a resistance change of an active tactile sensor, and FIG. 19C is an image illustrating pressure mapping when letters are input on an active tactile sensor.

Referring to FIG. 19A, the active tactile sensor has a crosstalk isolation value of 24.80 dB, but the passive tactile sensor has 6.6 dB which is approximately four times lower.

In the passive tactile sensor, a resistance change of a cell to which the pressure is applied affects a proximate cell so that a crosstalk characteristic is high. In contrast, in the active tactile sensor, the backplane which is connected to the cell reduces the influence for the proximate cell, so that the crosstalk characteristic is low.

FIG. 19B illustrates that as a result of mapping a pressure after putting a small miniature chair on an active tactile sensor, the pressure is accurately sensed without causing a crosstalk and $\Delta R/R_0$ is 0.95.

FIG. 19C illustrates that when a letter "M" is quickly input on the active tactile sensor using a touch pen, a pressure which is applied to each cell on a pressure mapping screen at a real time is accurately and quickly sensed.

It is understood that the active tactile sensor can be utilized as a real-time information input device with a low crosstalk characteristic and a quick response time of the active tactile sensor.

Figure 20:
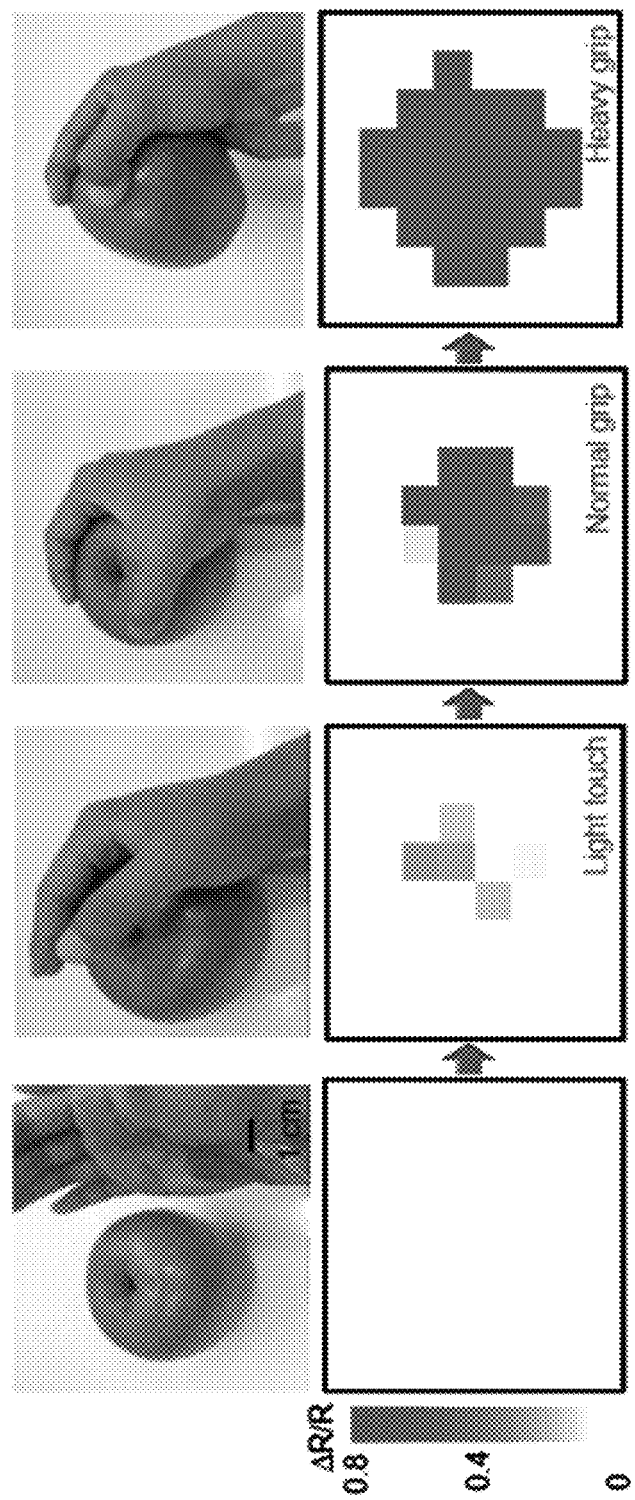
FIG. 20 illustrates a resistance change when an active tactile sensor is bonded onto a palm and then a light object is held in an active tactile sensor according to an embodiment of the present disclosure.

FIG. 20 illustrates a resistance change when an active tactile sensor is bonded onto a palm and then a light object is held in an active tactile sensor according to an embodiment of the present disclosure.

Referring to FIG. 20, it is understood that when an apple is held with an active tactile sensor attached to a palm of the hand, a resistance change is approximately 0.1 to 0.8 in accordance with a change of a state holding the apple and a shape of a contact region and a change in an applied pressure are sensed.

As described above, although the present invention has been described by limited embodiments and drawings, the present invention is not limited to the embodiments, and it will be apparent to those skilled in the art to which the present invention pertains that various modifications and variations may be made from the description.

Accordingly, the scope of the present invention is not construed as being limited to the described embodiments but is defined by the appended claims as well as equivalents thereto.

What is claimed is:

1. A manufacturing method of an active matrix organic light-emitting diode display device, the method comprising:
    forming a sacrificial layer on a carrier layer;
    forming a flexible substrate on the sacrificial layer;
    forming a first insulating layer on the flexible substrate;
    forming at least one transition metal chalcogenide based backplane on the first insulating layer;
    forming an opening unit after forming a capping layer on the at least one transition metal chalcogenide based backplane; and
    forming at least one active matrix organic light-emitting diode unit which is electrically connected to the at least one transition metal chalcogenide based backplane in the opening unit,
    wherein the forming of the at least one transition metal chalcogenide based backplane includes:
    forming source/drain electrodes which are spaced apart from each other on the first insulating layer;
    forming a channel layer including transition metal chalcogenide in a channel region and on the source/drain electrodes of the flexible substrate;
    doping the channel layer by forming a second insulating layer on the channel layer; and
    forming a gate electrode on the second insulating layer, and
    in the at least one transition metal chalcogenide based backplane, the channel region is doped with electrons by the doping and a contact portion of the source/drain electrodes with the channel layer is doped with electrons,
    wherein the transition metal chalcogenide includes molybdenum disulfide ($MoS_2$), the molybdenum disulfide being grown with a condition of a pressure of 7.5 torr, a growth temperature of 550° C., a growth time of 20 hours, a molybdenum hexacarbonyl (MHC) flow rate of 1.0 sccm per minute, and a dimethyl sulfide (DMS) flow rate of 0.3 sccm,
    wherein the first insulating layer and the second insulating layer include alumina ($Al_2O_3$),
    wherein the doping of the channel layer by forming the second insulating layer on the channel layer includes performing heat treatment at 110° C. after forming the second insulating layer, and wherein the at least one transition metal chalcogenide based backplane has an electron mobility of 70.8 cm$^2$/Vs, a threshold voltage of −9.5 V, and a transconductance of $5.2 \times 10^{-7}$ S/μm$^2$.

2. The manufacturing method according to claim 1, further comprising:

removing the sacrificial layer and the carrier layer.

3. The manufacturing method according to claim 1, wherein the forming of the active matrix organic light-emitting diode unit further includes:

forming a first electrode which is electrically connected to the at least one transition metal chalcogenide based backplane;

forming an organic light emitting layer on the first electrode; and forming a second electrode on the organic light emitting layer.

4. The manufacturing method according to claim 3, wherein the organic light emitting layer includes a hole injection layer, a hole transporting layer, a light emitting layer, an electron transporting layer, and an electron injection layer.

5. The manufacturing method according to claim 3, wherein the first electrode is a transparent electrode.

6. The manufacturing method according to claim 1, wherein the channel layer including the transition metal chalcogenide is a single layer or a multilayered structure.

7. The manufacturing method according to claim 1, wherein the channel layer is any one of a single layer, a double layer, and a multiple layer.

8. An active matrix organic light-emitting diode display device manufactured by the method according to claim 1.

* * * * *